United States Patent [19]
Akisada et al.

[11] Patent Number: 5,168,301
[45] Date of Patent: Dec. 1, 1992

[54] APPARATUS FOR MAKING A COLOR PROOF AND METHOD OF TRANSFERRING A PHOTOSENSITIVE MATERIAL FOR THE SAME

[75] Inventors: Masahide Akisada; Takatugu Kusayanagi; Kazuya Fujimoto; Hiroyuki Ueda, all of Kanagawa, Japan

[73] Assignee: Fuji Photo Film Co., Ltd., Kanagawa, Japan

[21] Appl. No.: 706,437

[22] Filed: May 28, 1991

[30] Foreign Application Priority Data

May 28, 1990 [JP] Japan .................................. 2-137355
May 28, 1990 [JP] Japan .................................. 2-137356

[51] Int. Cl.⁵ ........................ G03B 27/32; G03B 27/52
[52] U.S. Cl. ..................................... 355/27; 354/298; 355/77; 355/100
[58] Field of Search ............................ 355/27, 100, 77; 354/298

[56] References Cited

U.S. PATENT DOCUMENTS

| | | | |
|---|---|---|---|
| 3,815,457 | 6/1974 | Shimmin | 355/23 |
| 3,913,119 | 10/1975 | Preifer | 354/298 |
| 4,962,314 | 10/1990 | Hirota et al. | 355/100 X |
| 5,065,178 | 11/1991 | Awazu et al. | 355/27 |
| 5,083,152 | 1/1992 | Tokuda | 355/27 |

FOREIGN PATENT DOCUMENTS

2-33147 2/1990 Japan .

Primary Examiner—Richard A. Wintercorn
Attorney, Agent, or Firm—Sughrue, Mion, Zinn, Macpeak & Seas

[57] ABSTRACT

An apparatus for making a color proof having an exposure portion for exposing an image of the original onto a photosensitive material and a processor portion for processing the exposed photosensitive material. The apparatus has a transfer portion for transferring the photosensitive material from the exposure portion to the processor portion, which has a first pair of rollers for feeding the photosensitive material disposed adjacent to the photosensitive material delivery side of the platen portion, a second pair of rollers disposed adjacent to the photosensitive material inlet side of the processor portion at the transfer portion and a guide member for guiding transferring of the photosensitive material from said first pair to said second pair. Also, a sensor is disposed downstream in the feeding direction of said second pair of rollers for sensing the presence of the photosensitive material and a control unit is provided for controlling driving of said first and second pairs of rollers so as to rotate them at equal speeds while controlling driving of the pair of rollers so as to reduce the rotating speed of the second pair of rollers when the presence of the photosensitive material is sensed by said sensor. When the tip end of the photosensitive material is sensed by the sensor, the rotating speed of the second pair of rollers is reduced so as to coincide with the processing speed of the processor portion with the result that transferring of the photosensitive material from the exposure portion to the processor portion is smoothly carried out.

19 Claims, 45 Drawing Sheets

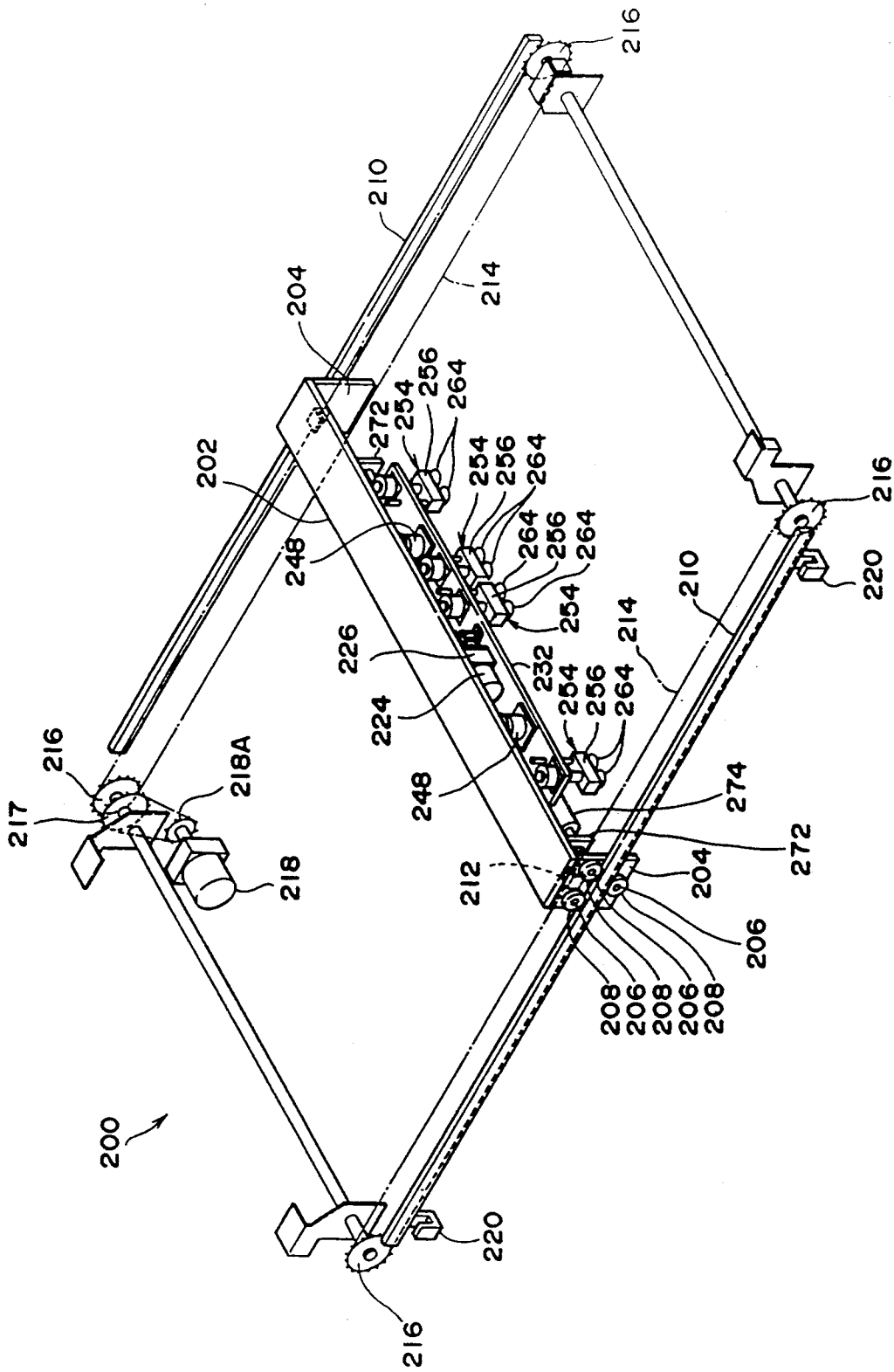

APPARATUS FOR MAKING A COLOR PROOF AND METHOD OF TRANSFERRING A PHOTOSENSITIVE MATERIAL FOR THE SAME

BACKGROUND OF THE INVENTION (a) Field of the Invention

The present invention relates to an apparatus for making color proofs more specifically to an apparatus for making color proofs, which is used for checking the quality of a color print, from a photosensitive material.

(b) Description of the Related Art

When a large amount of color prints, for example, color bills (folded bills), appended to a newspaper or the like, are printed by a printing machine, their quality is ordinarily checked prior to being actually printed using an apparatus for making color proofs.

The apparatus has a platen portion to which a photosensitive material and an original, which is developed after being separated by color and exposed to light, are each positioned. An exposure portion faces the platen portion for exposing an image of the original onto the photosensitive material. A processor portion processes the exposed photosensitive material and a transfer portion for transfers the photosensitive material from the platen portion to the processor portion. The original is made for each separated color component, forming one set of originals and the apparatus sequentially exposes the plurality of originals onto a single photosensitive material positioned on the platen portion. The exposed photosensitive material is conveyed from the platen portion to the processor portion via the transfer portion to be subjected to developing, bleaching/fixing, rinsing and drying treatments respectively. The quality of the print can be checked in advance by this treated photosensitive material prior to being actually printed. In consequence, if any problem is detected in the color tone, image position, printed characters or the like, the original can be revised prior to being actually printed in large qualities by the printing machine.

Incidentally, it is preferable to pass the exposed photosensitive material to the processor portion for performing the development or the like in a short period of time. However, since a sufficient time required for performing the developing must be assured at the processor portion, it is necessary to convey the photosensitive material at a relatively low constant speed.

To this end, the photosensitive material is removed from the roller at the lowermost stream of the platen portion to switch it back so that it may be guided to the roller at the uppermost stream of the processor portion.

However, when the photosensitive material is transferred rollers or the like for retaining it are necessary. Since the feeding passageway of the photosensitive material, which is fed therein from the platen portion, partially coincides with that through which the photosensitive material is fed into the processor portion, a means for switching this part of passageway becomes necessary resulting in a large number of parts and a complicated construction.

In view of the above-described facts, it is an object of the present invention to achieve an apparatus for making a color proof, which allows a transfer mechanism for transferring the photosensitive material from the platen portion to the processor portion to be simplified.

In addition, it is a further object of the present invention to achieve a method for the apparatus, which allows the photosensitive material to be smoothly.

SUMMARY OF THE INVENTION

An apparatus for making a color proof according to the present invention has:

a platen portion to which a photosensitive material and an original are each fed to be positioned;

an exposure portion which faces the platen portion for exposing the image of the original onto the photosensitive material;

a processor portion for processing the exposed photosensitive material;

a transfer portion for transferring the photosensitive material from the platen portion to the processor portion, the transfer portion has a first pair of rollers disposed adjacent to the photosensitive material delivery side of the platen portion, a second pair of rollers disposed adjacent to the photosensitive material inlet side of the processor portion conveying the photosensitive material and a guide member for guiding transferring of the photosensitive material from the first pair of rollers to the second pair of rollers;

a sensor disposed down stream of the second pair of rollers, as viewed in the feeding direction, for sensing whether the photosensitive material is present or not; and a controller means for controlling driving of the first and second pairs of rollers so as to cause them rotate at equal speeds while controlling driving of the second pair of rollers so as to reduce the rotating speed of the second pair of rollers when the sensor senses the presence of the photosensitive material.

According to the above-described arrangement, the first and second pairs of rollers are controlled by the controller so as to be rotated at the same speed. Therefore, transferring of the photosensitive material from the first pair of rollers to the second pair of rollers is smoothly achieved. When the photosensitive material is detected by the sensor, the rotating speed of the second pair of rollers is slowed down by the control means. That is, since the rotating speed of the second pair is slowed down after it has pinched the photosensitive material, a loop of the photosensitive material is smoothly formed. As a result, transferring of the photosensitive material from the platen portion to the processor portion can be smoothly achieved.

As described above, according to the present invention, since the photosensitive material can be passed over by only the first and second pairs of rollers and the guide member, the number of necessary parts is small and its arrangement is simple.

According to one embodiment of the present invention, the controller means slows down the rotating speed of the second pair of rollers, corresponding to the processing speed of the processor portion, which varies with the type of the photosensitive material. In consequence, the slowed down speed of the second pair can be selected depending on the processing speed of the photosensitive material at the processor portion. That is, the processing speed at the processor portion is different depending on the type of the photosensitive material (paper or film), and the rotating speed of the second pair is slowed down so as to correspond to the processing speed of the processor portion so that transferring to the processor portion may be smoothly carried out.

In another embodiment of the present invention, the apparatus has:

a platen portion to which a photosensitive material and an original are each fed for being positioned;

an exposure portion which faces to the platen portion for exposing the image of the original onto the photosensitive material;

a processor portion for processing the exposed photosensitive material;

a transfer portion for transferring the photosensitive material from the platen portion to the processor portion, the transfer portion has a first pair of rollers disposed adjacent to the photosensitive material delivery side of the platen portion, a second pair of rollers disposed adjacent to the photosensitive material inlet side of the processor portion and a guide member for guiding the photosensitive material from the first pair of rollers to the second pair;

a controller for controlling the first and second pairs of rollers so as to rotate the first pair at a predetermined speed while rotating the second pair at a speed slower than that of the first pair; and a one-way clutch for permitting the second pair to be rotated at a speed faster than that of the slower rotating speed.

According to this embodiment, the exposed photosensitive material fed by the first pair of rollers is fed to the processor portion and pinched by the second pair of rollers. At this time, a feeding force of the first pair of rollers is transmitted to the second pair of rollers via the exposed photosensitive material. Since the second pair of rollers is rotated at a speed slower that of the first pair and receives the above-described feeding force, it is rotated at a speed faster than its own rotating speed. As a result, the exposed photosensitive material cannot be jammed between the first and second pairs of rollers.

When the rear end of the exposed photosensitive material passes through the first pair of rollers, the exposed photosensitive material is pinched and fed by the second pair of rollers. Since the speed of this second pair is previously set to the processing speed at the processor portion in the next step, which is slower than that of the first pair, the exposed photosensitive material can be promptly delivered from the platen portion so that it may be smoothly transferred at a speed corresponding to the processing speed of the processor portion.

A method of the present invention may utilize an apparatus having:

an exposure portion for exposing the photosensitive material;

a processor portion for processing the exposed photosensitive material;

a photosensitive material transfer portion, disposed between the exposure portion, and the processor portion comprising a pair of rollers for receiving the exposed photosensitive material from the exposure portion, for feeding, a second pair of rollers for pinching and feeding the exposed photosensitive material to the processor portion and a guide member provided between the first and second pairs of rollers for guiding the exposed photosensitive material from the first pair to the second pair.

The method of the invention includes:

positioning the guide member to a first position for supporting the exposed photosensitive material from its lower surface;

rotating the first and second pairs of rollers at equal speeds; and of retracting the guide member from the first position to the second position after the photosensitive material is pinched by the second pair and its tip end is sensed at a predetermined position at the downstream side of the second pair, as viewed in the feeding direction, so that a space may be formed at the lower surface side of the exposed photosensitive material between the first and second pairs while slowing down the rotating speed of the second pair.

According to the above-described method, the guide member is positioned at a first position and the first and second pairs of rollers are rotated at equal speeds. When the photosensitive material is pinched by the second pair of rollers and its tip end is sensed at the predetermined position at the downstream side of the second pair of rollers, the rotating speed of the second pair of rollers is slowed down. Thus transferring of the photosensitive material at the transfer portion can be smoothly achieved.

BRIEF DESCRIPTION OF THE DRAWINGS

The present invention is now hereinafter described in greater detail with reference to the accompanying drawings in which:

FIG. 5B is a perspective view of the photosensitive material feeding portion;

FIG. 22 is an exploded perspective view of a light source unit;

DETAILED DESCRIPTION OF THE PREFERRED EMBODIMENT

Figure 1:
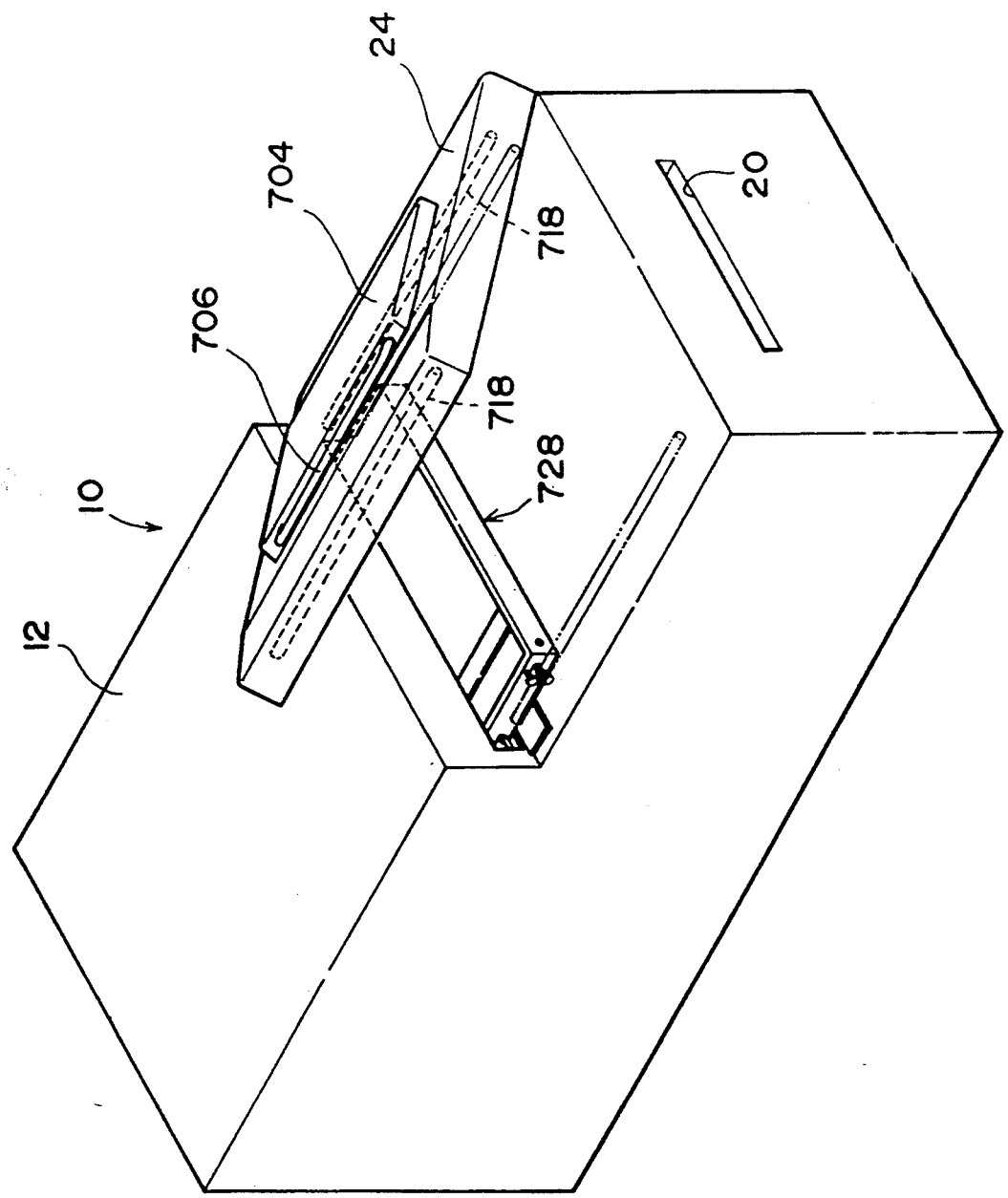
FIG. 1 is a perspective view illustrating an apparatus for making a color proof according to the present invention.
Figure 2:
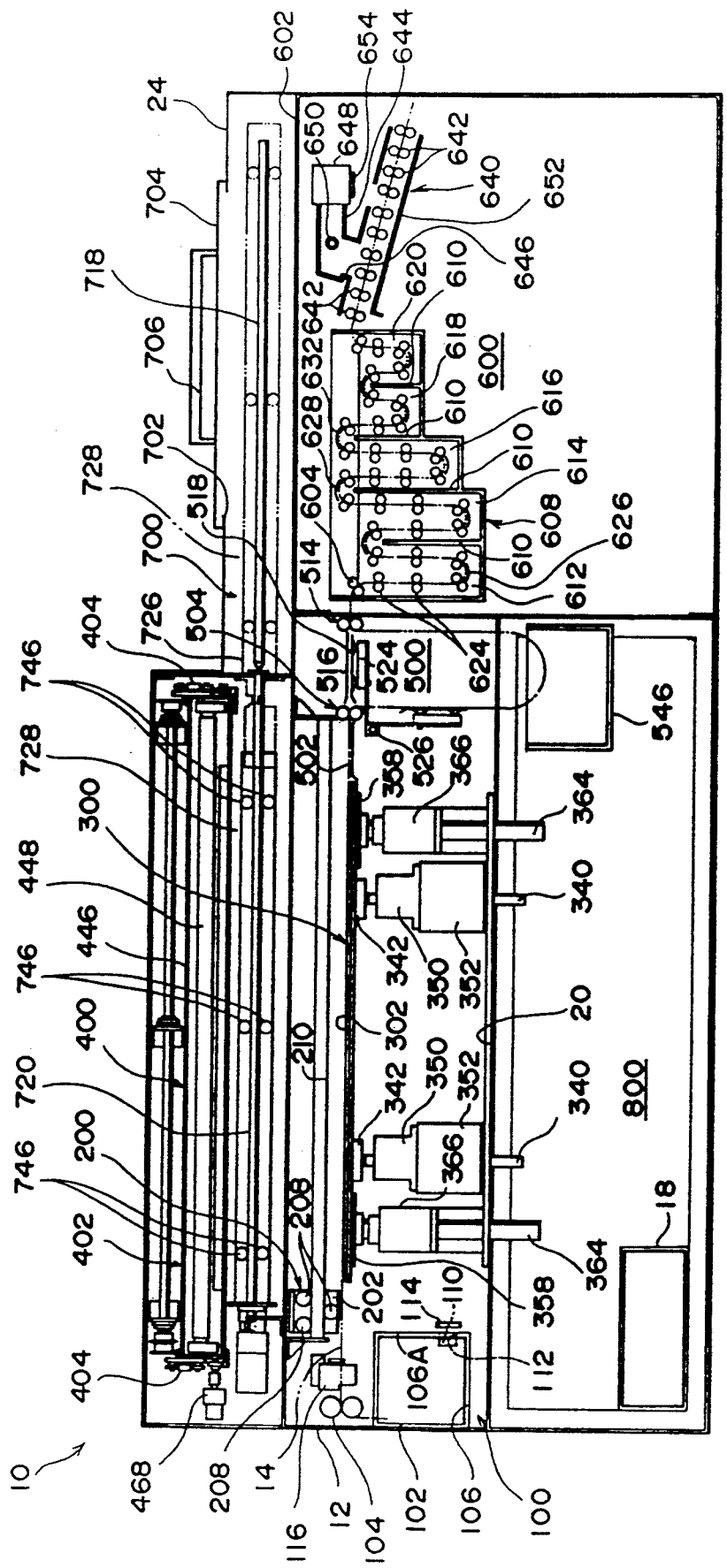
FIG. 2 is a schematic frontal view illustrating the internal structure of the apparatus of FIG. 1.
Figure 3:
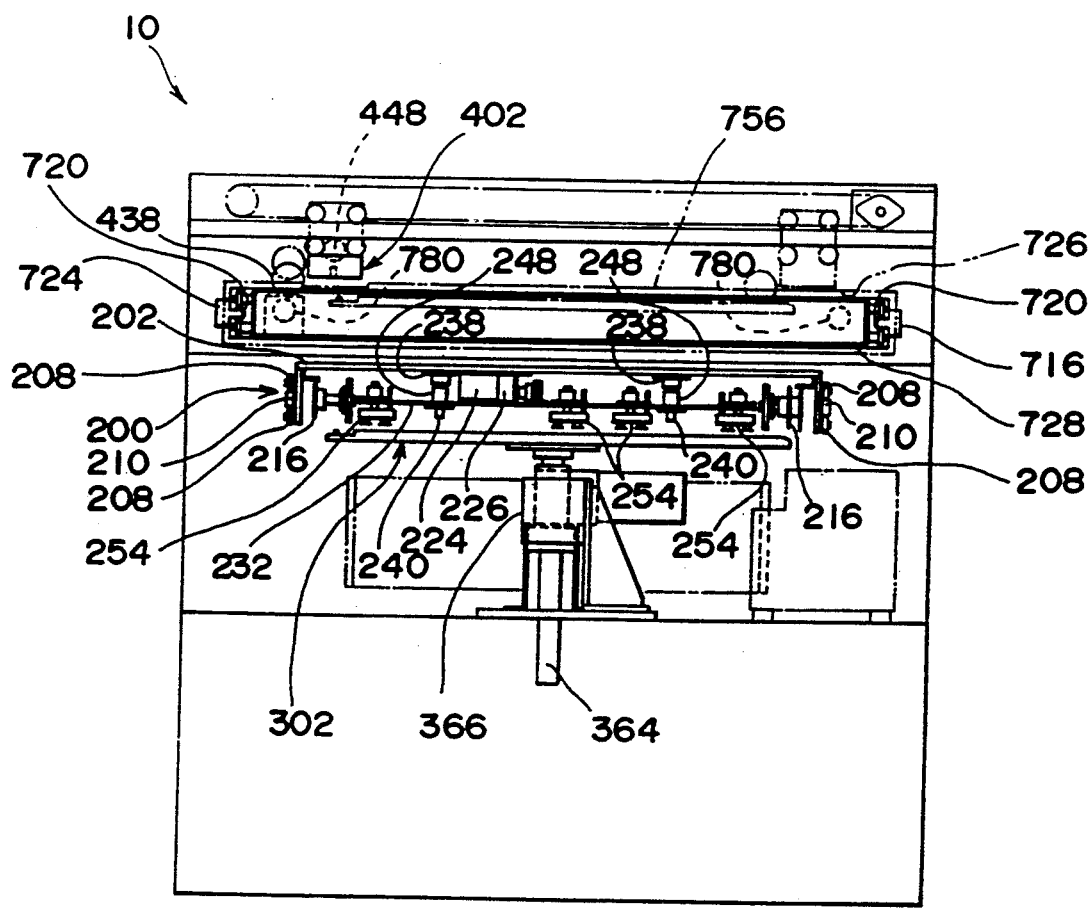
FIG. 3 is a schematic lateral view illustrating the internal structure of the apparatus.

FIGS. 1 through 3 illustrate an apparatus 10 for making a color proof according to the present invention. First, the entire arrangement of the same is described.

(1) A magazine charging portion 100 is disposed at the left lateral surface of the apparatus casing 12, as viewed in FIG. 2, in which a magazine 102 storing a photosensitive material 14 (see also FIG. 4) is charged. The tip end portion of the photosensitive material 14 is pulled out from the magazine 102 in the upward direction of FIG. 2 and is directed by 90 degrees about a pair of rollers 104 so as to be horizontally conveyed. The photosensitive material 14 is then fed to a platen portion 300, disposed adjacent to the magazine charger portion 100, by a photosensitive material feeding portion 200. In addition, upwardly of this platen portion 300, as viewed in FIG. 2, is disposed an exposure portion 400. A light source unit 402 of this exposure portion 400 reciprocates along the platen 302 in the direction at a right angle to the feeding direction of the photosensitive material 14.

In the apparatus 10 according to the present invention, a photosensitive material transfer portion 500 and a processor portion 600 are provided side by side. The transfer portion 500 passes the photosensitive material 14 exposed at the platen portion 300 to the processor portion 600, where the photosensitive material is subjected to the developing, bleaching/fixing and rinsing treatments respectively.

Figure 27:
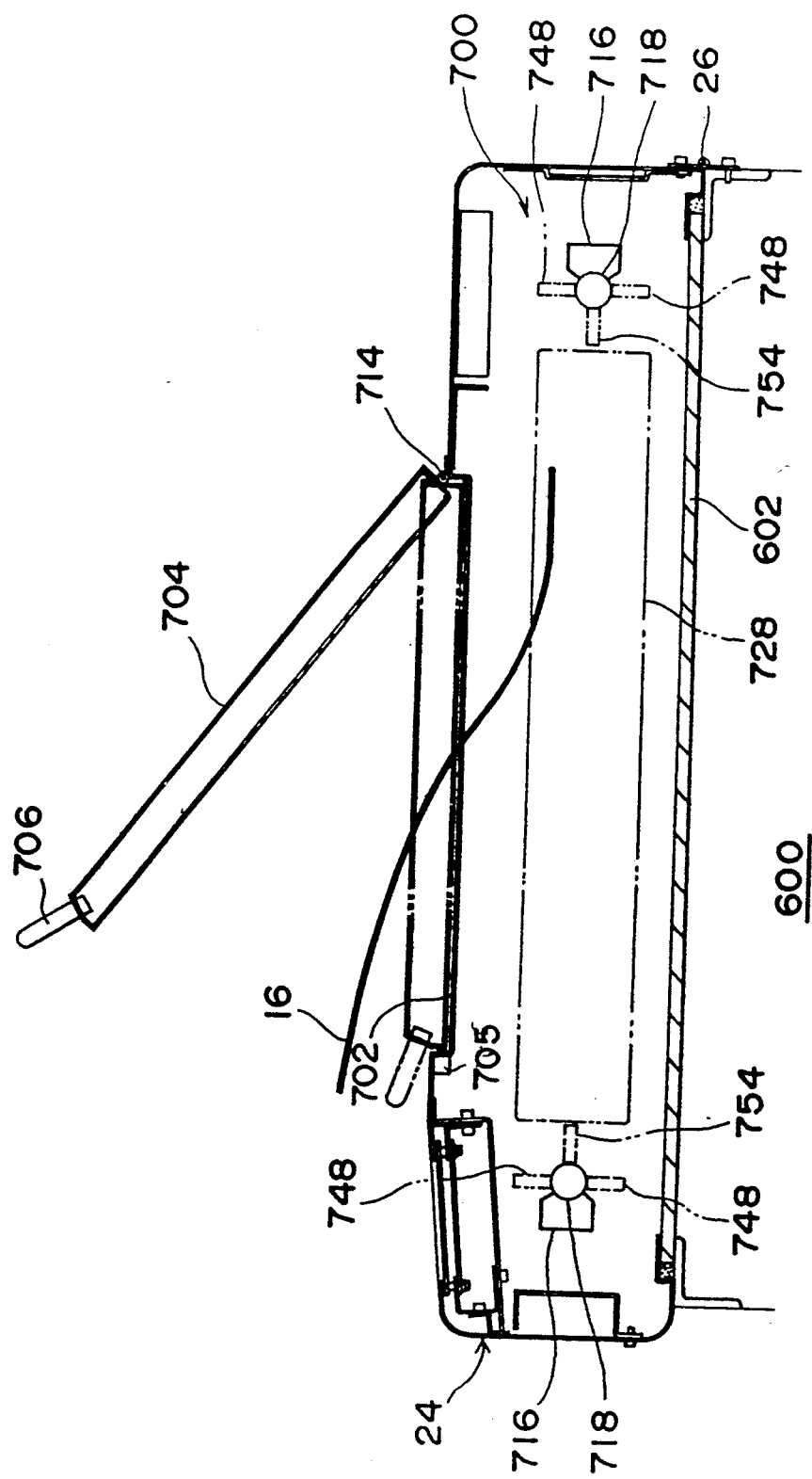
FIG. 27 is a lateral cross-sectional view of a film charging portion.

The upper side of the processor portion 600, as viewed in FIG. 2, is intended for providing a film charger portion 700 for charging the original 16. (see FIG. 27) This film charger portion 700 is disposed upwardly of a ceiling member 602 of the processor portion 600. As a result, the height of the film charger portion 600 is relatively low, on the order of the height of the operator's waist. The film charger portion 700 is covered with a large cover 24, which is mounted via a screw 26. Therefore, the large cover 24 may be opened by turning a hinge 26 in the clockwise direction of FIG. 1, with the hinge 26 as its axis. In addition, as shown in FIG. 27, a rectangular hole 702 which serves as the original charger hole is provided at this large cover 24 and further, corresponding to the rectangular hole 702, is a small cover 704 is to the cover portion via a hinge 714. The small cover 704 is opened by turning from this side of the apparatus 10, as viewed in FIG. 2, toward its innermost side by grasping a handle 706. This small cover 704 is opened as the original 16 is charged into the film charger portion 700. Incidentally, a locking means 705 which serves as an inhibitor means is mounted at the edge of the rectangular hole 702. The locking means 705 may be locked with the small cover 704 closed.

An enframed supporting base 728, which forms the copy stand, is disposed on the film charger portion 700 so as to reciprocate relative to the exposure portion 400. That is, the film charger portion 700 and the exposure portion 400 are in communication with the rectangular hole 726. This rectangular hole 726 is open while the supporting base 728 is moving while it is blocked at all other times. An overlay sheet 708 (see FIG. 28) on which the original is placed is attached to the supporting base 728.

The supporting base 728 conveys the original 16 placed on the overlay sheet 708 at the film charger portion 700 toward the exposure portion 400 to expose the image recorded on this original 16 to the photosensitive material 13, and returns it again to the film charger portion 700 after completion of the exposure. The apparatus according to the present invention is intended for checking whether the layout of the original is proper or if color differences are present or any printing error of the printed letters is present or not prior to making an actual regular print using each original 16 separated in color into a Y-, M-, C- and BK (black)-print, and positions the original one by one, closely overlaps it with the photosensitive material 14 for exposure to make a color picture just like a regular printed matter. By so doing, the errors of the original can be detected so that the copy can be modified in advance. Incidentally, in this embodiment, when a positive type photosensitive material is used, as the original 16, the BK print is overlapped on the Y print, the M print, and the C print to make them closely adhere to the photosensitive material 14 for exposure using a B (blue), G (green) and R (red) filters 480 respectively. When a negative type photosensitive material is used, Y, M, C and BK prints, which are originals 16, are sequentially closely adhered to the photosensitive material while the B (blue), G (green), R (red) and BK (black) filters are used for exposure.

Disposed downwardly of the platen portion 300, as viewed in FIG. 2, is a control unit 800, which controls feeding of the photosensitive material 14, driving of the supporting base 728 at the film charger portion 700, exposure of the exposure portion 400, temperature of the treating solution at the processor portion 600, heater temperature, the feeding speed, and the like.

The arrangement of each portion described above is hereinafter described in greater detail.

(1) Magazine charger portion 100

Figure 4:
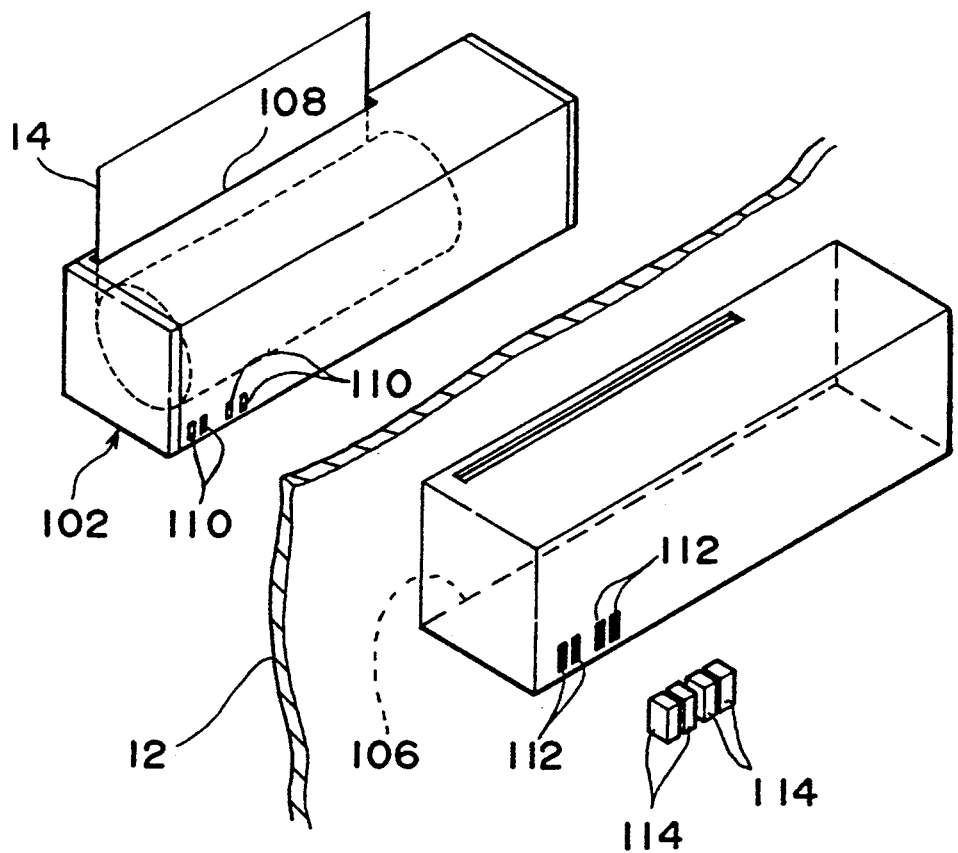
FIG. 4 is a perspective view illustrating a magazine charging portion.

As shown in FIG. 2, a rectangular recess is provided on the left lateral surface of the apparatus 10 to serve as a chamber 106 for charging with the magazine 102. As shown in FIG. 4, the magazine 102 is a box-type and a hole 108 for withdrawing the photosensitive material 14 stored in a rolled form is provided on its upper surface. The hole 108 is in communication with the interior of the magazine 102, but the entrance of light therein is prevented.

A light reflecting sheet 110 is adhered to the wall surface opposed of the magazine 102 opposed to the charging chamber 106. There are, at most, four light reflecting sheets 110 and, depending on the type or size of the stored photosensitive material 14, the presence or absence of each sheet is determined. In this embodiment, three types of photosensitive materials are available such as the positive, and negative paper or positive film, and as for the crosswise dimension, three sizes are available. Any one of the nine (3×3) photosensitive materials 14 is stored within the magazine 102. The kind of the photosensitive material 14 stored within the magazine 102 is determined depending on the number of light reflecting sheets 110 are adhered to the magazine 102.

Four rectangular holes 112 are provided on the innermost wall surface 106A of the charging chamber 108 corresponding to the sheets 110.

A photoelectric sensor 114 is disposed on the rear surface of the wall surface 106A, corresponding to each rectangular hole 112. The photoelectric sensor 114 has a light emitting element and a light receiving element, and a signal line of the latter is connected to the control unit 800. When the light reflecting sheet 110 is adhered to the magazine 102, light emitted from the light emitting element of the sensor 113 passes through the rectangular hole 112 to reflect against the sheet 110 to be received again by the sensor 114. As a result, the presence or absence of the sheet 110 is converted into an electrical signal to be supplied to the control unit 800.

When the magazine 102 is charged into the charger hole 106, the charging chamber 106 is screened and entry of light from the chamber 106 into the apparatus 10 is blocked.

With the magazine 102 charged into the charging chamber 106, a guide plate (not shown) is provided at a site at the upper position of the withdrawing hole 108, and the photosensitive material 14, guided by this guide plate, is pinched by the pair of rollers 104 (see FIG. 2). This pair of rollers 104 is coupled to the driving shaft of the motor (omitted) at one of its rotating shafts. The motor is connected to the control unit 800 and its operation is controlled by the control unit 800 so that the direction of the photosensitive material 14 may be charged by 90 degrees and fed.

A cutter 116 is disposed on the feeding passageway of the photosensitive material 14. The cutter 116 is connected to the control unit 800. At the moment the photosensitive material is fed by a predetermined amount, a signal is emitted from the control unit 800 and the cutter is actuated to cut the photosensitive material.

(2) Photosensitive material feeding portion 200

Figure 5A:
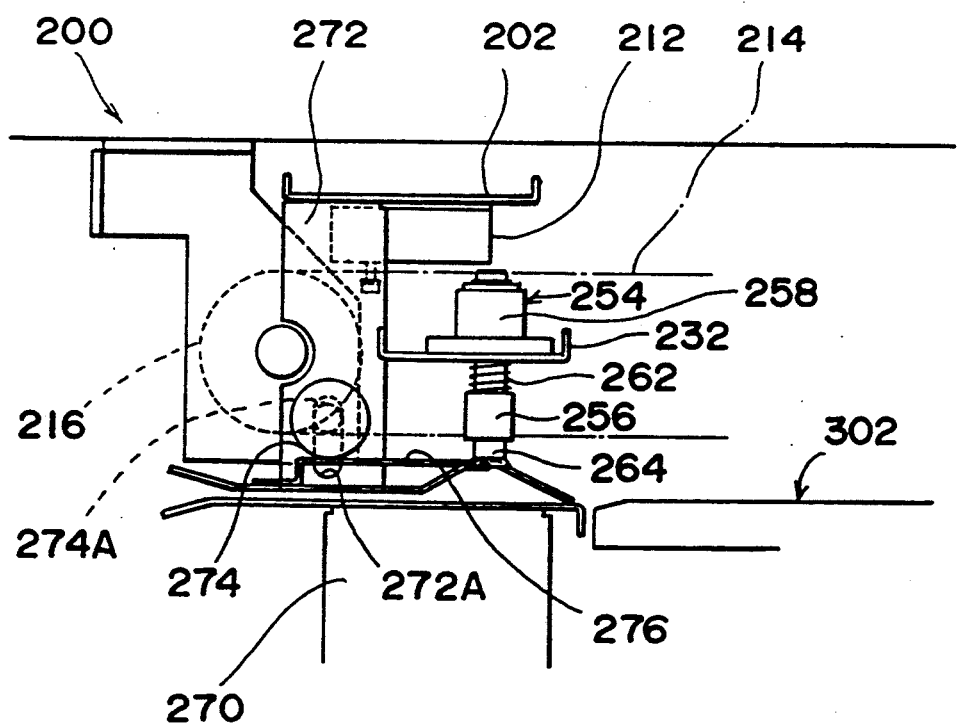
FIG. 5A is a frontal view of a photosensitive material feeding portion.

As shown in FIG. 5A and FIG. 5B, a transfer member 202 which consitutes part of the photosensitive material feeding portion 200 is disposed along the extension of the photosensitive material 14, as viewed in the feeding direction. The photosensitive material 14 is further conveyed to a predetermined position by this transfer member 202.

As shown in FIG. 5B, the transfer member 202 is disposed so that its longitudinal direction coincides with the crosswise direction of the photosensitive material 14. Tripod plates 204 which run parallel to each other extend from both end portions of this transfer member 202, as viewed in the longitudinal direction. Three shafts 206 disposed at predetermined intervals in the vertical direction protrude in the outward direction from the lateral surface of each tripod plate 204. (two for the upper side and one for the lower side) A roller 208 is supported on each shaft 206. A pair of rails 210 extending in the feeding direction of the photosensitive material is pinched between two rollers 208 supported against the upper shaft and one roller 208 supported against the lower shaft 206. As a result, the transfer member 202 is supported against a rail 210 by the roller 208 and is capable of moving along the rails 210.

In addition, a bracket 212 is mounted adjacent to both end portions of the transfer member 202, as viewed in the longitudinal direction, and is anchored to a chain 214 disposed along the rail 210. The chain is looped and is tensioned about a pair of sprockets 216 disposed adjacent to both end portions of the rail 210, as viewed in the longitudinal direction. One sprocket 216 is coupled to a rotating shaft 218A of a motor 218 via a coupling means 217.

When the motor 218 is driven, the rotation force is transmitted to rotate the sprockets 216, which in turn causes the transfer member 202 to move along the rails 210.

Incidentally, the transfer member 202 can reciprocate along the rails 210 by the clockwise and counterclockwise rotation of the motor 218. Photoelectric sensors 220 are each provided adjacent to both end portions of the rail 210, as viewed in the longitudinal direction. The signal lines of these photoelectric sensors 220 are each connected to the control unit 800. The light emitting portion and the light receiving portion of the photoelectric sensor 220 are positioned opposed to each other at both sides of the transfer passageway of the tripod plate 204 of the transfer member 202. The sensors 220 are each disposed corresponding to the stopping position of the transfer member 202. As a result, the control unit 800 can sense the stopping position of the transfer member 202 in accordance with the signal from the sensor 220.

Figure 6:
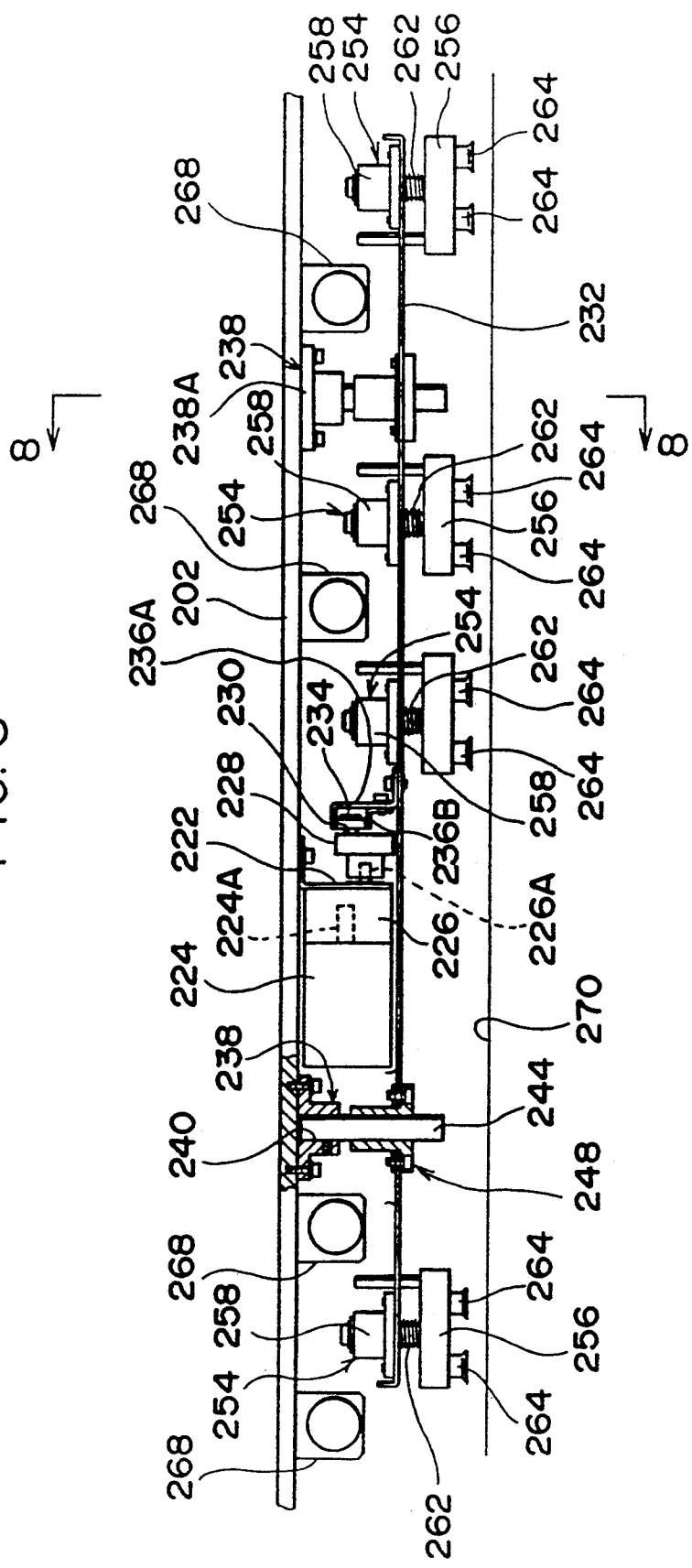
FIG. 6 is a right side lateral view of the photosensitive material feeding portion of FIG. 5B.
Figure 7:
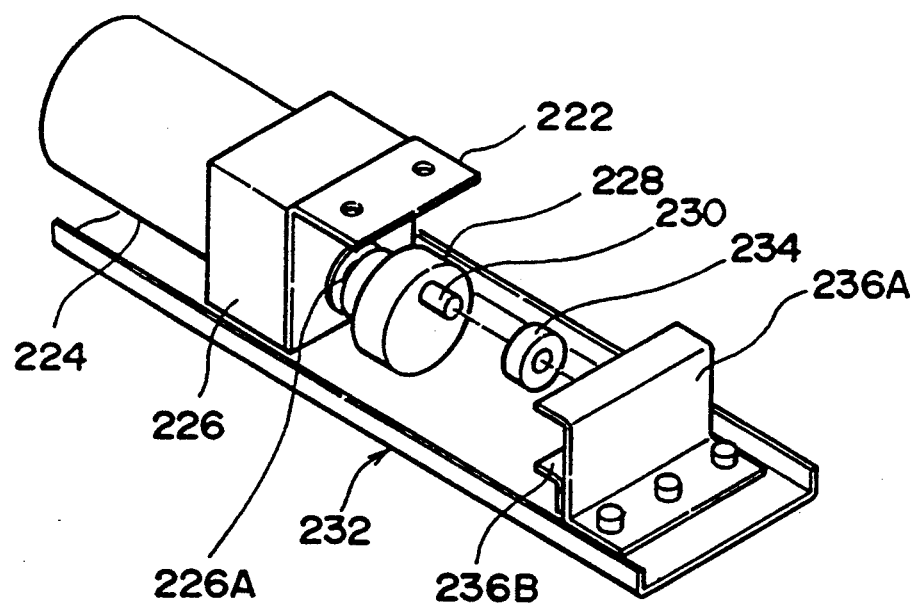
FIG. 7 is a perspective view of a motor.

As shown in FIGS. 6 and 7, on the lower end surface of the transfer member 202, a motor 224 is mounted via a flange 222. The motor 224 is connected to the control unit 800. A rotating shaft 224A of the motor is coupled to a gear box 226, which reduces the speed of the rotating shaft 224A to transmit the torque to an output shaft 226A. A circular cam 228 is mounted to the output shaft 226A and on the end surface of the cam 228, a connecting shaft 230 is mounted at a position eccentric from its axis. The connecting shaft 230 is disposed downwardly, as viewed in FIG. 6, while being inserted into a bearing 234 provided at a supporting plate 232 running parallel to the transfer member 202. The outer circumference of the bearing 234 is fixed by means of two brackets 236A and 236B mounted on the upper surface of the supporting plate 232. As a result, the bearing 234 is moved along with the supporting plate 232.

In this case, when the motor 224 is driven, the output shaft 226A of the gear box 226 is rotated at a reduced speed and the connecting shaft 230 is rotated about the axis of the cam 228. When the connecting shaft 230 is rotated once, the bearing 234 reciprocates in the directions coming close to and moving away from the transfer member 202, that is, in the vertical direction, as viewed in FIG. 6.

Figure 8:
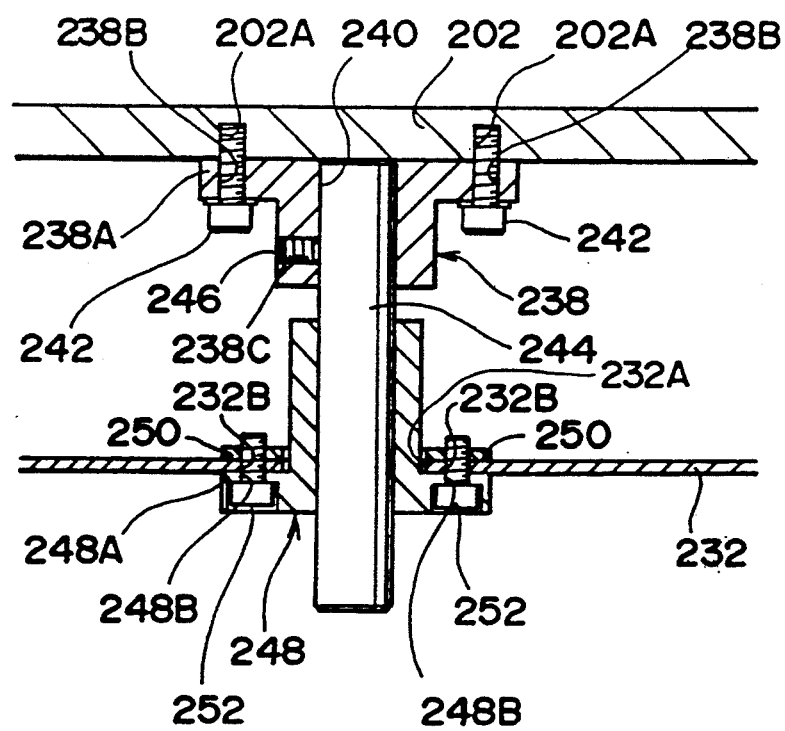
FIG. 8 is a cross-sectional view taken along the line 8—8 of FIG. 6.

As shown in FIG. 8, internally of the transfer member 202 relative to the pair of tripod plates 204, fixed bases 238 are each mounted at positions equal from each tripod plate 204. The fixed base 238 is of cylindrical form with a circular hole 240 provided at the axis portion and, at its end portion at the side of the transfer member 202, a flange portion 238A protruding in the radial direction is formed. A plurality of circular holes 238B are provided at this flange portion 238A while, corresponding thereto, female threads 202A are formed on the transfer member 202. In this case, a bolt 242 is forced into the circular hole 238B to engage the female thread 202A to fix the fixed base 238 to the transfer member 202.

One end of a shaft rod 244 is inserted into the circular hole 240 of the fixed base 238. The shaft rod 244 is fixed by a screw 246 screwed into a female thread hole 236C, which is forced from the outer periphery of the fixed base 238 into a circular hole 240.

The other end of the shaft rod 244 passes through the circular hole of a circular sliding base 248 provided on the supporting plate 232 so as to move in the axial direction. The sliding base 248 is inserted into a circular hole 232A provided at the supporting plate 232. A flange portion 248A protruding in the radial direction is formed in the end portion of the sliding base 248, as viewed in its axial direction. This flange portion 248A abuts the lower end surface of the supporting plate 232. A circular hole 248B is provided at the flange portion 248A. A circular hole 232B is provided at the supporting plate, corresponding to this circular plate 248B and a nut plate 250 is deposited on its upper surface. As a result, a bolt 252 may be forced into the circular hole 248B of the flange portion 248A and the circular hole 232B of the supporting plate 232 to engage the nut plate 250 to fix the sliding base 248 to the supporting plate 232.

The shaft rod 244 fixed to the fixed base 238 and supported against the sliding base 248 restricts rotation of the supporting plate 232 as the supporting plate 232 reciprocates by rotation of the above-described motor 224 to guide it so as to reliably move only in the vertical direction.

As shown in FIG. 6, a plurality of sucker units 254 for sucking the photosensitive material 14, are mounted on the supporting plate 232. This sucker unit 254 is disposed in plural number according to the lateral dimension of the photosensitive material 14 in order to suck at least both end portions of the photosensitive material 14, as viewed in the lateral direction. Incidentally, in this embodiment, the number of the lateral dimensions of the photosensitive material applied is three and the sucker units 254 are each provided at a reference position of the photosensitive material 14 (dimension of its one end, as viewed in the lateral direction, is set constant for any photosensitive material 14) and at positions each corresponding to the other end portion, as viewed in the lateral direction, (four units in all)

Figure 9:
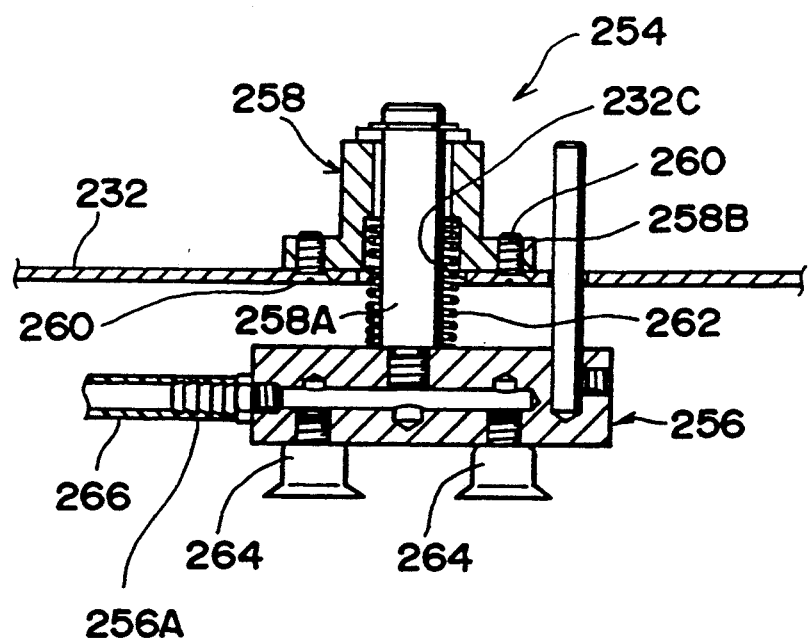
FIG. 9 is an enlarged view of a sucker unit.

As shown in FIG. 9, a through hole 232C is provided at the position of the supporting plate 232 where the sucker unit 252 is mounted. A shaft 258A of a damper 258 supporting the sucker base 256 is passed through the through hole 232C. The damper 258 supports the shaft 258A so as to move it in a predetermined amount in the axial direction. A flange portion 258B is provided at the damper 258 and is fixed to the upper surface of the supporting plate 232 by means of a bolt 260. A coiled compression spring 262 is mounted at the shaft 258A between the supporting plate 232 and the sucker base 256. The spring 262 is energized in the direction of separating the sucker base 256 from the supporting plate 232.

Two suckers 264 of small dimension (about 15 to 20 mm in diameter) are provided side by side at the sucker base 256. Therefore, a suction force caused by a single sucker unit 254 is not focused on one position of the photosensitive material 14, but acts over a wide range.

In addition, the suction force applied to the single sucker 264 can be made small. As a result, in this embodiment, the suction force applied to the sucker 264 can be half as small as in a case in which the photosensitive material 14 is sucked by a single sucker unit 254 having a single sucker.

The suction surface of the sucker 264 and the interior of the sucker base 256 are in communication with each other. In addition, a suction nozzle 256A is provided at the sucker base 256 and is connected to a suction unit 18 (see FIG. 2) via a tube 266. The suction unit 18 is connected to the control unit 800, which controls its operation.

In addition, a solenoid valve 268 (see FIG. 6) attached to the transfer member 202 is interposed at the intermediate portion of the tube 266. The solenoid valve 268 is connected to the control unit 800, which opens and closes a line within the solenoid valve 268 to control suction and release of the photosensitive material by the sucker 264.

Disposed on the lower surface of the photosensitive material 14 is a base plate 270 (see FIG. 5A). When the photosensitive material 14 is sucked to the sucker 264, the above-described connecting shaft 230 is rotated through half of a rotation to downwardly move the supporting plate 232 to pinch the photosensitive material 14 with the sucker 264 and the base plate 270. At this time, since the sucker base 256 is moved in the direction coming close to the supporting plate 232 against the energizing force of the coiled compression spring 262, the force by which the photosensitive material 14 is pinched by the sucker 264 and the base plate 270 can be held approximately constant.

The photosensitive material 14 sucked by the sucker 264 is sucked up by a further half rotation of the connecting shaft 230 and, in this state, it is moved on the platen 302 of the platen portion 300 in a predetermined amount because the transfer member 202 is moved along the rails 210, to be severed by the above-described cutter 116 and further the tip end of the photosensitive material 14 is conveyed to a predetermined position.

When the photosensitive material 14 is conveyed to the predetermined position by the transfer member 202, the connecting shaft makes a half rotation and the photosensitive material 14 is placed onto the platen 302 to actuate the solenoid valve 268 to release the suction of the material with the result that the transfer member 202 and the photosensitive material 14 are separated.

Figure 10:
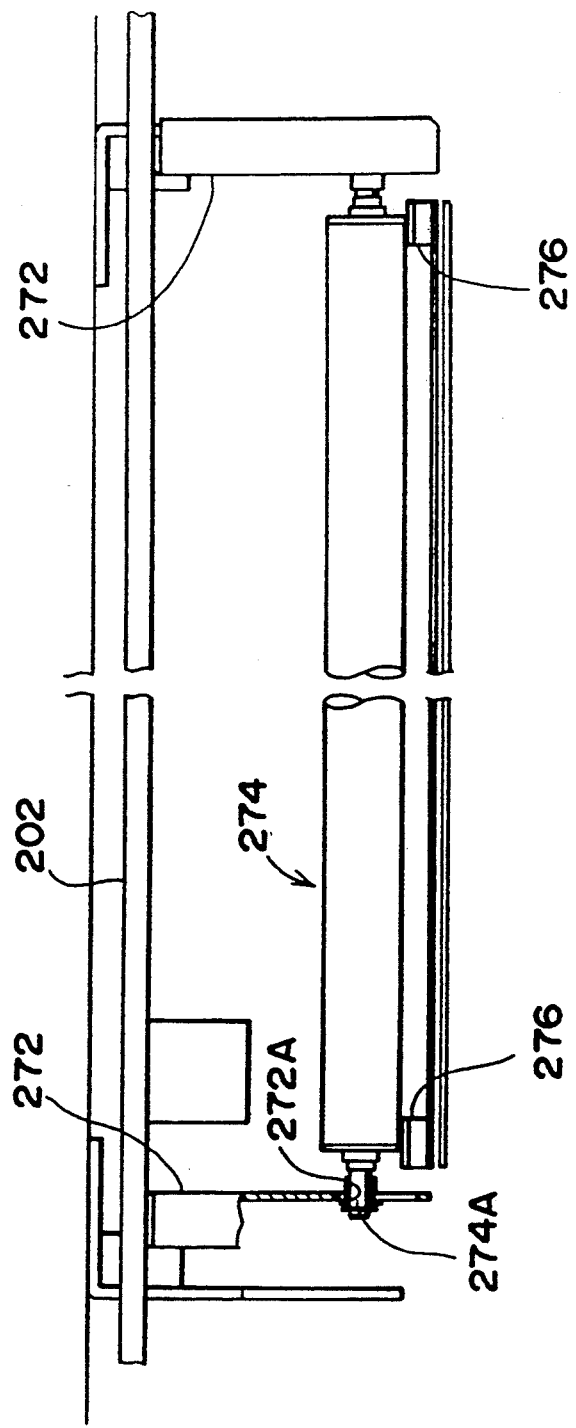
FIG. 10 is a right side lateral view of a photosensitive material squeeze roller of FIG. 5B.

As shown in FIG. 5A and FIG. 10, brackets 272 are each mounted at the transfer member 202 and internally of the pair of tripod plates 204. An elongated hole 272A is provided in the vertical direction of each bracket 272 and a rotating shaft 274A of a squeeze roller 274 for the photosensitive material is suspended between two elongated holes 272A. With the rotating shaft 274A positioned at the lower end of the elongated hole 272A, this squeeze roller 274 is placed onto the platen 302 of the platen portion 300. In addition, a cam plate 276 is mounted at the base plate 270 and corresponding to the rotating shaft 274A of the squeeze roller 274. As a result, with the transfer member 202 stopped at the above-described original position, the squeeze roller 274 climbs up the cam plate 276 to form a gap between the same and the base plate 270. In consequence, the squeeze roller 274, which has stopped at the original position, cannot interfere with the photosensitive material 14 conveyed from the magazine charger portion 100.

When the transfer member 202 reciprocates, in the advancing stroke, the squeeze roller 275, placed on the photosensitive material 14, is moved without rotating while, in the returning stroke, it is moved rotating on the photosensitive material 14. This rotating motion of the squeeze roller 274 in the returning stroke causes the air present between the photosensitive material 14 and the platen 302 to be squeezed out.

(3) Platen portion 300

Figure 11:
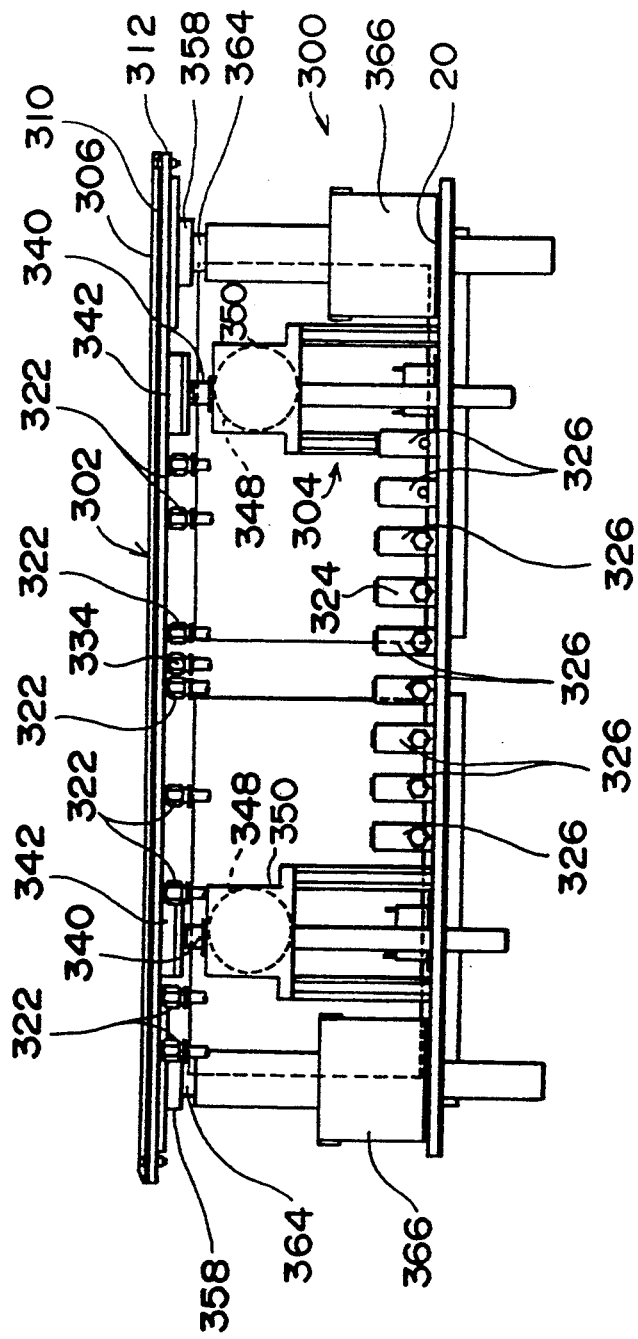
FIG. 11 is an exploded perspective view of a platen portion.

As shown in FIG. 11, the platen portion 300 is comprised of the platen 302 supported on the intermediate base of the apparatus 10 and a driving portion 304 for vertically moving this platen 302.

Figure 12:
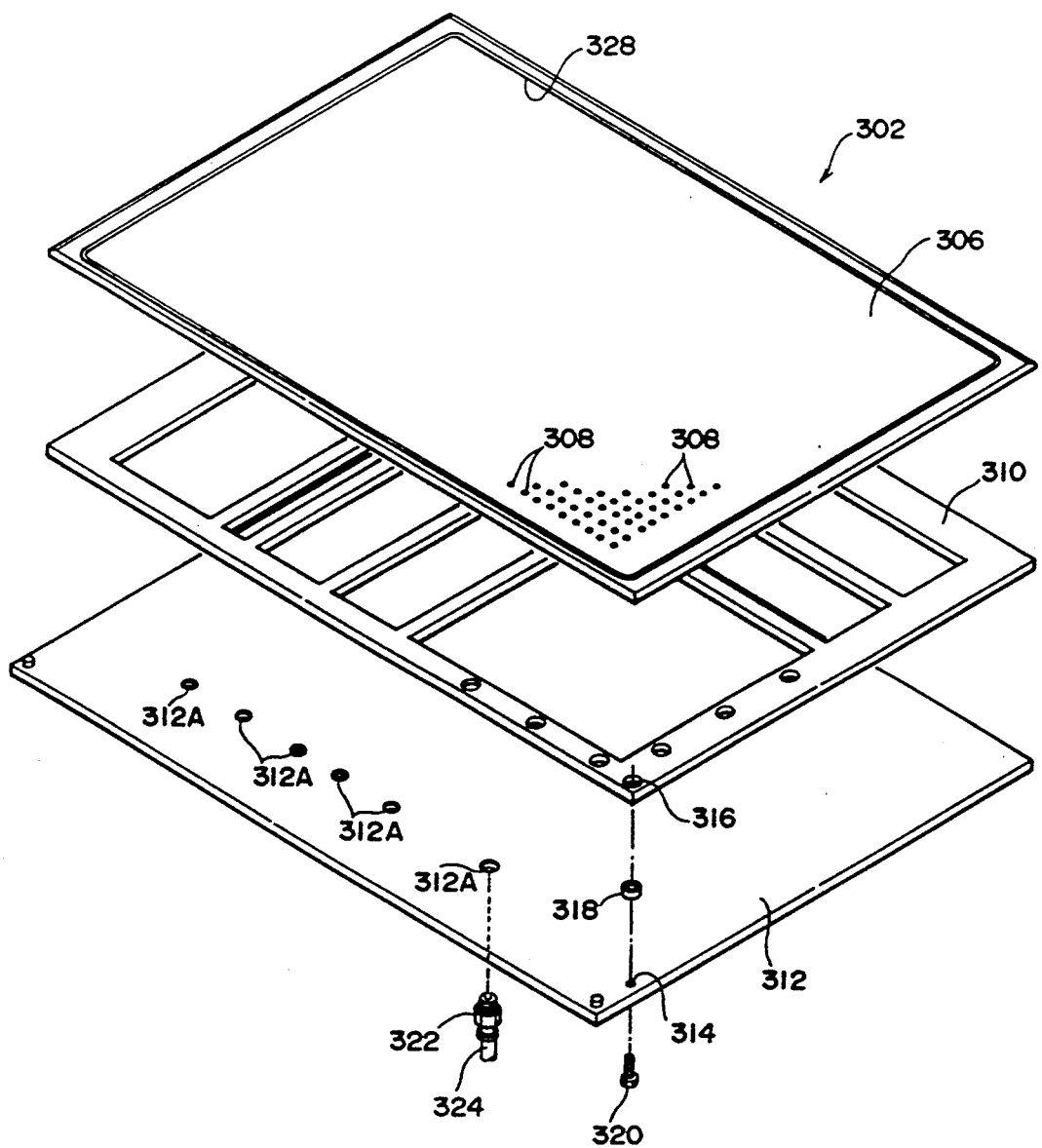
FIG. 12 is an exploded perspective view of a platen.
Figure 15:
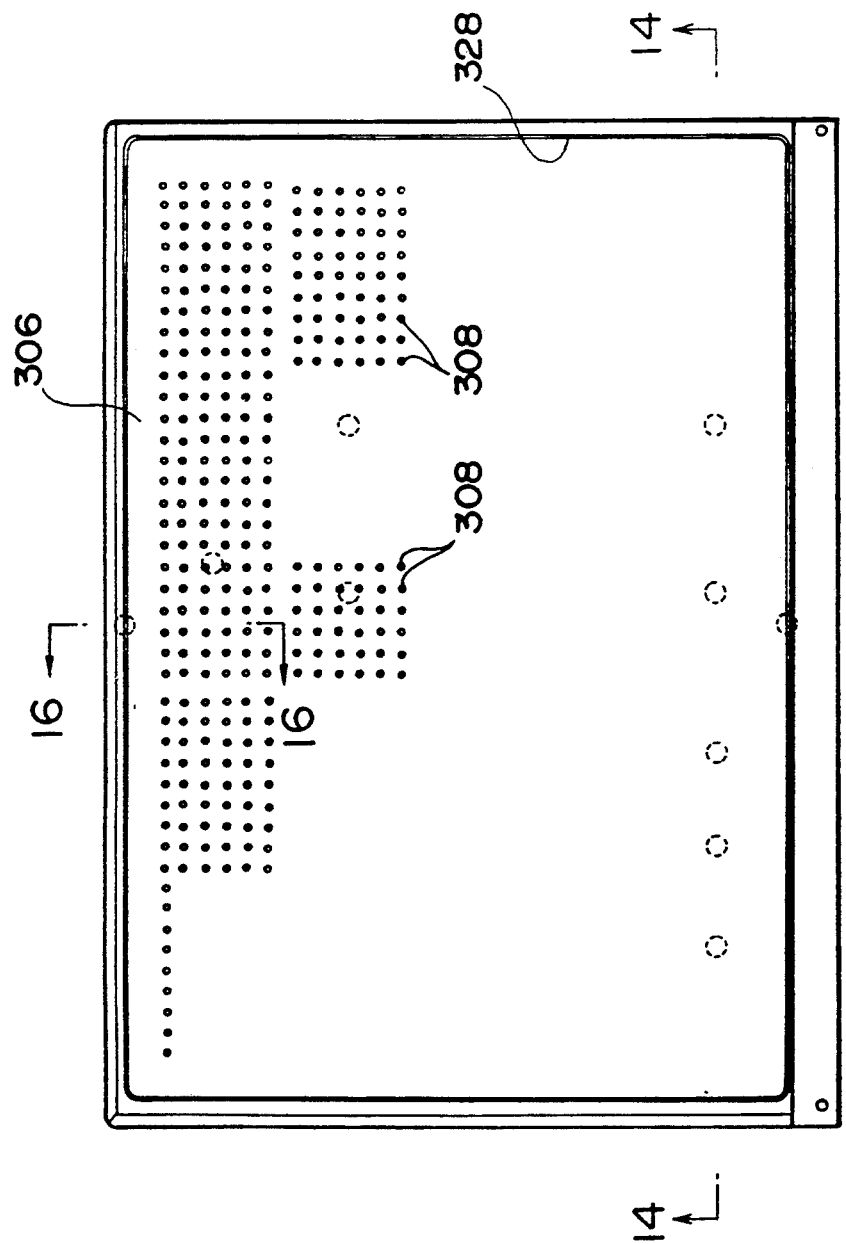
FIG. 15 is a plan view of a platen.

As shown in FIG. 12, the platen 302 is of triple layer construction and the above-described photosensitive material 14 is placed on the uppermost platen body 306. As also shown in FIG. 15, a plurality of holes 308 are provided through the platen body 306. These holes 308 are provided corresponding to each pattern formed on a pattern forming plate 310, which is the intermediate layer.

Figure 13:
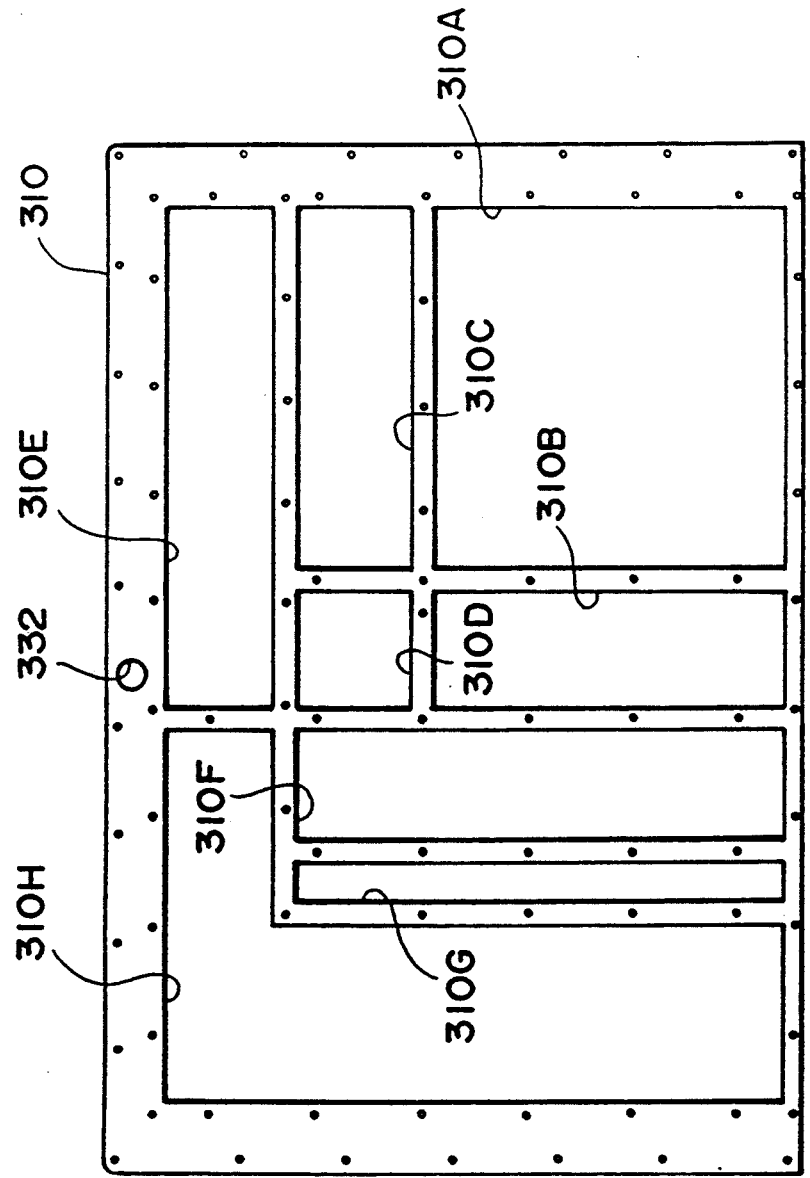
FIG. 13 is a plan view of a pattern forming plate.

The pattern forming plate 310 is formed of a sponge containing closed cells, and as shown in FIG. 13, predetermined patterns 310A through H are stamped depending on its type. There are eight patterns 310A through H including the large and small sizes and these are combined with the eight sizes of the photosensitive material 14.

Figure 14:
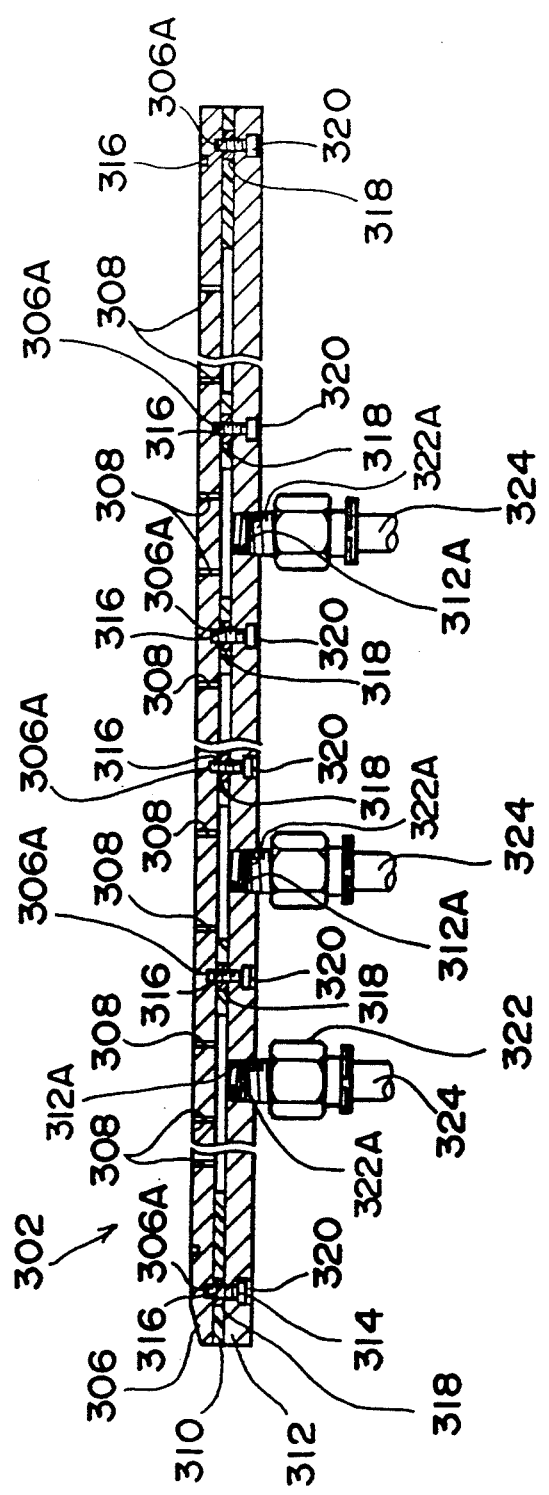
FIG. 14 is a cross-sectional view taken along line 14—14 of FIG. 15.

As also shown in FIG. 14, the pattern forming plate 310 is pinched by the platen body 306 and the lowermost base plate 312. A plurality of circular holes 316 is provided along its peripheral edge of the base plate 312 while circular holes are also provided on the pattern forming plate 310 coaxially with the circular holes 314. This circular hole 316 is made larger than that 314 of the base plate 312 and a ring-shaped spacer 318 is inserted therein. The dimension of the spacer 318, as measured in the axial direction, is set to 2 mm in this embodiment, which is slightly smaller than that of the thickness of the pattern forming plate 310.

In addition, corresponding to these circular holes 314, 316, a female thread 306A is formed on the platen body 306 coaxially with the circular holes 314, 316. In this case, screw 320 is forced into the circular holes 314, 316 to engage the female thread 306A to fix the pattern forming plate 310 pinched by the platen body 306 and the base plate 312. In this case, since the pattern forming plate 310 is made of a soft member, it is collapsed by a tightening torque caused by the screw 320, but since the spacer 318 is disposed at the circular hole 316, it is collapsed up to the axial dimension (2 mm) of this spacer 318 and thereafter the distance between the platen body 306 and the base plate 312 is held constant by the spacer 318. In consequence, a plurality of spaces partitioned by the pattern forming plate 310 are independently formed between the platen body 306 and the base plate 312.

Corresponding to each partitioned pattern space, a female thread hole 312A is passed through the base plate 312 and a male thread 322A of a line plug 322 is engaged therewith. The line plugs 322 are each connected to one end of the tube 324 while the other end of the tube 324 is connected to a solenoid valve 326 (see FIG. 11) arranged on an intermediate base 20 of the apparatus 10. The solenoid valves 326 are each connected to a suction unit 18. As a result, opening of the solenoid valve 326 causes a negative pressure to act on the pattern space communicating through the suction unit 118 and the tube 324 with the result that the air is sucked in from a hole 308 provided on the platen body 306. Make/break control of the solenoid valve 326 is achieved so as to correspond to the size of the photosensitive material 14. As a result, the photosensitive material 14 placed on the platen body 306 is sucked onto the platen body 306 by the above-described suction force in its entirety.

Figure 16:
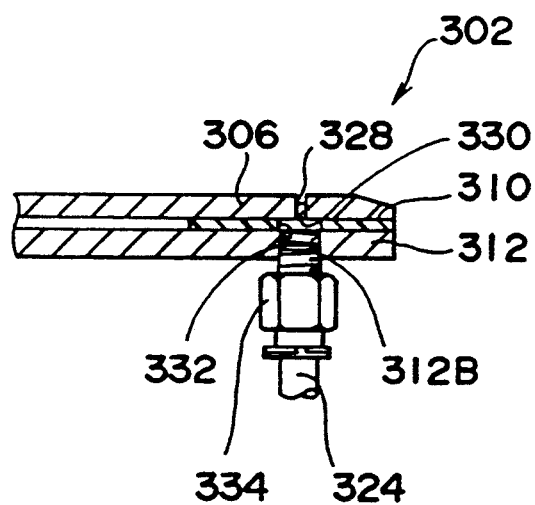
FIG. 16 is a cross-sectional view taken along line 16—16 of FIG. 15.

As shown in FIG. 16, formed adjacent to the peripheral edge portion of the platen body 306 is a continuous groove 328. Provided at part of the groove 328 is a through hole 330 transferring through the platen body 306. Also, a through hole 332 corresponding to this through hole 330 is provided on the pattern forming plate 310. The through hole 332 forms a hollow portion with the base plate 312 attached. A female thread hole 312B which communicates with this through hole 332 is formed on the base plate 312B and a conduit plug 334 is engaged therewith. This conduit plug 334 is also connected to the suction unit 18 via the solenoid valve 336, as in the above-described other conduit plug 322. As a result, when the solenoid valve is open, a negative pressure acts on the interior of the hollow portion of the through hole 332 and air is sucked therein from the groove 328 provided at the platen body 306. A transparent overlay sheet 708 (see FIG. 28), which is larger than the photosensitive material 14 and the original 16, is placed on the groove 328 and this overlay sheet 708 is adsorbed by the groove 328 so that the photosensitive material 14 and the original 16 is closely adhered to the platen body 306. Incidentally, the overlay sheet will be later described.

Figure 17:
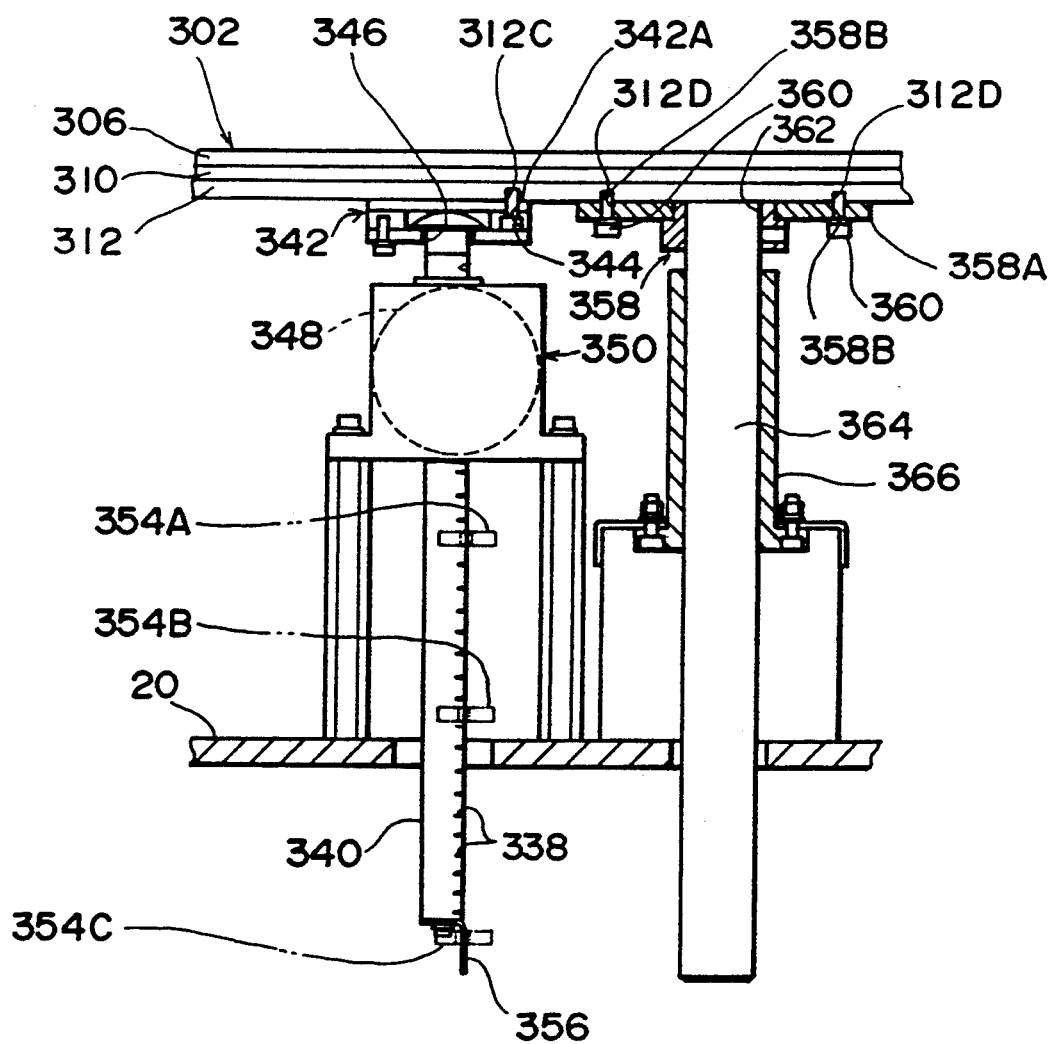
FIG. 17 is an enlarged frontal view of a driving portion.

As shown in FIG. 17, the platen 302 is supported by the tip end portion of a pair of cylindrical racks 340 (along which outer periphery) having a tooth portion 338 formed thereon to form part of a rack and pinion. Corresponding to the tip end portion of the rack 340, a cylindrical rack base 342 is disposed on the base plate 312 of the platen 302. The rack base 342 is fixed to the base plate 312 because the bolt 344 forced into a circular hole 342A provided at the rack base 342 engages a female thread groove 312C provided on the base plate 312. The rack 340 is inserted for fixation into the circular hole 346 provided at the axial portion of the rack base 342. The intermediate portion of the rack 340 passes through a gear box 350. (see FIG. 11) The gear box 350 incorporates a pinion gear (omitted) coupled to the rotating shaft of the motor 348, which engages the tooth portion 338 formed on the rack 340. Two motors 348 are each connected to the control unit 800 so that they may be actuated in synchronism with each other by the control unit 800. As a result, the platen 302 can be vertically shifted while maintaining a horizontal condition.

Figure 18:
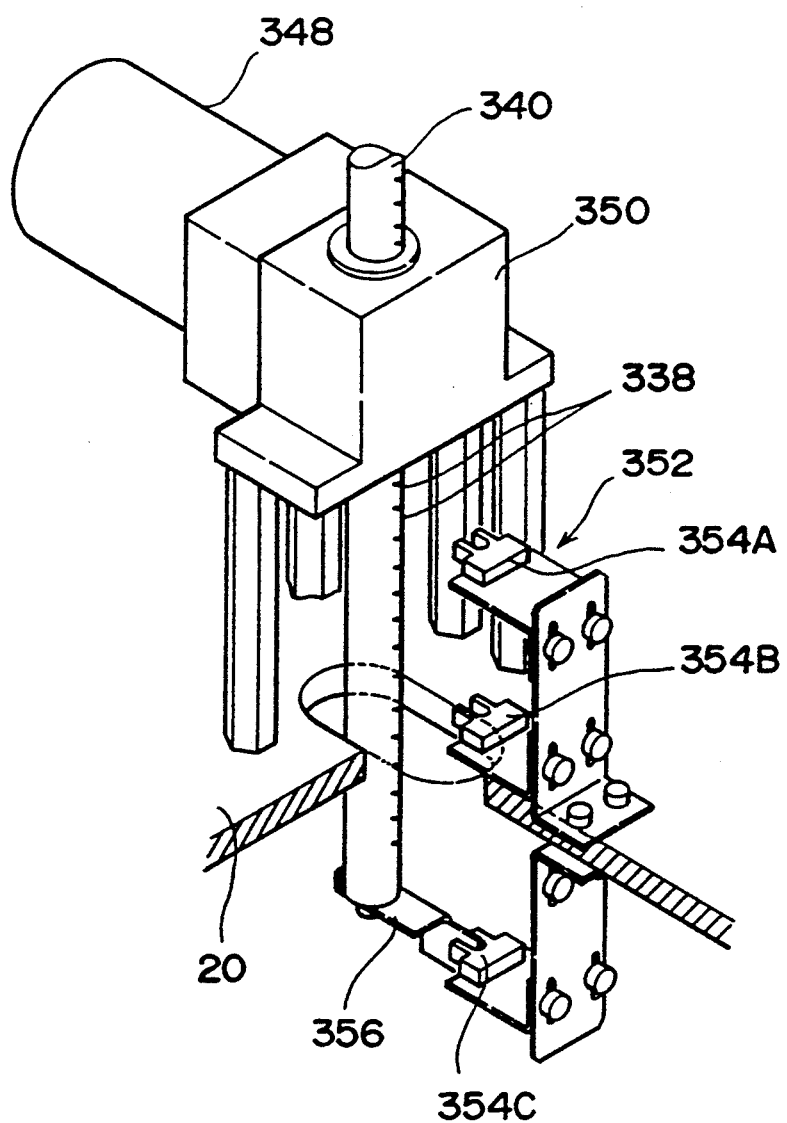
FIG. 18 is a perspective view of a rack.

As also shown in FIG. 18, downwardly of the gear box 350, is disposed a sensor unit 352 is disposed. At the sensor unit 352, photoelectric sensors 354A to C are each attached corresponding to the upper limit, lower limit and intermediate positions as the platen 302 is vertically shifted. The signal lines of the photoelectric sensors 354A to C are connected to the control unit 800. Meanwhile, a screen plate 356 is provided at the lower end portion of the rack 340. The screen plate 356 screens the intermediate portion between the light emitting portion and the light receiving portion of the photoelectric sensors 354A to C while the rack 340 travels. As a result, the upper limit, lower limit and intermediate portion, as the rack 340 is vertically shifted, can be each recognized in accordance with the output signal from the photoelectric sensors 354A to C.

In addition, as shown in FIG. 17, adjacent to the rack base 342, a bracket 358 is mounted to the base plate 312 of the platen 302. A flange portion 358A is formed on the outer periphery of the bracket 358 and a bolt 360 forced into a circular hole 358B provided through the flange portion 358A engages a female thread groove 312D provided on the base plate 312 to be fixed to the base plate 312. A sliding shaft 364 is inserted for fixation into a circular hole 362 provided at the axial portion of this bracket 358. The sliding shaft 364 passes through a sliding shaft bearing portion 366 provided on an intermediate base 20 to limit the slope and rotation as the platen 302 is vertically shifted to guide the platen 302 in the horizontal condition.

Figure 19:
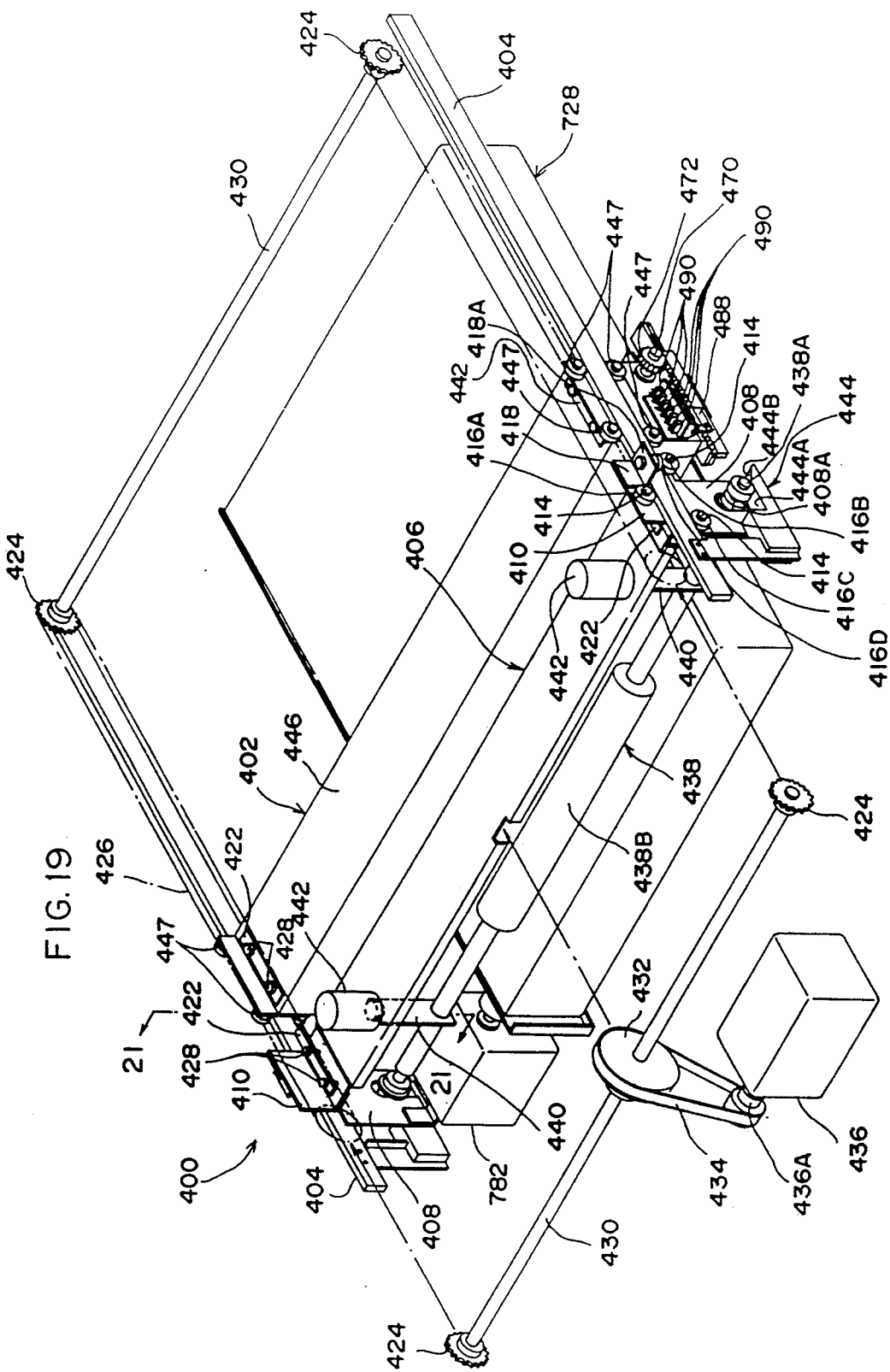
FIG. 19 is a perspective view of an exposure portion.

As shown in FIG. 19, an exposure portion 400 disposed upwardly of the platen portion 300 is provided with a pair of rails 404 disposed so that its longitudinal direction may coincide with the crosswise direction of the photosensitive material 14. These rails 404 lie outside of the end portion of the platen 302 as viewed in the longitudinal direction.

A supporting plate 406 is suspended over the rails 404. The supporting plate 405 is curved at a substantially right angle to form a tripod plate 408 so that its both end portions, as viewed in the longitudinal direction, may downwardly run parallel to each other. Further, at the curved proximal portion of this tripod plate 408, a bracket 410 is fixed curved in a substantially L-shaped form in the direction opposite to the curved direction of the tripod plate 408.

Three rollers 416A to C are each supported via a shaft 414 on the outer surface of the tripod plate 408 and the bracket 410. (two rollers 416B and C for the tripod plate 408 and a single roller 416A for the bracket 410) These rollers 416A to C pinch the above-described rails 404. As a result, the supporting plate 406 can travel in the longitudinal direction of the rail 404. Incidentally, although three rollers 416A to C are disposed on this embodiment, the number of the rollers is not necessarily restricted to three.

In addition, adjacent to the roller 416A, a bracket 418 is mounted to the bracket 410. The lower end portion of this bracket 418 is curved at a right angle outwardly of the tripod plate 408 to form an extension portion 418A, against which a roller 416D is supported via a shaft 420 (see FIG. 20) on this extension portion 418A to contact the outside of the rail 404. As a result, the supporting plate 406 is supported against the rail 404 from three sides and smoothly slides without rattling as it travels along the rail 404.

At the supporting plate 406, coupling brackets 422 are each mounted to the inside of the tripod plates 408. This coupling bracket 422 is fixed to part of an endless chain 426 wound about a pair of sprockets 424 via a screw 428. The sprockets 424 are each disposed adjacent to their both end portions, as viewed in the longitudinal direction. As a result, the supporting plate 406 can receive a driving force for traveling in the longitudinal direction of the rail 404 by rotation of the sprockets 424.

The sprockets 414 disposed at each end portion, as viewed in the longitudinal direction of the rail 404 are each fixed to both end portions of a single shaft 430, as viewed in the longitudinal direction, and a wheel 432 is mounted at the intermediate portion of the shaft 430 disposed in front of the sprocket, as viewed in its axial direction in FIG. 19. A belt 434 is wound about this wheel 432. This belt 434 is also wound about the rotating shaft 436 of the motor 436 fixed to the apparatus 10. When the motor 436 is driven, the shaft 430 is rotated to transmit a driving force to the sprockets 424. In addition, the rotating shaft 436A of the motor 436 is rotated in the clockwise as well as counterclockwise direction. This rotation of the motor 436 in both senses causes the supporting plate 406 to reciprocate along the rail 404 between the original position, which lies at this side of the apparatus and the innermost side of the same.

Elongated holes 408A are each formed at the tripod plates 408. Both end portions of the rotating shaft 438A of a squeeze roller 438 are each inserted into the elongated holes 408A. The intermediate portion of the squeeze roller 438 is covered with a felt-like soft member 438B and is moved on the platen 302 rotated by its own weight as the supporting plate 406 travels.

Figure 21:
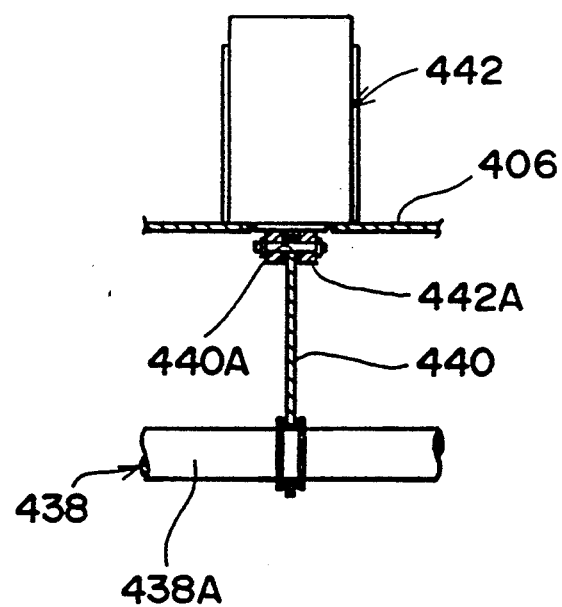
FIG. 21 is a cross-sectional view taken along line 21—21 of FIG. 19.
Figure 21:
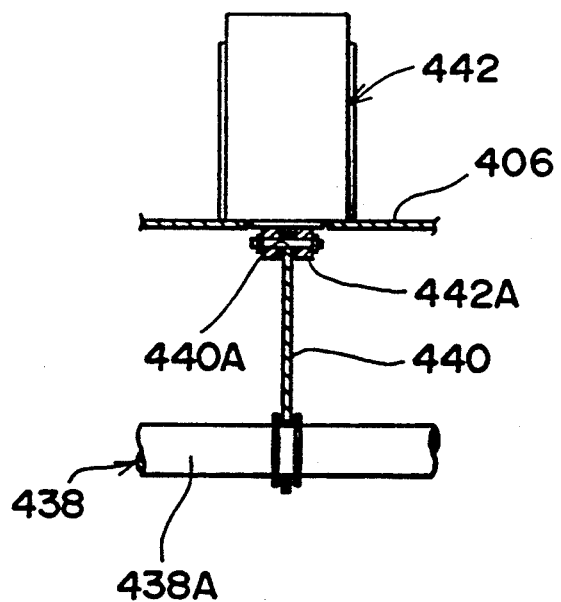

As also shown in FIG. 21, two points of the squeeze roller 438, which lie at equal intervals from the center position thereof, as viewed in its axial direction, toward its both end portions, are supported by one end of a suspension bracket 440. The other end portion of the suspension bracket 440 extends toward the supporting plate 406. A hole 440A is provided at the other end portion of the suspension bracket 440, which in turn is fixed via a screw to an actuator 442A of a solenoid 442 disposed on the supporting plate 406. When activated, the solenoid draws in the actuator 442A with the result that the squeeze roller 438 is pulled up via the suspension bracket 440 to create a gap between the former and the platen 302. Incidentally, in this embodiment, pulling up of the squeeze roller 436 by the solenoid 442 is conducted while the supporting plate 406 is returning rather than while advancing.

Figure 20:
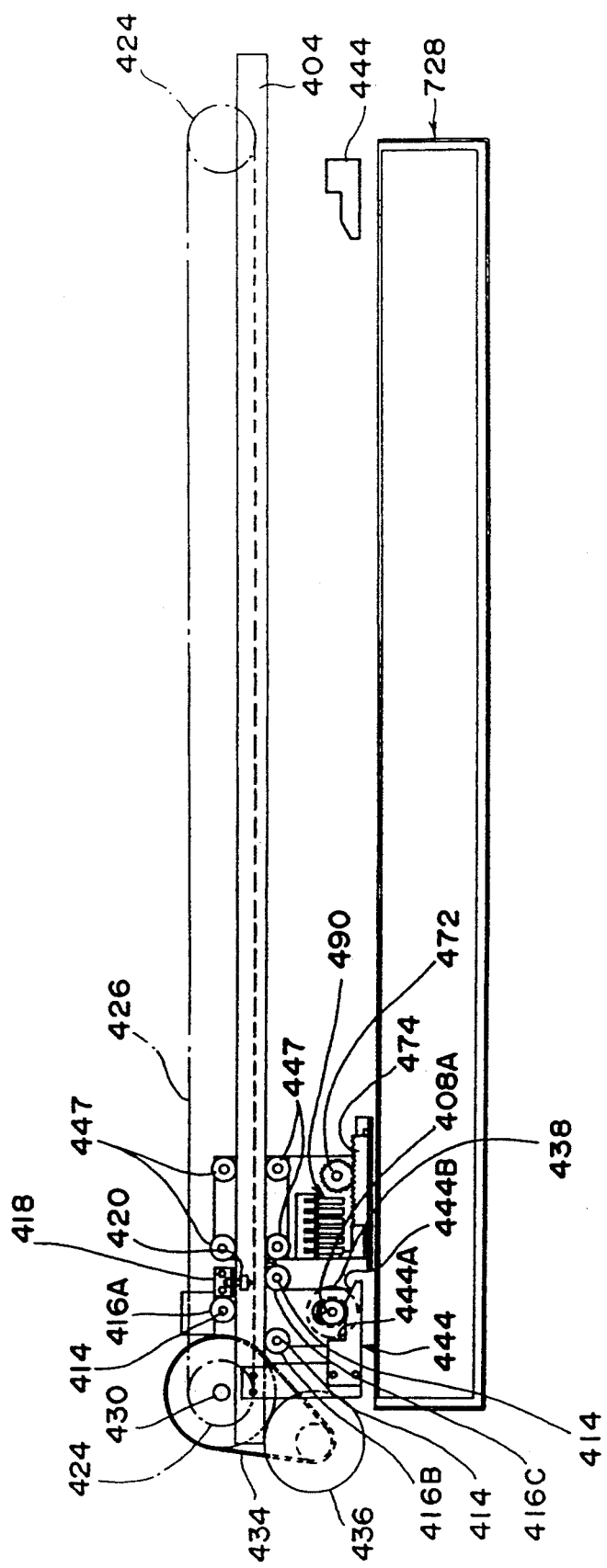
FIG. 20 is a right side lateral of an exposure portion.

As shown in FIG. 20, corresponding to both end portions of the rail 404, as viewed in the longitudinal direction, a cam bracket 444 is each mounted so as to interfere with the traveling path of the squeeze roller 438. At this cam bracket 444, a high portion 444A is formed so as to provide a gap between the squeeze roller 438 and the platen 302, and a slanted surface portion 444B runs continuously from the height position of the platen 302 up to this high portion 444A. In consequence, when the supporting plate 406 lies at the original position, even if the solenoid 442 is not activated, the gap is formed therebetween. In addition, also at the folding point at the innermost side of the apparatus, the squeeze roller 438 may climb up the cam bracket 444.

As shown in FIG. 19, the supporting plate 406 and a casing 446, which forms a light source unit 402, are each independently fixed to the chain 426 by means of a screw 428. In consequence, the light source unit 402 and the supporting plate 406 reciprocate on the platen 302 along the rails 404. The box-shaped casing 446, which constitutes the light source unit 402, may be fixed to one end portion of the supporting plate 406, as viewed in the crosswise direction, via a connecting member so as to be supported against the rails 404 by means of four rollers 447.

As shown in FIG. 22, a fluorescent lamp 448, which serves as the light source, is disposed within the casing 446 to be suspended over to a pair of sockets 450 fixed to the lower end surface of the casing 446. A slit hole 446A is provided on the lower end surface of the casing 446 and corresponding thereto, a shutter 452 is mounted at the casing 446. Disposed at the upper portion of the slit hole 446A is a lens 446B (for example, SELFOC lens), at which one side a bracket 447A is fixed and at the opposite side a resin plate 449 is fixed pressed via a bracket 447A and a screw 451A. The brackets 447A and 447B are fixed to the casing 446 by means of screws 451B and 451C.

Figure 23:
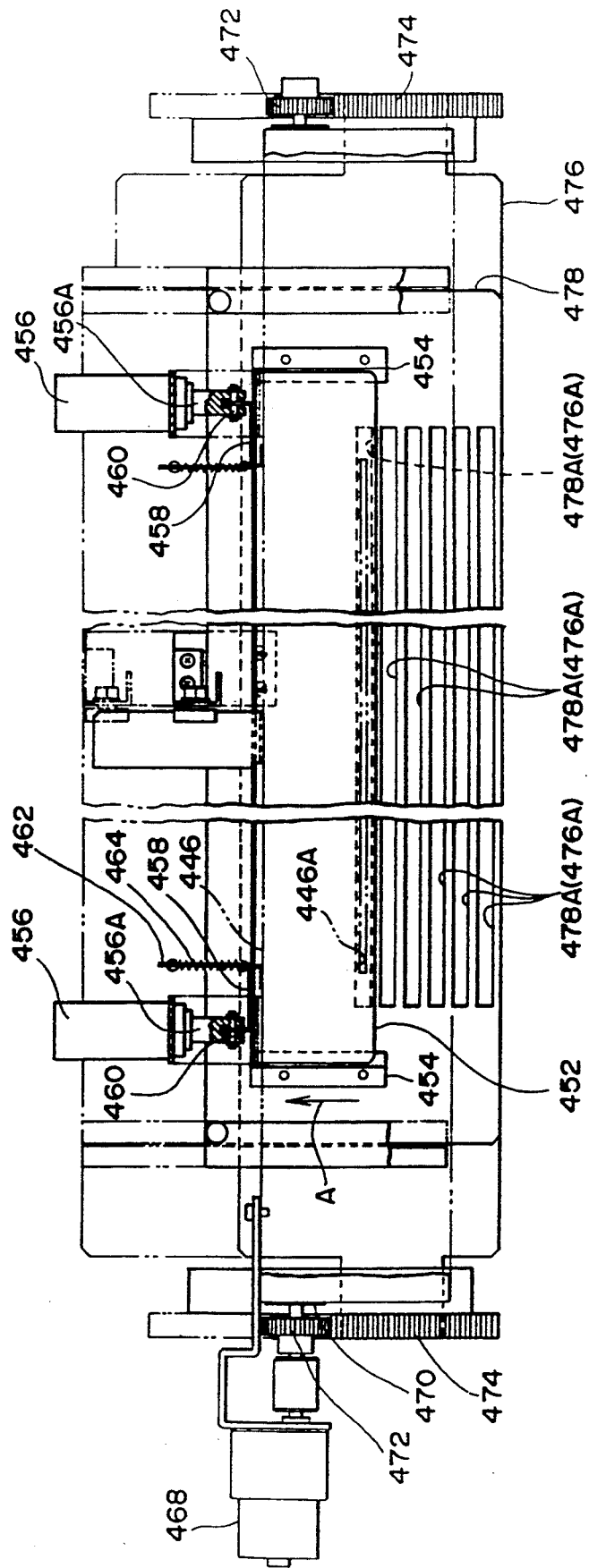
FIG. 23 is a plan view of a light source unit.

The shutter 452 is moved in the crosswise direction by means of guide rails 454. As shown in FIG. 23, one end portion of the shutter 452, as viewed in the crosswise direction, is curved at a substantially right angle and a bracket 458 is mounted there to be connected to the actuator 456A of the solenoid 456 via a shaft 460. In this case, when the solenoid is electrically conducting, the actuator 456A is drawn in to shift the shutter 452 in the crosswise direction (in the direction of arrow A of FIG. 239 to open the slit hole 446A.

In addition, a bracket 462 is mounted at the above-described yielded portion of the shutter 452 and one end of a tensile coil spring 464 is anchored thereto. The other end of this tensile coil spring 464 is anchored to the casing 446. As a result, when the solenoid 456 is not activated, the actuator 456A is drawn out by a force energized by the tensile coil spring 464 to close the slit hole 446A with the shutter 452.

A motor 468 is mounted on one of the lateral surfaces of the casing 446. A driving shaft 470 is coaxially mounted to the rotating shaft of the motor 467. The driving shaft 470 passes through both lateral surfaces of the casing 446. At the driving shaft portions outside of the lateral surface of the casing 446, gears 472 are each attached so as to mate with each tooth portion formed on the upper surface of the pair of racks 474. When the motor 468 is driven, the rack 474 is moved in the crosswise direction of the slit hole 446A via the gear 472.

The pair of racks 474 is fixed to both end portions of a filter supporting plate 476. The neighborhood of both end portions of the filter supporting plate 476 is contained within a groove portion 484A of a plate 484 mounted to the casing 446. Mounted to the plate 484 is a fixed plate 486 having a groove portion corresponding to this groove portion 484A so as to pinch the filter supporting plate 476. As a result, the filter supporting plate 476 can be moved in the longitudinal direction of the groove portion 484A, that is, in the crosswise direction of the filter supporting plate 476 relative to the casing 446. A plate 482 is mounted on the upper surface of the filter supporting plate 476 to fix both end portions of a filter sheet 476 as viewed in the longitudinal direction. Six slit holes 476A are provided at the filter sheet 478 and a filter 4870 is adhered to each slit hole 478A.

In this embodiment, six colors are allocated on the filter 480 in a long and narrow form along the slit hole 446A and are selectively used depending on whether the photosensitive material is of negative type or positive type. In other words, a R (red) filter is used for the negative and positive (green) filter and a B (blue) filter for each of the negative and positive and a BK (black) filter exclusively used for the negative are disposed side by side. In consequence, a single filter sheet 478 includes the filters for the negative and positive thus eliminating a need to exchange filters for the different photosensitive materials (negative or positive).

A screen plate 488 moved along with the filter supporting plate 476 is mounted on one lateral surface of the rack 474 of the filter supporting plate 476. In addition, at the side of the casing 446, six photoelectric sensors 490 are disposed corresponding to a locus described as the screen plate 488 moves. (see FIG. 19)

When the filter supporting plate 476 moves relative to the casing 446, the screen plate 488 correspondingly sequentially passes through the light emitting portion and the light receiving portion of the six photoelectric sensors 490. These photoelectric sensors 490 are each connected to the control unit 800.

The interval between the six sensors 490 is set to coincide with that between the filters 480 adhered to the filter supporting plate 476. As a result, a signal from either one of the six photoelectric sensors 490 may be selected to control driving of the motor to thereby make the selected filter 480 correspond to the slit hole 446A.

(5) Photosensitive material transfer portion 500

Figure 24:
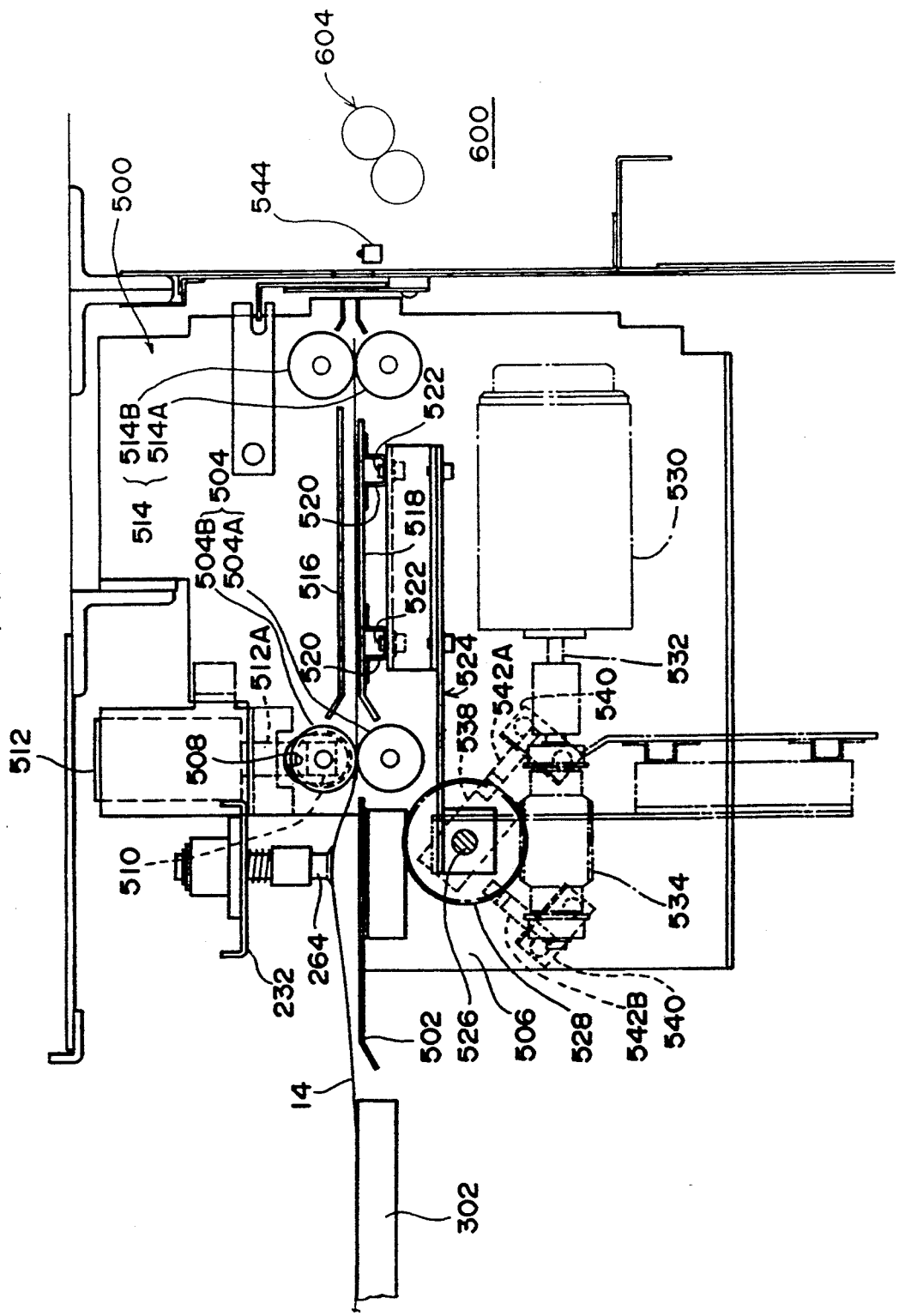
FIG. 24 is an enlarged view of a photosensitive material transfer portion.

As shown in FIG. 24, the photosensitive material 14 subjected to the exposure treatment on the platen 302 is sucked to the sucker 264 of the photosensitive material feeding portion 200 to be fed to the photosensitive material transfer portion 500. That is, a guide plate 502 is disposed at the photosensitive material transfer portion 500 adjacent to the platen 302, and the sucker 264, guided by the rails 210, feeds the photosensitive material 14 onto this guide plate 502.

Disposed downstream of the guide plate 502 is a pair of rollers 504. One of the pair of rollers 504 is chosen as a driving roller 504A, which is rotated at a speed of V (V is constant) by a motor (not shown), and the photosensitive material 14 is pinched between the same and the other driven roller 504B to apply a feeding force to the photosensitive material 14.

The shaft of the driven roller 504B is accommodated with the elongated hole 508 formed on the lateral plate 506 of the transfer portion 500 so that it may move in the directions coming in contact with and moving away from the driving roller 504A respectively. In addition, the end portions of a tensile coil spring (omitted) are each engaged to the rotating shaft of the driving roller 504A and the driven roller 504B and are energized in the direction in which they contact each other by the action of the energizing force of the tensile spring.

In addition, the driven roller 504B is connected to the actuator 512A of the solenoid 512 via the suspension bracket 510. The solenoid 512 draws in the actuator 512A while electrically conducting with the result that it moves apart the driving roller 504A and the driven roller 504B against the force energized by the tensile coil spring. In this state, the tip end portion of the photosensitive material 14, which has been fed sucked to the sucker 264, may be inserted into a gap between the driving roller 504A and the driven roller 504B.

In this embodiment, when the photosensitive material 14 is inserted into the gap, the driving roller 504A is rotated and stopped once after the photosensitive material has been inserted. As a result, even if the tip end portion of the photosensitive material 14 is more or less curled, it may be guided into the gap by the rotating force of the driving roller 504A, and so an abrupt feeding of the photosensitive material 14 can be prevented when electrical conduction of the solenoid is stopped.

When the photosensitive material 14 is pinched by the pair of rollers 504, suction of the photosensitive material by the sucker 264 is released and the transfer members 202 including the sucker 264 may be returned to its original position guided by the rails 210.

A pair of rollers 514 is further disposed downstream of the pair of rollers 504. This pair of rollers 514 also consists of a driving roller 514A rotated by the driving force of a motor (not shown) and a driven roller 514B rotated through contact with this driving roller 514A. In this case, the rotating speed of the driving roller 514A can be changed in three stages, its maximum speed being the same as that of the driving roller 514 (V) and the other two speeds being set to those (Vfilm, Vpaper) slower than V. In this case, Vfilm corresponds to the feeding speed at the processor portion 600 when the photosensitive material 14 is a film while Vpaper is set to correspond to the feeding speed at the processor portion 600 when the photosensitive material is paper.

An upper guide plate 516 and a lower guide plate 518 each guide the head and tail surfaces of the photosensitive material 14 and are disposed between the pair of rollers 504 and the pair of rollers 514. A gap is provided between the upper guide plate 516 and the lower guide plate 518 so that the photosensitive material may be fed therebetween.

The upper guide plate 516 is fixed to the lateral plate 506. The lower guide plate 518 is mounted to a swing base 524 by a screw via a hat type bracket 20. The swing base 524 extends in the direction of the guide plate 502 in parallel to the lower guide plate 518 to be mounted to the rotating shaft 526 supported against the lateral plate 506.

A bevel gear 528 is fixed to the rotating shaft 526. This bevel gear 528 mates with a worm gear 534 mounted to the rotating shaft 532 of the motor 530. The motor 530 has a self-braking function and, even when it is not supplied with electric power, the worm gear 534 is not rotated.

In this case, the lower guide plate 518 is supported against the rotating shaft 526 via the swing base 524, but since the bevel gear 528 fixed to the rotating shaft 526 mates with the worm gear 534, in a self braking fashion the lower guide plate 518 will not be caused to rotate by its own weight with the rotating shaft 526 as its axis.

A screen plate 538, which extends in the radial direction of the rotating shaft 526, is mounted to the rotating shaft 526 and, corresponding to the motion locus described by this screen plate 538, two photoelectric sensors 542A and 542B are mounted on the lateral plate 506 via the bracket 540. The photoelectric sensors 542A and 542B are each connected to the control unit 800. The photoelectric sensors 542A and 542B are each provided with a light emitting portion and a light receiving portion and the above-described screen plate 538 enters a space formed therebetween.

The photoelectric sensor 542A is disposed at a position at which the space between the light emitting portion and the light receiving portion is screened by the screen plate 538 as the lower guide plate 518 lies in the horizontal plane (indicated by the solid line of FIG. 24) while the photoelectric sensor 542B is disposed at a position at which the space between the light emitting portion and the light receiving portion is screened by the screening plate 538 as the lower guide plate 518 lies in the vertical plane (indicated by the imaginary line of FIG. 24). As a result, the control unit 800 may control driving of the motor 530 in accordance with the signal emitted from the photoelectric sensors 542A to B so that the lower guide plate 518 may be positioned to the above-described horizontal and vertical positions.

Disposed further downstream of the pair of rollers 514 is a photoelectric sensor 544 at the lower side of the feeding passageway of the photosensitive material 14. This photoelectric sensor 544 is connected to the control unit 800. It changes its output signal depending on whether the photosensitive material is present or not at the site where it is disposed. The control unit 800 may sense the tip end portion and rear end portion of the photosensitive material 14 based on the output from the photoelectric sensor 544.

The control unit 800 may rotate the downstream pair of rollers 514 at the same speed as that of the upstream pair of rollers 504 as the photosensitive material 14 pinched by the upstream pair of rollers 504 is fed. Consequently, the photosensitive material 14, pinched by those pairs of rollers 504 and 514, is conveyed with a predetermined tension. In this case, when the tip end portion of the photosensitive material 14 is sensed by the photoelectric sensor 544, the rotating speed of the downstream pair of rollers 514 is slowed down to Vfilm or Vpaper depending on the kind of the photosensitive material 14. At the same time or slightly earlier than that, the motor 530 is driven so that the lower guide plate 518 may be rotated in the direction of vertical position. As a result, loosening of the photosensitive material 14, which is caused by a difference of the feeding speeds at the upstream and downstream pairs of rollers 504 and 515, can take place in the lower space while the lower guide plate 518 has been pivoted away from this area.

In addition, disposed at the lowermost portion of this lower space is a tray 546. (see FIG. 2) When the photosensitive material 14 is fed by the upstream pair of rollers 504 and its rear end portion is let off the upstream pair of rollers 504, it is accommodated into the tray 546.

(6) Processor portion 600

Figure 25:
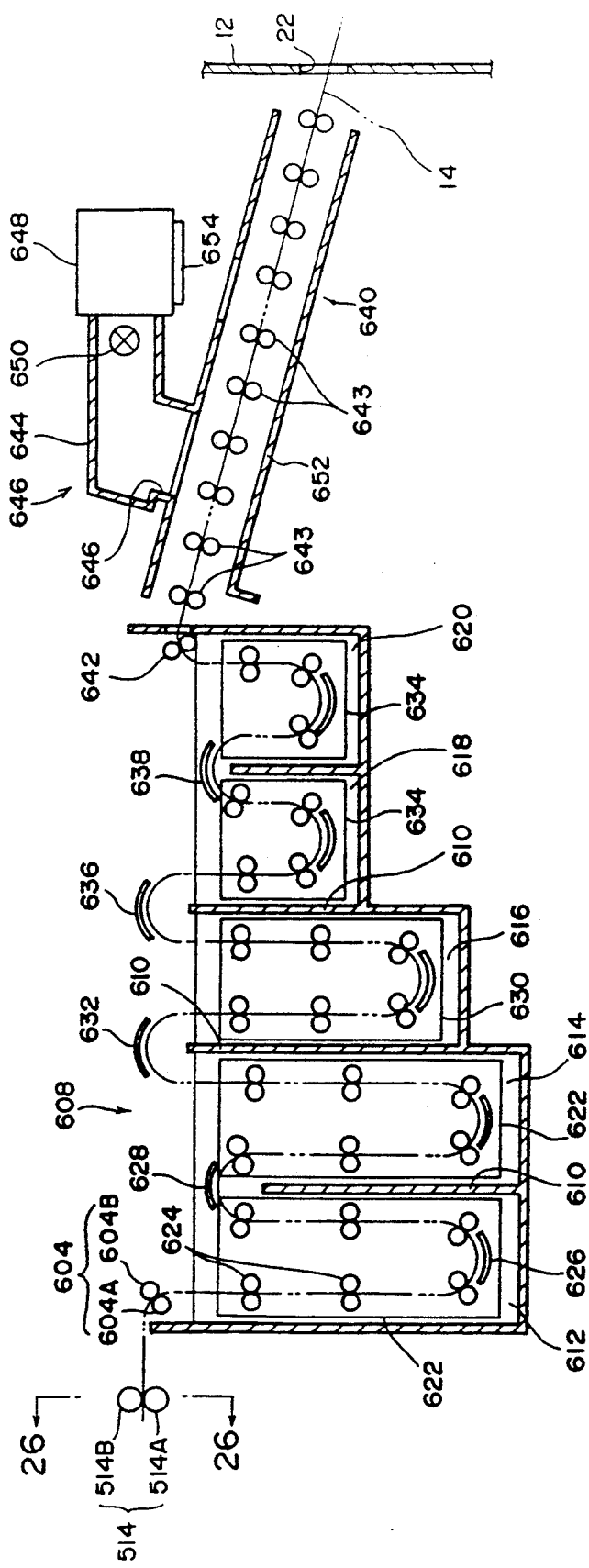
FIG. 25 is a schematic view of a processor portion.

As shown in FIG. 25, the photosensitive material 14 is fed at a predetermined speed, pinched by the downstream pair of rollers 514 of the photosensitive material feeder portion 500, to be pinched by a pair of rollers 604 disposed at the inlet of the processor portion 600. Of this pair of rollers 604, one roller is a driving roller 604A rotated by the driving force of a motor (not shown) and the other is a driven roller 604B rotated through the driving force from this driving roller 604A. The rotating speed of the driving roller 604A is set to approximately coincide with the rotating speed (Vfilm or Vpaper) as the downstream pair of rollers 514 is rotated at a slower speed.

Figure 26:
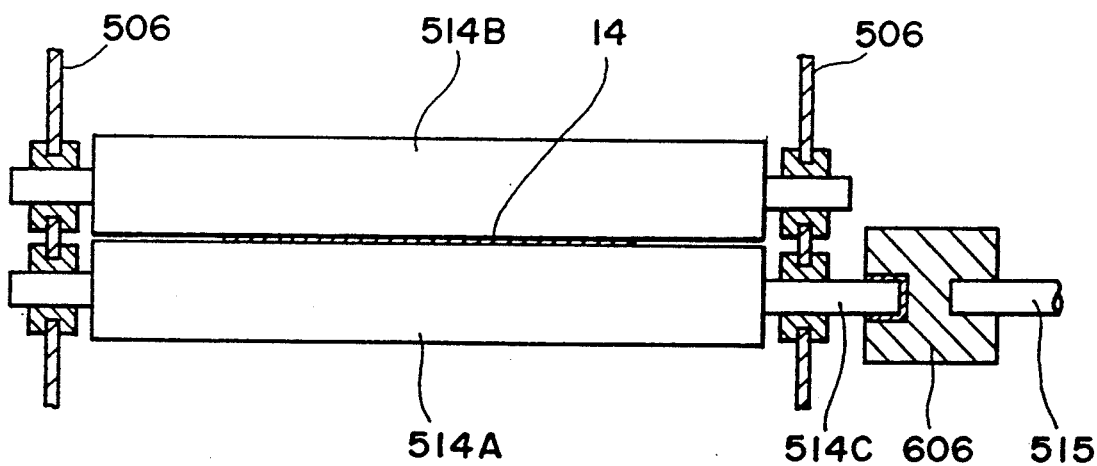
FIG. 26 is a cross-sectional view taken along line 26—26 of FIG. 25.

In this case, as shown in FIG. 26, a one-way clutch 606 is interposed between the rotating shaft 514C of the driving roller 519A of the downstream pair 514 and the rotating shaft 515 of the motor so that when the outer circumference of the roller is rotated at a slower speed than the rotating speed of the motor it may be relatively rotated between the roller and the rotating shaft. Therefore, in this embodiment, the rotating speed of the pair 604 at the side of the processor portion 600 is rotated slightly slower than the rotating speed of the downstream pair 514 so that the photosensitive material 14 may be fed with a predetermined degree of tension.

A treating tank 608 is disposed at the processor portion 600. The treating tank 608 is divided into developing tanks 612 and 614, a bleaching/fixing tank 616 and rinsing tanks 618 and 620 along the feeding passageway of the photosensitive material 14 by means of partitioning plates 610. A developing solution, bleaching/fixing solution and a rinsing water are each stored within each treating tank 608. In addition, the top of partitioning plate 610 between the developing tanks 612 and 614 is lower than the surface level of the developing solution and the top of partitioning plate 610 is also lower than the surface level of the rinsing water between the rinsing tanks 618 and 620. A treating rack 622 is immersed within the developing tank 612. This treating rack 622 is provided with a plurality of pairs of rollers 624 and a guide plate 626 to form a feeding passageway of the photosenstive material 14. After the tip end portion of the photosensitive material 14, which comes along fed by the pair of rollers 604, is passed over, it is pinched by the pair of rollers 624 and is fed in a substantially U form within the developing tank 612, guided by the guide plate 626.

Meanwhile, a treating rack 622 of the identical form is also disposed at the adjacent developing tank 614. An arcuate guide plate 628 which protrudes in the upward direction is disposed upwardly of the partitioning plate 610 between the developing tanks 612 and 614, and by virtue of this guide plate 628, the photosensitive material 14 is passed over to be fed in a substantially U-form. Incidentally, the photosensitive material 14 is passed developing solution from the developing tank 612 into the developing tank 614 while remaining in the developing solution.

A treating rack 630 is disposed at the bleaching/fixing tank 616 to guide and feed the photosensitive material 14 in a substantially U-form within the bleaching/fixing tank 616. An arcuate guide plate 632 which protrudes upwardly is disposed upwardly of the partitioning plate 610 between the developing tank 614 and the bleaching/fixing tank 616 and, guided by this guide plate 632, the photosensitive material 14 is passed over to the treating rack 630 of the bleaching/fixing tank 616. Incidentally, the photosensitive material is passed over the surface level of the developing solution during this transfer and the bleaching/fixing solution.

Treating racks 634 of identical form are each disposed at the rinsing tanks 618 and 620. An arcuate guide plate 636 which protrudes in the upward direction is disposed upwardly of the partitioning plate 610 between the bleaching/fixing tank 616 and the rinsing tank 618 and, guided by this guide plate 636, the photosensitive material 14 is passed over to the treating rack 634 of the rinsing tank 618. This guide plate 636 is disposed upwardly of the surface level of the bleaching/fixing solution and the rinsing water.

In addition, an arcuate guide plate 638 which protrudes in the upward direction is disposed upwardly of the partitioning plate 610 between the rinsing tanks 618 and 620, this guide plate 638 being disposed within the rinsing water. As a result, the photosensitive material 14 is passed from the treating rack 634 of the rinsing tank 618 to the treating rack 634 of the rinsing tank 620 while remaining in the rinsing water.

The photosensitive material discharged from the rinsing tank 620 is pinched by a pair of rollers 642 disposed at a drying portion 640 to be passed over to a plurality of pairs of rollers 643 for feeding. At this drying portion 640, a duct 644 is provided upwardly of the pair of rollers 642. A port portion 646 of this duct 644 is directed toward the pairs of rollers 643. A fan 648 is attached to the proximal portion of the duct 644. The fan 648 feeds air under pressure into the duct 644. A heater 650 is mounted between the fan 648 and the port portion 646 within the duct 644. The air fed out by the above-described fan 648 is heated by the heater 650 and blown out of the port portion 646. This hot air is to the photosensitive material 154 fed pinched by the pair of rollers 643 to dry the photosensitive material 14.

A guide plate 652 is disposed downwardly of the pairs of rollers 643 to guide the hot air to the rear surface of the photosensitive material 14 while recycling it by guiding it in the direction of a suction hole 654 of the fan 648.

The photosensitive material 14 discharged from the drying portion 640 is withdrawn from the delivery hole 22 provided at the casing 12.

As shown in FIG. 27, the upper portion of the processor portion 600 is screened from the external environment by means of a ceiling member 602. This ceiling member 602 can be removed during maintenance and is removed with a large cover 24 of the casing 12 open. (see FIG. 1)

(7) Film charger portion 700

As shown in FIG. 27, the inner portion of the large cover 24, that is, the upper portion of the ceiling member 602 of the processor portion 600 is intended for serving as the film charger portion 700 for charging and exchanging the original 16.

Guide shafts 718 running parallel to each other are mounted on the lateral surfaces of this side and innermost side of the apparatus 10 via the bracket 716. These guide shafts 718 are disposed so as to coaxially run with a pair of guide shafts 720 provided at the exposure portion, with the large cover 24 closed.

Figure 28:
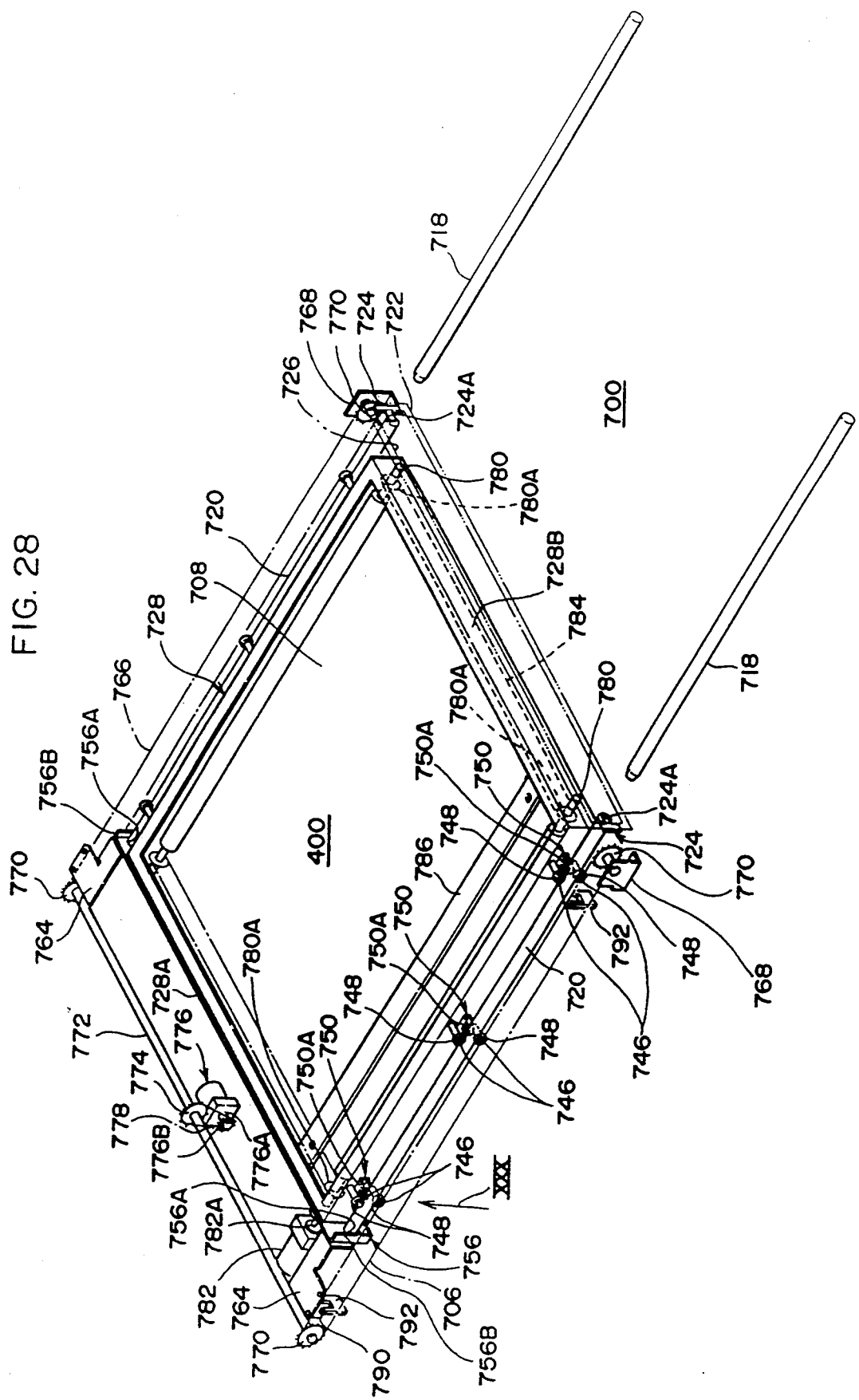
FIG. 28 is a perspective view of a film charging portion.

As shown in FIG. 28, a lateral plate 722, which serves as the partitioning plate, is provided between the exposure portion 400 and the film charger portion 700. One end of the guide shaft 720 at the side of the exposure portion 400 is fixed to the lateral plate 722 via the bracket 724. This bracket 724 is provided with a tongue piece 724A having an arcuate surface of substantially the same diameter as that of the outer circumference of the guide shaft 720 at its end, and the guide shaft 720 is fixed to this tongue piece 724A. The other end portion of the guide shaft 72 is fixed to a bracket (not shown) fixed to the apparatus 10.

A rectangular hole 726 which serves as a through hole is provided at the lateral plate, communicating the exposure portion 400 with the film charging portion 700. This rectangular hole 726 serves as a passageway for communicating with the supporting base 728 in which the original is charged.

Figure 29:
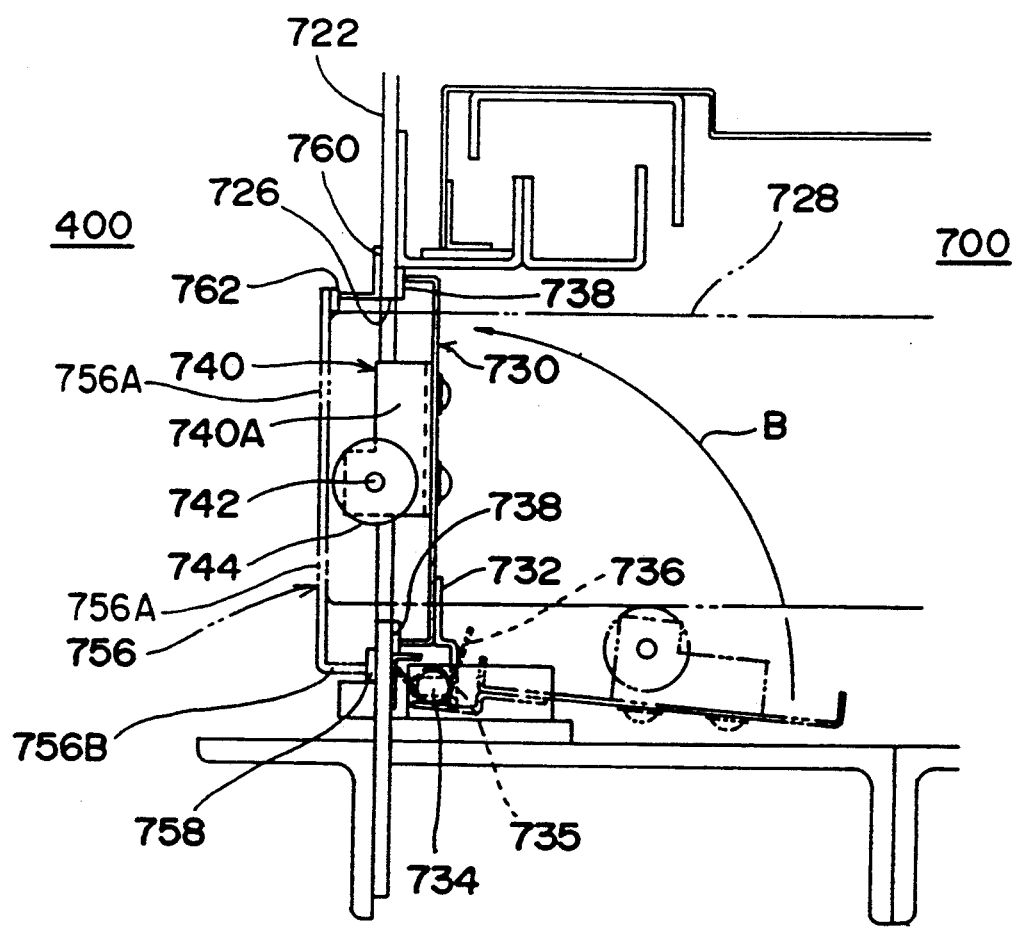
FIG. 29 is a schematic view illustrating a boundary portion between the film charging portion and the exposure portion.

As shown in FIG. 29, a cover member 730 for closing the hole 726 is disposed at the side of the film charging portion 700 of the lateral plate 722 formed with the hole 726. The cover member 730 is dish-shaped and the dish-shaped inside is opposed to the rectangular hole 726. One end portion of the bracket 732 is fixed to the rear portion of the cover member 730. The other end of bracket 732 is fixed to a shaft 734 provided underneath the hole 732 in the longitudinal direction of the hole 726 by means of a screw 735. A torsion coil spring 736 is mounted to the shaft 734, and one end of the spring 736 is anchored to the bracket 732 while its other end is anchored to the lateral plate 722 under the rectangular hole 726. As a result, the cover member 730 is biased in the direction closing the hole 726 (in the direction of arrow B of FIG. 29) by the spring 736. A felt-like light screening member 738 is adhered about the hole 726 where the dish-shaped peripheral edge portion of the cover member 730 abuts thereto. The light screening member 738 blocks entry of the light from the film charging portion 700 into the exposure portion 400 when the cover member 730 is closed.

A bracket 740 having a substantially U-shaped cross section is mounted on the bottom surface of the inside of the cover member 730 and a shaft 742 is suspended between tripod plates 740A of the bracket 740 running parallel to each other. A roller 744 is supported against this shaft 742.

As shown in FIG. 28, the supporting base 728 is framed and a pair of shafts 746 are each mounted at three points on its outer lateral surface opposed to the guide shaft 720. The pairs of shafts 746 are each disposed at intervals, as viewed in the vertical direction, each supporting rollers 748. The circumferential surface of these rollers is arranged to abut the upper surface and lower surface of the outer periphery of the guide shaft 718 or 720.

Figure 30:
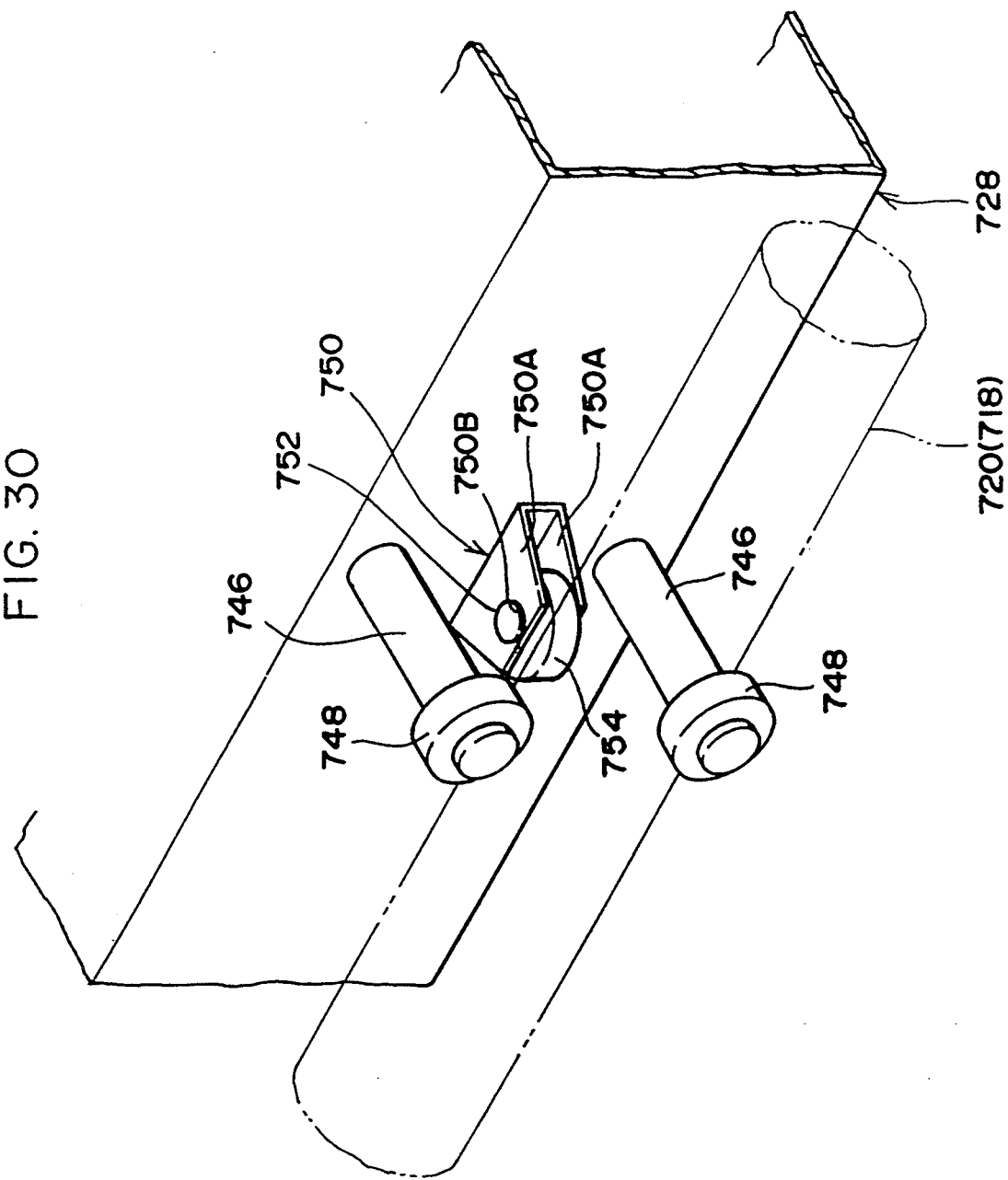
FIG. 30 is an enlarged view taken along line 30—30 of FIG. 28.

In addition, as shown in FIG. 30, a bracket 750 is disposed between the pair of shafts 746. The bracket 750 is formed with tripod plates 750A running parallel to each other. Circular holes 750B are coaxially provided through each tripod plate 750A. A shaft 752 is suspended over through these circular holes 750B and a roller 754 is supported at the intermediate portion of the shaft 752. The circumferential surface of this roller 754 abuts the lateral surface of the outer circumference of the guide shaft 718 or 728. In consequence, the supporting base 728 is supported against the guide shaft 718 or 720 at six points (by three rollers 748, 754 for each one point) while being arranged to move in the axial direction of the guide shafts 718, 720.

The end portion of the guide shaft 720 is spaced apart from that of the guide shaft 718 of the large cover 718, but when the supporting base 728 is moved in the direction of the guide shaft 718, the rollers 748, 754 at its tip end side, as viewed in the moving direction, are separated from the guide shaft 720 to be supported against the guide shaft 718 of the large cover 24. In this case, even when two rollers 748, 754 are separated from the guide shaft 720, the supporting base 728 may be supported against the guide shaft 720. Therefore, while moving, the supporting base 728 is supported by the guide shaft 72 or 718 respectively at both end portions of the supporting base, as viewed in the crosswise direction while, being supported at least two or more points in the traveling direction. As a result, the supporting base 728 passes through the rectangular hole 726 to be smoothly passed over between the guide shaft 720 at the side of the exposure portion 400 and that 718 at the side of the film charging portion 700.

In this case, as shown in FIG. 29, when the supporting base 728 is shifted from the exposure portion 400 toward the film charging portion 700, the roller 744 of the cover member 730, which closes the rectangular hole 726, abuts the supporting base 728, which causes a rotating force to be applied to the cover member 730 in the direction of opening the hole 726 with the shaft as its axis. As a the result, the supporting base is further moved and the roller 744 is rolled from the lateral surface of the supporting base 728 onto its bottom surface so that the cover member 730 is rotated against the force of the torsion coil spring 738. That is, opening of the cover member 730 is automatically achieved as the supporting base 728 moves.

As shown in FIG. 29, a blocking member 756 which constitutes part of the light screening member is mounted on the extreme portion of the lateral surface of the supporting base 728, as viewed in the direction in which it moves toward the film charging portion 700. A circular hole 756A is formed at both end portions of this blocking member 756, as viewed in the longitudinal direction, through which the above-described guide shaft 720 passes.

Formed at the blocking member 756 is a flange portion 756B three edge portions of which are curved at a substantially right angle except for its upper side. This flange portion 756B is opposed to the peripheral edge portion of the rectangular hole 726, with the supporting base 728 moved to the film charging portion 700. A felt-like light screening member 758 (see FIG. 29) is adhered to the peripheral edge portion of this hole 726. The female part of a magicross (trademark) or the like may be used as this light screening member 758. In addition, a flange portion 760 curved at a substantially right angle is fixedly attached on the upper side of the hole 726, and its tip end portion may be opposed to the above-described upper piece of the blocking member 756. A light screening member 762 is adhered to the upper piece. As a result, the supporting base 728 pushes open the cover member 730 to be moved toward the film charging member 700, and when the blocking member 756 is abutting the hole 726, entrance of the light from the hole 726 into the exposure portion 400 can be prevented.

In addition, an oil seal (not shown) is interleaved between the guide shaft 70 and a circular hole 756A through which it passes so that leakage of light from this circular hole 756A may be prevented.

As shown in FIG. 28, a pair of brackets 764 is fixedly attached to the back portion of the blocking member 756 at both end portions, as viewed in the longitudinal direction. This bracket 764 extends from the upper piece of the blocking member 756 at a substantially right angle in the direction departing therefrom while its tip end portions extends in the direction departing from each other. The tip end portion of portion is anchored to part of a chain 766 via the guide shaft 720. The chain 766 is wound about a pair of sprockets 770 mounted to the body of the apparatus 10 at both end portions of the guide shaft 720, as viewed in its axial direction, via a bracket 768 (only its right side is shown in FIG. 28) to form a loop.

The sprockets 770 at this side of the apparatus 10 are each coaxially fixed to a single shaft 772 to be simultaneously driven.

A screen plate 790 which extends downwardly from the apparatus is mounted to one of the pair of brackets 764. This screen plate 790 is moved along with the supporting plate 728 and two photoelectric sensors 792 are disposed along the locus described by this traveling screen plate 790. The photoelectric sensors 792 are each mounted adjacent to both end portions of the guide rail 720, as viewed in its axial direction, so that the screen plate 790 may passes between its light emitting portion and the light receiving portion. The sensors 792 are each connected to the control unit 800. The control unit 800 controls displacement of the supporting plate 728 caused by the motor 776 based on the output signal from the sensor 792 to position the supporting plate 728 to predetermined positions of the exposure portion 400 and the film charging portion 700.

Incidentally, when the supporting plate 728 is positioned at the predetermined position of the film charging portion 700 and entrance of light from the hole 726 into the exposure portion 40 is screened by the light screening members 758, 762, locking of the small cover 704 by the locking means 705 is released. As a result, the original 16 may be charged from the hole 702 by opening the small cover 704. Otherwise, when the supporting plate 728 lies stridingly between the exposure portion 400 and the film charging portion 700, locking of the small cover 704 by the locking means 705 is not released, so that entrance of light from the hole 702 into the exposure portion 400 is prevented.

A gear 774 is fixed at the intermediate portion of the shaft 772, as viewed in its axial direction, coupled to a gear 776B mounted to the rotating shaft 776A of the motor 776 via a chain 778. In this case, when the motor 776 is driven, the shaft 772 is rotated via the chain to thereby drive a chain 766. Driving of the chain 766 causes the supporting base 728, which is fixed to part of the chain 766 via the bracket 764, to be moved in the axial direction of the guide shaft 720.

A pair of shafts 780 is suspended between the lateral surfaces 728A and 728B corresponding to both end portions of the guide shaft 720, as viewed in its axial direction. One of the shafts 780 is coupled to the rotating shaft 782A of the motor 782. Gears 780A are each fixed at the inside of the lateral surfaces 728A and 728B of the shaft 780, about which an endless chain 784 is wound so as to drive the chain 784 by driving of the motor 782. A transparent overlay sheet 708 is mounted to the chain 784. This overlay sheet 708 is substantially identical in area to the aperture of the supporting base 728 so that when the chain 784 is driven it is positioned to the lower and upper sides of the gear 780A.

Figure 31:
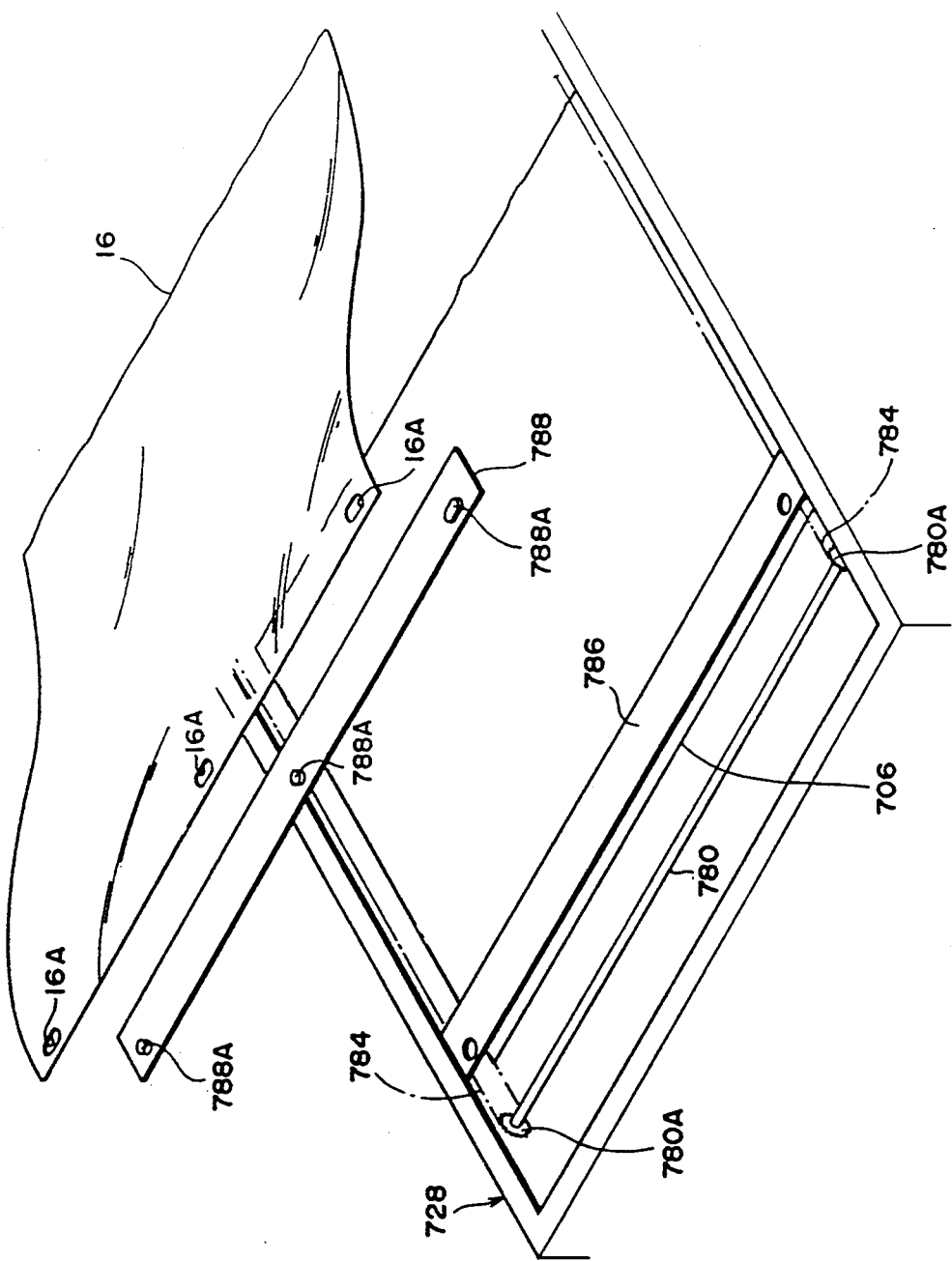
FIG. 31 is an exploded perspective view illustrating how an original is disposed on a supporting base.

In addition, mounted on the upper surface of the supporting base 728, which lies at this side of the apparatus 10, is a positioning plate 786 for positioning the original 16. As shown in FIG. 31, a sizing plate 788 made of metal is fixed to this positioning plate 786 by means of a double side adhesive tape. Three knocking pins 788A are protrudingly formed on this sizing plate 788 in the longitudinal direction of the sizing plate 788. A locking pin 788A at one end of the sizing plate 788 protrudes with an oval cross-sectional form while the other two locking pins 788A each protrude with a circular cross-sectional form. The above-described oval knocking pin 788A corresponds in shape to an elongated hole 16A provided through the original 16 while the other two 788A having an outer diameter which allows them to be readily inserted into the elongated hole 16A. In this case, the positioning plate 786 and the sizing plate 788 may be fixed to each other by a magnetic force rather than by the adhesive tape.

When the original 16 is charged, with the supporting base 728 positioned at the cop charging portion 700, the overlay sheet 708 is disposed to the underside of the gear 780A and the knocking pin 788A is inserted into the circular hole 16A of the original 16 to support the original 16 on the overlay sheet 708.

Meanwhile, when the original 16 is disposed onto the photosensitive material 14 placed on the platen 302, with the supporting base 728 disposed on the exposure portion 400, the motor 782 is driven to move the overlay sheet 708 on to the gear 780A. In this condition, the photosensitive material 14, original 16 and the overlay sheet 708 are disposed, in a layered fashion, one after another on the platen 302.

(8) Control unit 800

The control unit 800 is disposed downwardly of an intermediate base 20 of the apparatus 10, that is, downwardly of the platen portion 300.

Figure 32:
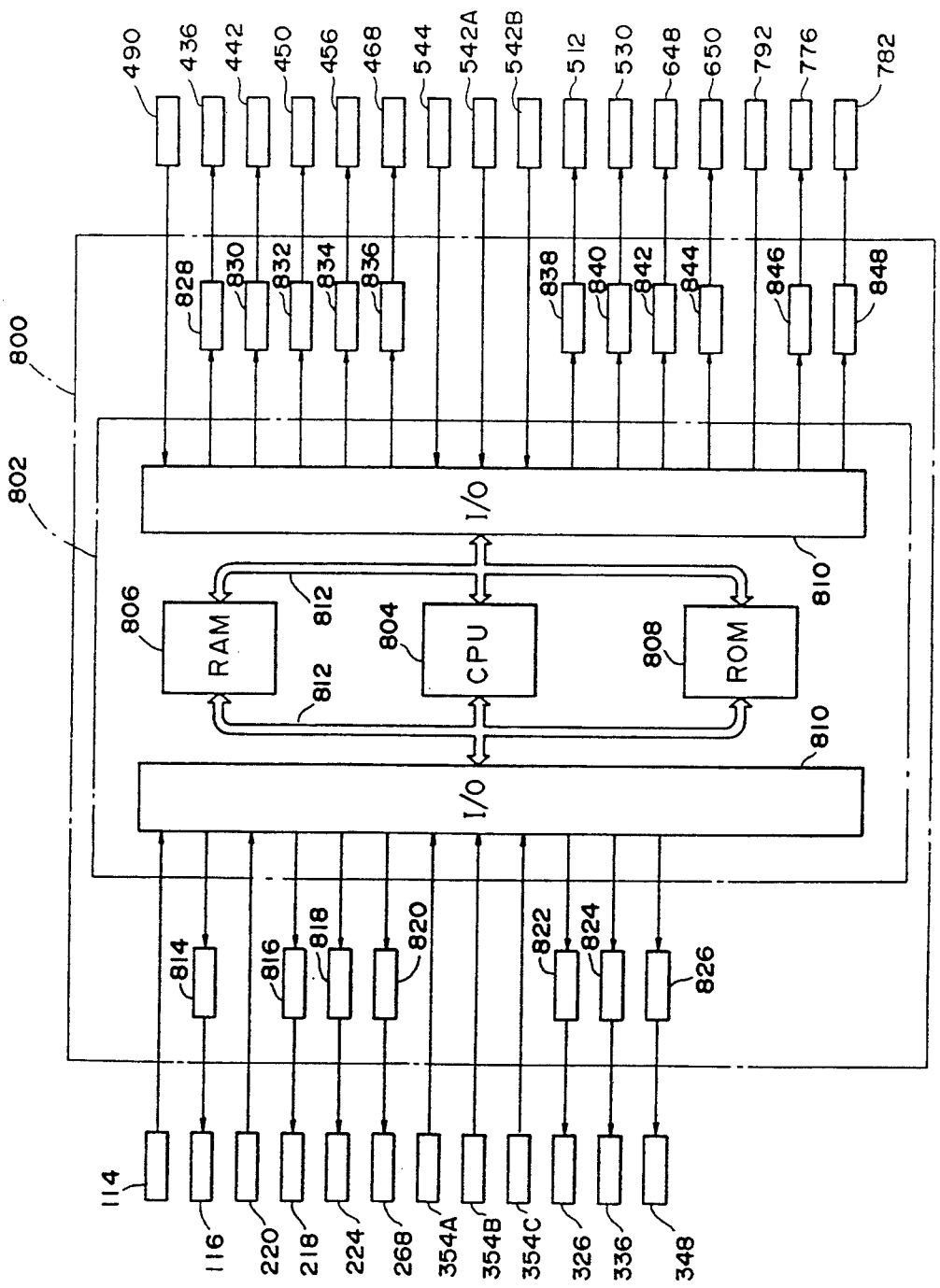
FIG. 32 is a control block diagram.
Figure 33:
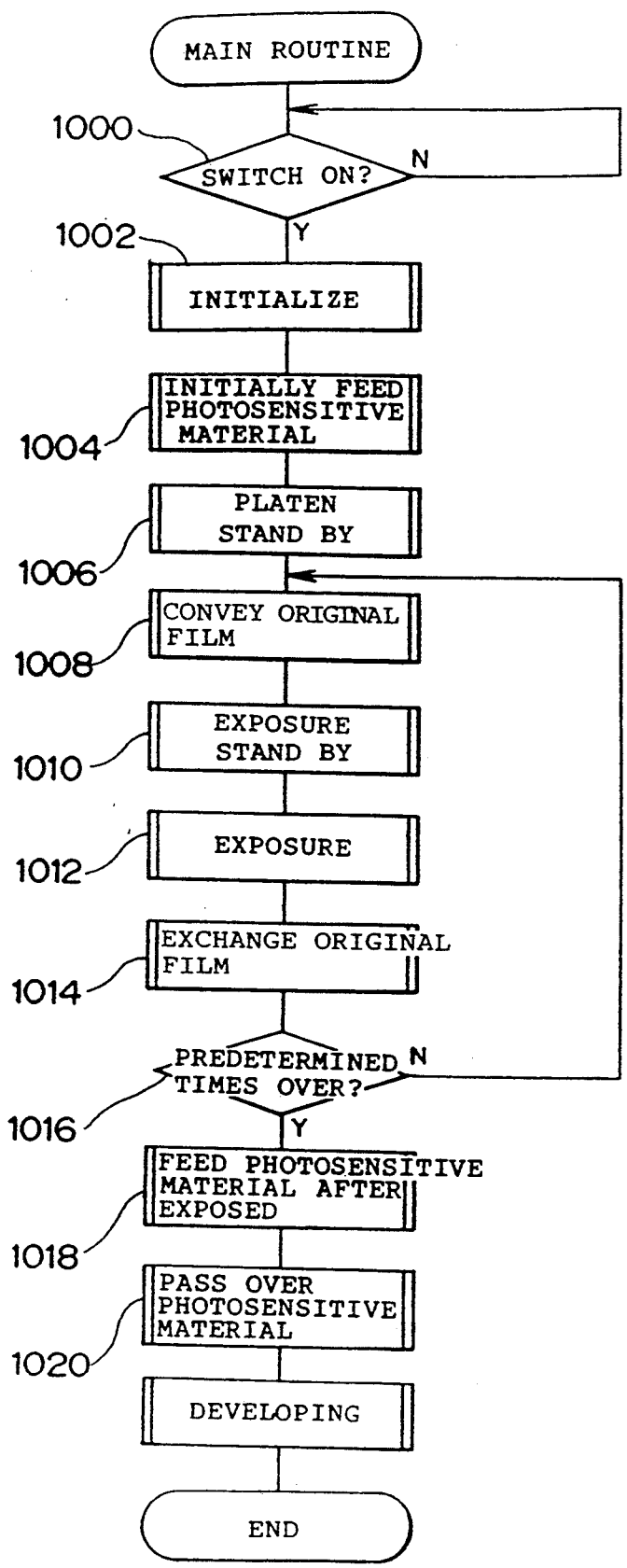
FIGS. 33 through 42 are respectively a control flowchart.
Figure 34:
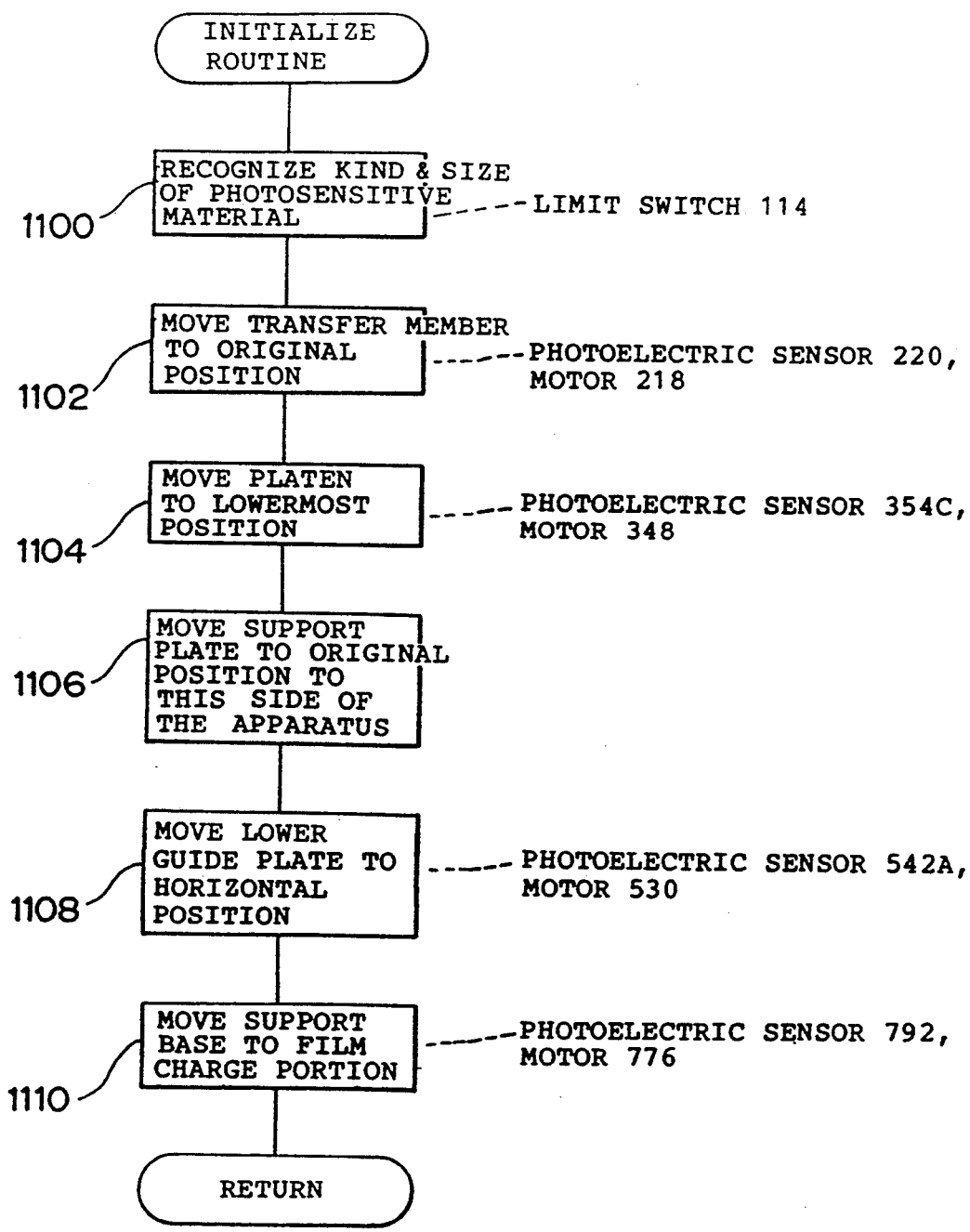
Figure 35:
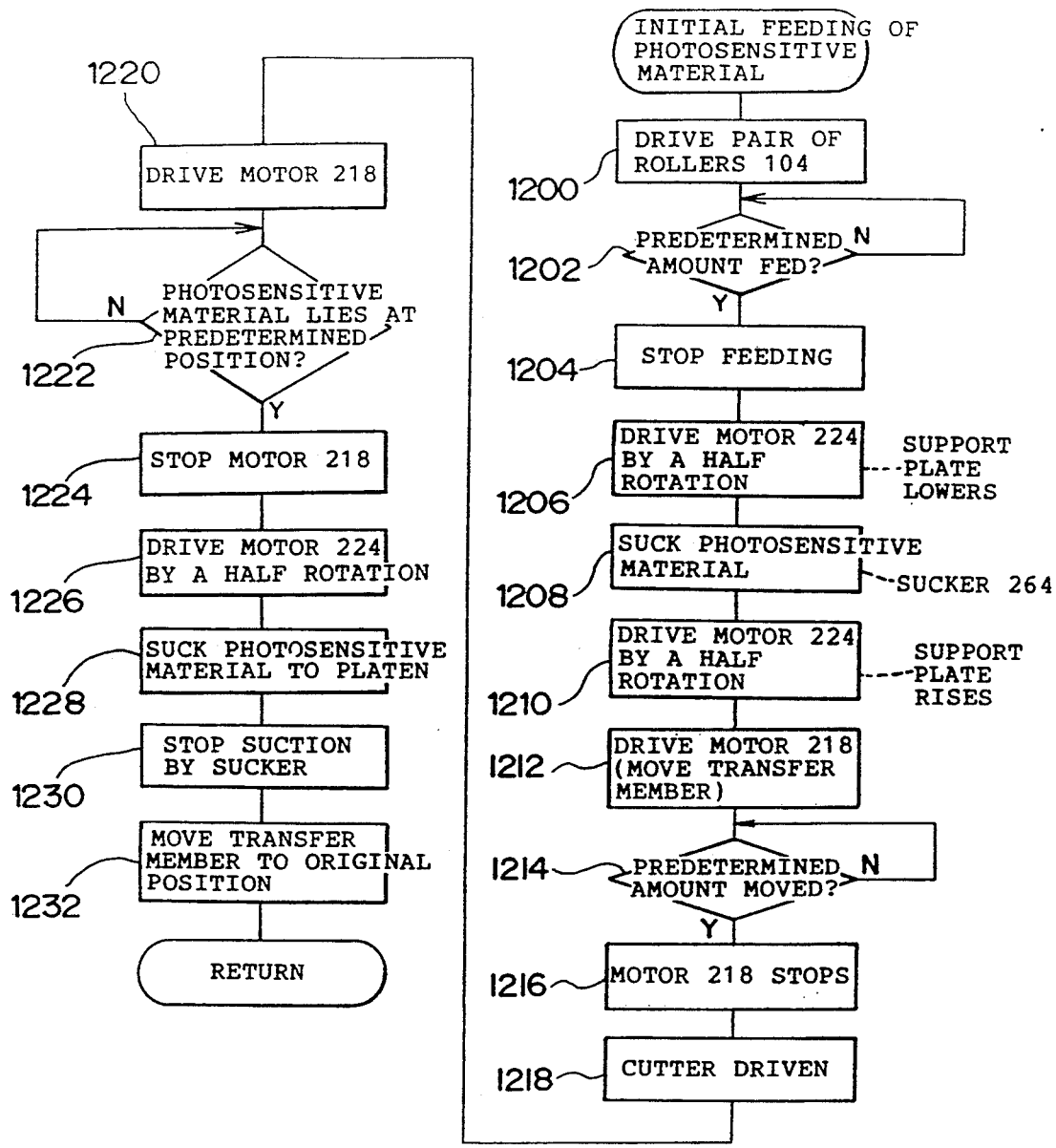
Figure 36:
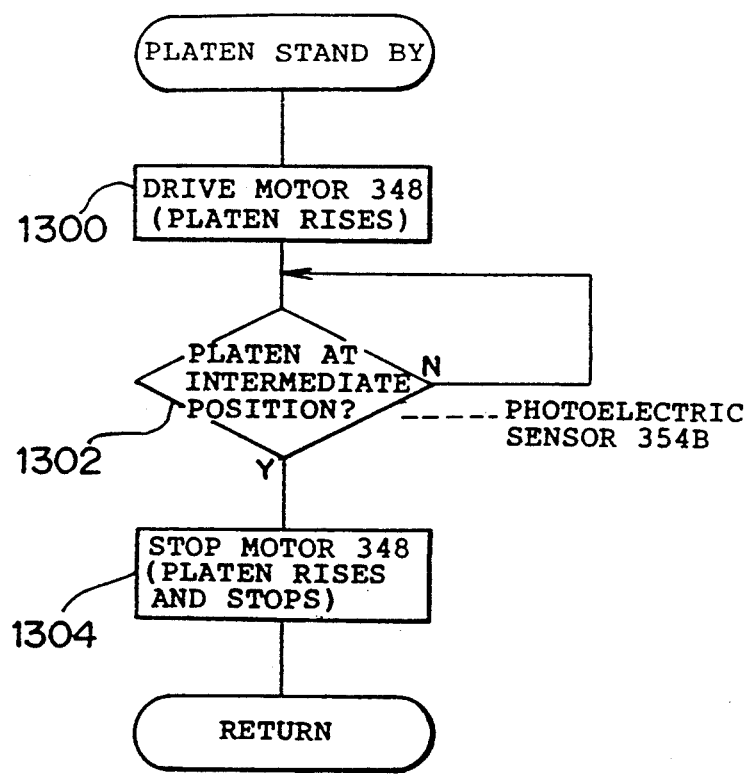
Figure 37:
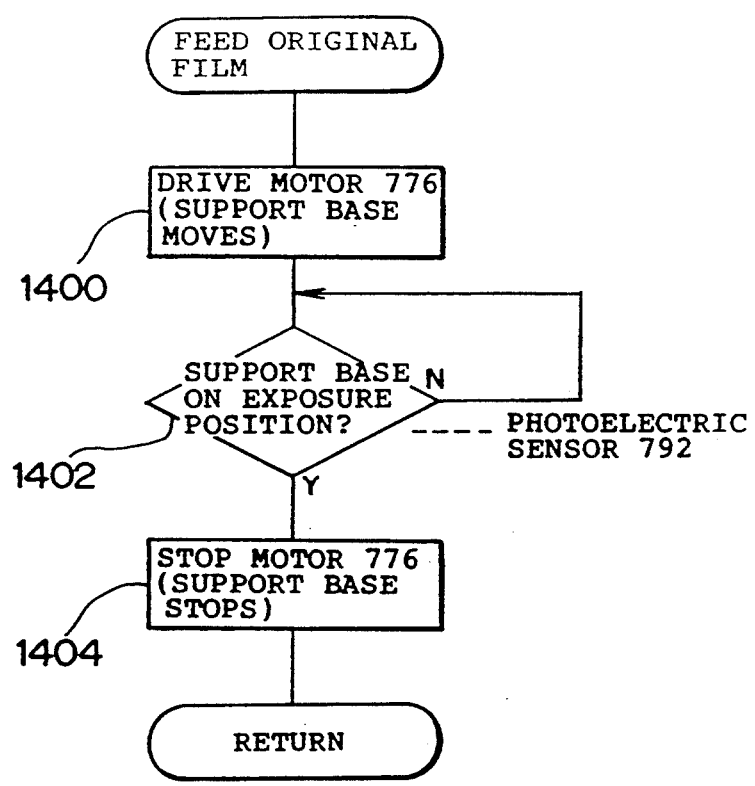
Figure 38:
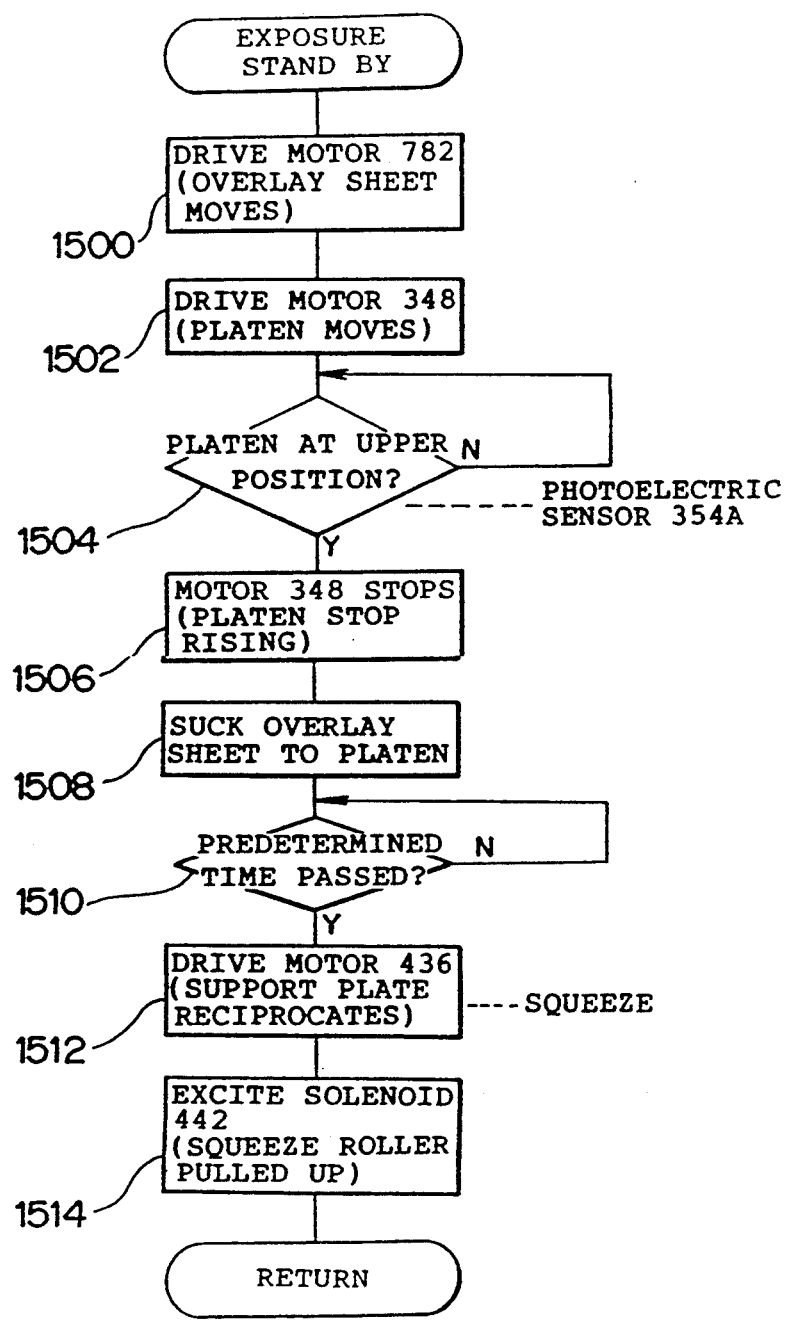
Figure 39:
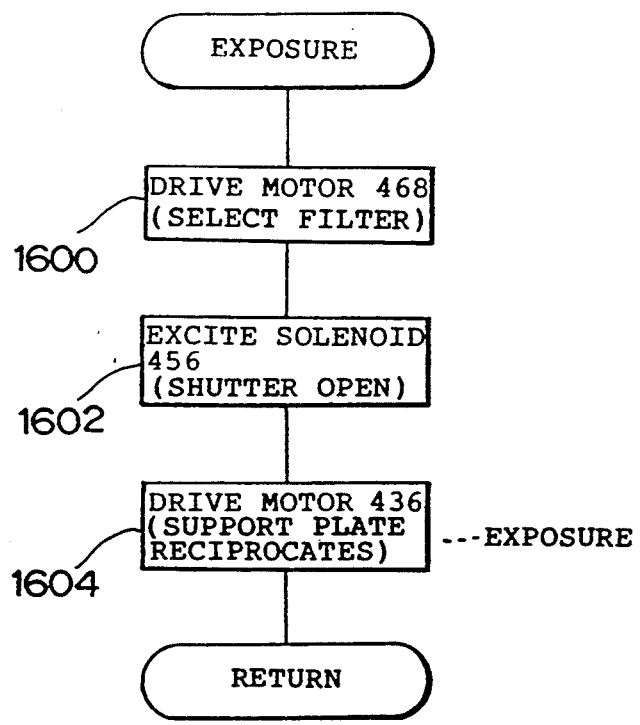
Figure 40:
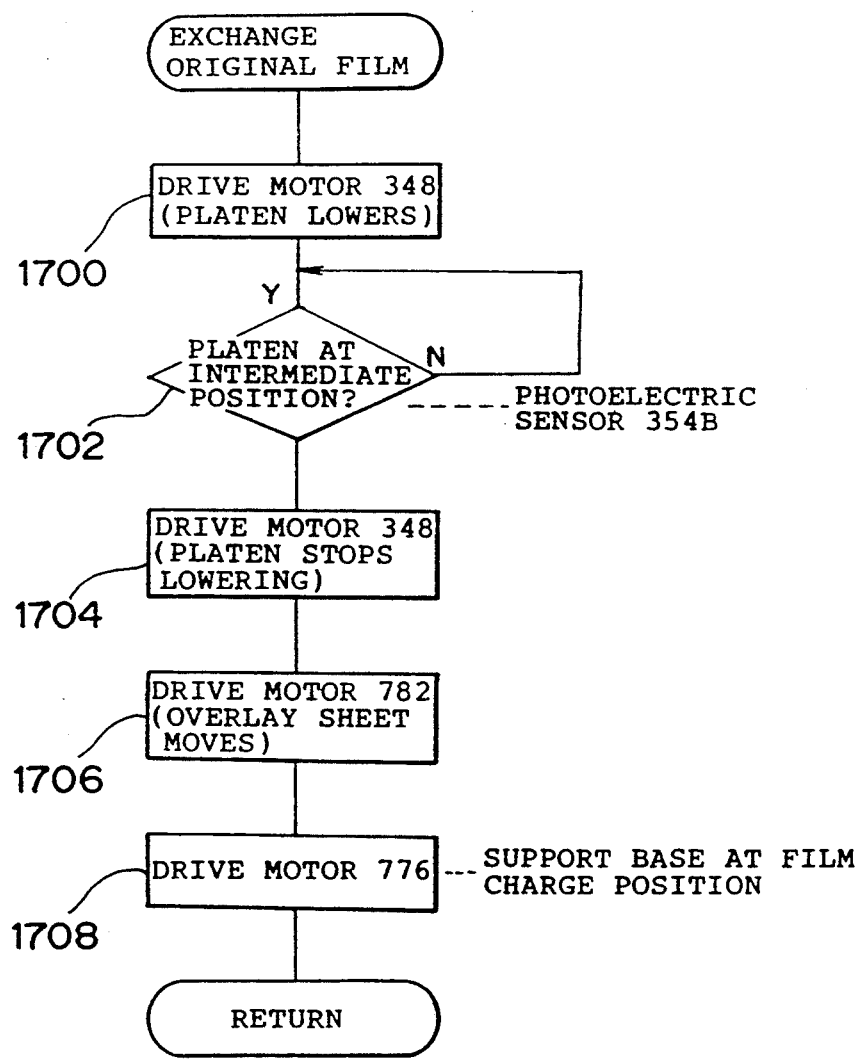
Figure 41:
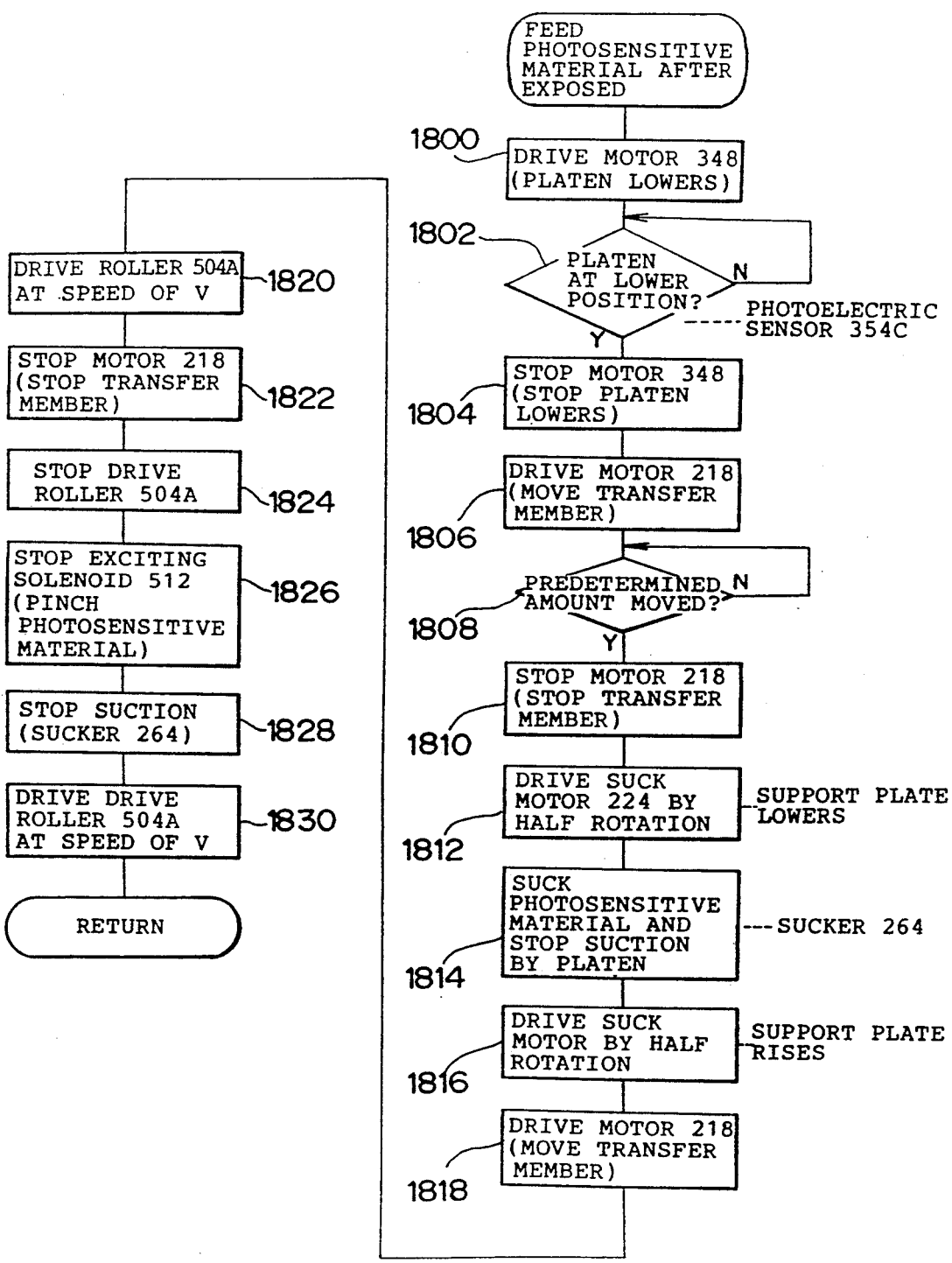
Figure 42:
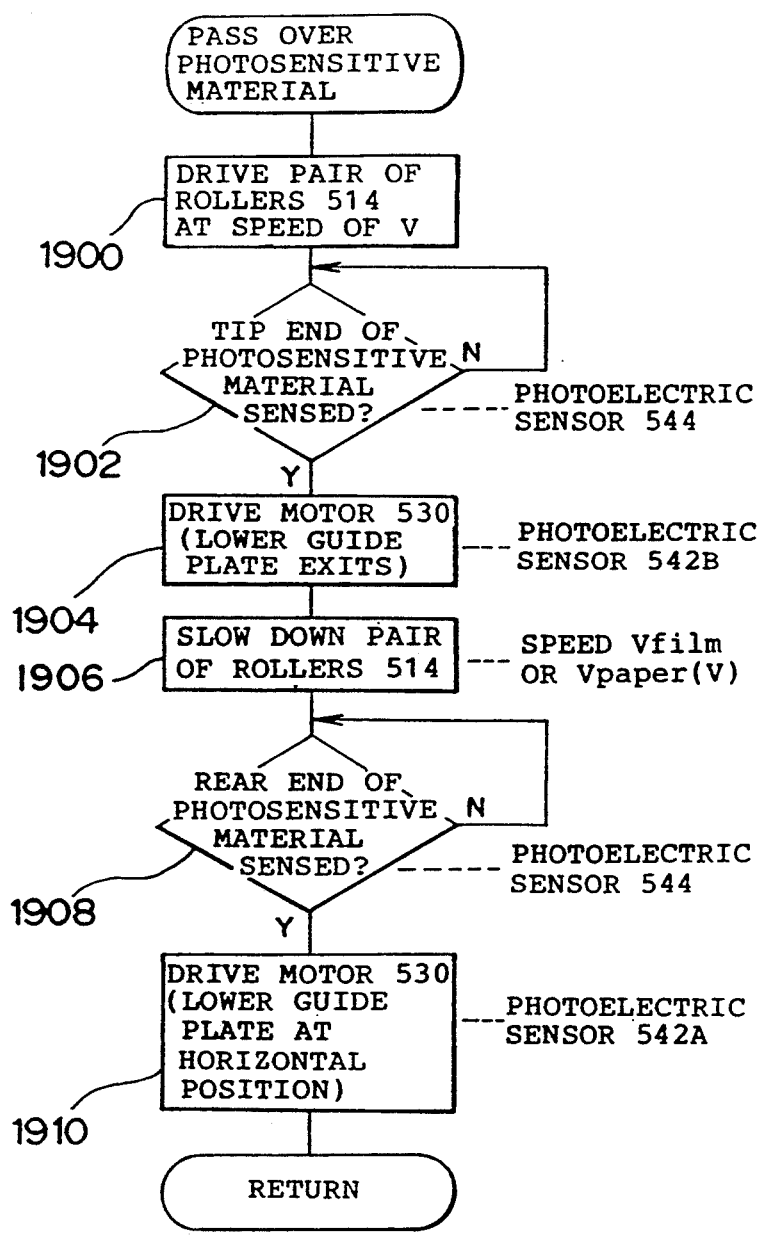

As shown in FIG. 32, the control unit includes a microcomputer 802, which is comprised of a CPU 804, RAM 806, ROM 808, I/O port 810 and buses 812 such as data bus or control bus or the like, for connecting those.

Signal lines of each portion ((1) to (7)) are connected to the I/O port 810 of the microcomputer 802. That is, at the magazine charging portion 100, a signal line of a limit switch 114 is connected to the cutter 116 via a driver 814.

At the photosensitive material feeding portion 200, a photoelectric sensor 220 is connected to the motor 218 via a driver 816, to the motor 224 via a driver 818 and to a solenoid 268 via a driver 826 respectively.

At the platen portion 300, photoelectric switches 354A to C are each connected to a solenoid valve 326 via a driver 822, to a solenoid valve 336 via a driver 824 and to a motor 348 via a driver 826.

At the exposure portion 400, a photoelectric sensor 490 is connected to a motor 436 via a driver 828, to a solenoid 442 via a driver 830, a fluorescent lamp socket 450 via a driver 832, to a solenoid 456 via a driver 836 and to a motor 468 via a driver 836 respectively.

At the photosensitive material transfer portion 500, photoelectric sensors 542A, 542B and 544 are each connected to a solenoid 512 via a driver 838 and to a motor 530 via a driver 840 respectively.

At the processor portion 600, a fan 648 is connected via a driver 842 while a heater 650 is connected via a driver 844. Incidentally, although not illustrated, a signal line for supplying a driving signal is also connected to drive each pair of rollers at the processor portion 600.

At the film charging portion 700, a photoelectric sensor 792 is connected to a motor 776 via a driver 846 and to a motor 782 via a driver 848 respectively.

The operation of this embodiment is hereinafter described with reference to control flowcharts of FIGS. 33 through 42.

In the first place, in step 1000 of a main routine (FIG. 33), if an operation switch is turned ON, then in step 1002, each portion is initialized (see a initializing routine of FIG. 4). At the magazine charging portion 100, the magazine 102 is charged into the magazine charging chamber 106. If the light reflecting sheet 110 is adhered to the magazine, then the light from the photoelectric sensor 114 is reflected against the light reflecting sheet 110 to pass through the rectangular hole 112 provided on the wall surface 106A internal to the magazine charging chamber 106 to return again to the photoelectric sensor 114. Its quantity to be adhered and the positions where it is to be adhered are determined depending on the size and kind of the photosensitive material 14 stored within the magazine 102. As a result, the size and type of the photosensitive material charged in accordance with the on/off signal of the photoelectric sensor 114 can be recognized by the control unit 800. (step 1100)

In the next step 1102, it is determined, at the photosensitive material feeding portion 200, whether or not the transfer member 202 is detected by the left side photoelectric sensor 220 of FIG. 2, and if not, the motor 218 is actuated. Driving of this motor 218 causes the chain 214 to be driven via the sprocket 215 with the result that the transfer member 202 is moved along the rail 210 to be stopped at the left side of FIG. 2, where the sucker 264 departs from the platen 302 to be disposed onto the base plate 279 with a slight gap therebetween. In addition, at this position, since the photosensitive material squeeze rollers 274 climb up onto the cam plate 276, a gap through which the photosensitive material 14 passes is also created between the base plate 270 and the squeeze roller 274.

Next, in step 1104, the platen 302 at the platen portion 300 is disposed to the lowermost position. It is determined by the photoelectric sensor 354C whether or not the screen plate 356 is detected, and if not, then the motor 348 is driven to move the rack 340 downwardly by a driving force of the motor 348 transmitted via the gear box 350. At the moment the screen plate 256 is positioned between the light emitting portion and the light receiving portion of the sensor 354C, the rack 340 is stopped. As a result, the platen 270 is stopped at a position flush with the base plate 270.

In step 1106, at the exposure portion 400, the supporting plate 406 suspended over to the rail 404 is positioned to this side of the apparatus 10. At this time, the squeeze roller 438 is retained with its rotating shaft 438A climbing up on the bracket 444.

In step 1108, at the photosensitive material transfer portion 500, it is determined by the photoelectric sensor whether or not the screen plate 538 is detected and if not, the motor 530 is driven to rotate the worm gear 538 mounted about its rotating shaft 532 to thereby rotate the bevel gear 528, which in turn causes the rotating shaft 526 to be rotated in the clockwise direction of FIG. 24. As a result, the lower guide plate 518 is rotated for movement in the horizontal direction (indicated by a solid line of FIG. 24). When the lower guide plate 518 is positioned in the horizontal plane, the screen plate 538 is detected by the photoelectric sensor 542A to stop driving of the motor 530. This motor 530 has a self-braking function and may be held in the above-described horizontal plane because the lower guide plate 518 cannot rotate in the clockwise direction of FIG. 24 under its own weight through engagement of the bevel gear 528 with the worm gear 534.

At the film charging portion 700, in step 1110, it is determined by the right side photoelectric sensor 792 of FIG. 2 whether or not the screen plate is detected. If not, the motor 776 is driven. This driving of the motor 776 causes the sprocket 770 to be rotated to drive the chain 766. Since the supporting base 728 is fixed to part of the chain 766 via the bracket 768, it is moved in the rightward direction of the apparatus 10, as viewed in FIG. 2, as the chain 766 is driven. In addition, the supporting base 728 presses the roller 748 mounted to the cover member 730 as it travels to rotate the cover member 730 against the force energized by the tension coil spring 736 with the shaft as its axis. As a result, the supporting base 728 can be moved toward the film charging portion 700 transferring through the rectangular hole 726. When the right side photoelectric sensor 792 of the apparatus 10, as viewed in FIG. 2, detects the presence of the screen plate, driving of the motor 776 is stopped. As a result, the supporting base 728 will be positioned at the film charging position 700. Incidentally, in this condition, since the blocking member 756 of the supporting base 728 blocks the rectangular hole 726 via the light screening members 758 and 762, entrance of light through the film charging portion into the exposure 400 is prevented.

In addition, the overlay sheet 708 is disposed downwardly of the gear 780A by means of the motor 782.

The sizing plate 788 is magnetically attached to the positioning plate 786 depending on the size of the original 16 applied. The circular hole 16A is provided for the original 16. The knocking pin 788A provided on the sizing plate 788 is inserted into the circular hole 16A to place the original 16 onto the overlay sheet 708. By this, charging operation of the original 16 is completed. Incidentally, although charging of the original 16 is conducted by opening the small cover 704, the small cover 704 is compact and lightweight because the exposure unit or the like is not mounted to the small cover 704. In addition, the supporting base 728 cannot be withdrawn into the working space. Consequently, charging of the original is thereby eased to improve the working efficiency.

When the initializing of each portion is completed, the procedure is shifted to step 1004 of the main routine, where control over the initial feeding of the photosensitive material (see FIG. 35) is conducted.

First, the photosensitive material 14 is withdrawn from the outlet 108 of the magazine to be conveyed toward the upper portion of FIG. 2. In step 1200, the pair of rollers 104 is driven and the photosensitive material 14 is transported by the pair of rollers 104 so that its feeding direction is changed by 90 degrees. (step 1200)

The photosensitive material 14 passes through the cutter 116 to be inserted into the gap between the base plate 270 and the sucker 264. In this case, since the photosensitive material squeeze roller 274 climbs up onto the cam plate 276 and the rotating shaft 274A is disposed at the upper end of the elongated hole 272A, interference between the photosensitive material 14 and the squeeze roller 274 is eliminated.

After the tip end portion of the photosensitive material 14 is fed into the above-described gap by a predetermined amount (step 1204), the feeding by the pair of rollers 104 is stopped (step 1204).

Next, in step 1206, the motor 224 is driven, and the cam 228 is rotated by a half rotation via the gear box 226. This rotation of the cam causes the coupling shaft 230 to be rotated about the rotating center of the cam 228 to lower the bearing 234. Since the bearing 234 is fixed to the supporting plate 232 by means of brackets 236A, 236B, the supporting plate 232 lowers. In this case, since the supporting plate 232 is moved toward the transfer member 202 via the fixed base 238 guided by a shaft rod 244, it remains parallel to the transfer member and lowers without being relatively rotated.

As the supporting plate 232 lowers, the lowermost end portion of the sucker 264 comes in contact with the photosensitive material 14 so that the photosensitive material is pinched by this sucker 264 and the base plate 270. In step 1208, in this condition, the solenoid valve 268 which communicates with the suction unit 18 is opened to suck the photosensitive material 14 by the sucker 264. In this case, the sucker unit 254 is provided at four points including its reference position, depending on the crosswise size of the photosensitive material 14. The solenoid valve 268 interposed between the sucker unit 254 and the suction unit 18 is controlled depending on the crosswise dimension of the photosensitive material 14 detected by the photoelectric sensor 114 to designate a sucker 264 which performs suction. Therefore, the sucker 264 which is not pinching the photosensitive material 14 generates no suction force.

When the cam 228 is further rotated by a half rotation with the sucker sucking the photosensitive material 14 (step 1210), the supporting plate 232 is returned to the initial position.

In this case, the sucker 254 according to this embodiment is of small diameter and is provided two for each sucker unit 254. As a result, the suction force necessary by a single sucker 264, which is the case with this embodiment, is smaller than that of one large diameter sucker when it is disposed one by one. In addition, since the photosensitive material 14 is sucked at numerous points, the photosensitive material 14 will remain essentially flat in the direction of the wall of the sucker 264.

In the next step 1212, the motor 218 is driven with the photosensitive material 14 sucked by the sucker 264, to move the transfer member 202 in the rightward direction along the rail 210. At this time, the feeding speed of the photosensitive material 14 by the pair of rollers 104 is made to coincide with the traveling speed of the transfer member 202 so that the photosensitive material may be conveyed while retaining a constant degree of tension. In addition, the squeeze roller 274 the cam plate 276 and is placed onto the platen 302 via the photosensitive material. As a result, it is moved together with the transfer member 202 without being rotated on the photosensitive material 14.

When the photosensitive material 14 is fed by a predetermined amount depending on its size detected by the photoelectric sensor 114 (step 1214), the transfer member 202 is stopped (step 1216) and the cutter 116 is actuated (step 1218) to sever the photosensitive material 14. As a result, a piece of photosensitive material 14 of predetermine size can be separated off the rolled photosensitive material 14.

When severance by the cutter 116 is completed, the procedure is shifted to step 1220 where movement of the transfer member is resumed to feed the tip end portion of the photosensitive material 14 to the predetermined position of the platen 302 (steps 1222 and 1224). When the tip end portion of the photosensitive material 14 is positioned to the predetermined position on the platen 302, in step 1226, the motor 224 is rotated to rotate the cam 228 by a half rotation. As a result, the photosensitive material 14 becomes pinched between the sucker 264 and the platen 302. At this time, the solenoid valve 326 which communicates with the sucker 18 is open to suck the photosensitive material 14 by a plurality of holes 308 provided on the platen body 306 (step 1228).

The platen 302 is of triple layer construction with the pattern forming plate 310 pinched by the platen body 306 and the base plate 31, which allows the suction force to be generated for each pattern space in accordance with the size of the photosensitive material 14. In consequence, since air is sucked into the pattern space only through the holes 308 covering the portion on which the photosensitive material 14 is placed, no necessary suction is applied and the photosensitive material 14 can be reliably sucked. Incidentally, this suction is continued until the photosensitive material 14 is conveyed from the platen 302 after bring subjected to the exposure operation.

Since the pattern forming plate 310 is formed of a sponge-like soft material, even if numerous (eight) pattern spaces are present as in this embodiment, each pattern can be formed by a simple punching operation resulting in excellent workability and a reduced cost. Further, a spacer 318 is inserted into the circular hole 316 of this pattern forming plate 310. Therefore, it is pinched with the platen body 306 and the base plate 312 by the screw 320, only the axial length (2 mm) of the spacer 318 is collapsed and thus the pattern can be readily formed. Incidentally, since the soft member applied to the pattern forming plate 310 is of closed cell structure, no air can leak therefrom.

Next, in step 1230, suction of the photosensitive material 14 by the sucker 264 is released and the cam 228 is rotated again by a half rotation to separate the photosensitive material 14 from the sucker 264. At this time, the squeeze roller 274 remains placed on the photosensitive material 14.

When the suction of the photosensitive material 14 by the sucker 264 is released and the photosensitive material 14 is separated, the transfer member 202 is moved once up to the foremost portion and then moved along the rail 10 so as to return to the initial position (step 1232). At this time, the squeeze roller 274 is moved rotated on the photosensitive material 14. As a result, air bubbles formed between the photosensitive material 14 and the platen 302 can be squeezed to closely adhere the photosensitive material 14 onto the platen 302. That is, even if the peripheral edge portion of the photosensitive material 14 cannot be securely sucked by only the holes 308 of the platen 302, or the photosensitive material 14 itself is deformed in the direction of its thickness due to the surrounding environment and the like, it can be reliably closely adhered onto the platen 302 by the squeezing action of the squeezing roller 274.

Next, in step 1006 of the main routine, a control over the platen stand-by (see FIG. 350) is conducted.

In step 1300, two motors 348 are drive in synchronism to move the rack 340 upwardly, as viewed in FIG. 2, via the gear box 350.

Two sliding shafts 364 are provided at the platen 30. Since the vertical movement of the platen 302 is guided by these sliding shafts 364, the platen 302 is vertically moved remaining parallel to the intermediate base 20 as the motor 348 is driven.

At this time, when the photoelectric sensor 354B detects the presence of the screen plate 346 (step 1302), driving of the motor 348 is stopped (step 1304).

Next, in step 1400, a control over feeding of the original (see FIG. 7) is conducted.

First, in step 1400, at the film charging portion, the motor 776 is driven with the original 16 set, to move the supporting base 728 toward the exposure portion 400 along the guide shafts 718, 720. In this case, when the presence of the screen plate 790 is detected by the left side photoelectric sensor 792 of FIG. 2 (step 1402), movement of the supporting base 728 is stopped (step 1404).

The supporting base 728, when positioned at the film charging portion 700, is supported against the guide shaft 718 via the rollers 748, 754. This guide shaft 718 is separated from the guide shaft 720 of the exposure portion 400 at the lateral surface on which the rectangular hole 726 is provided. However, the rollers 748, 754 are provided at six positions of the supporting base 728. Even if the rollers 748, 754, which lie at the tip end of the supporting base 728, as viewed in its traveling direction, are removed from the guide shaft 718 by movement of the supporting base 728, since the supporting base is supported against the shaft 718 at the other four points, these tip end rollers 748, 854 can be smoothly moved from the guide shaft 718 to the guide shaft 720. In addition, the intermediate rollers 748, 754 can be smoothly moved from the guide shaft 718 to the guide shaft 720 because the tip end rollers 748, 754 are supported against the guide shaft 720 while the rear end rollers 748, 754 are supported against the guide shaft 718. Further, the rear end rollers 748, 754 can also be smoothly moved because the tip end and intermediate rollers 748, 754 are supported against the guide shaft 720. That is, since the supporting base 728 is supported against the guide shaft 718 or 720 at least four points, even if they are separated from each other, the movement of the supporting base 728 can be effectuated smoothly.

As the supporting base 728 moves toward the predetermined position of the exposure portion 400, the cover member 730 which is open by this supporting base 728 is rotated by the force energized by the torsion coil spring 738, with the shaft 734 as its axis, to close the rectangular hole 726 via the light screening member 738. As a result, entrance of light from this hole 726 into the exposure portion 400 can be prevented.

Incidentally, when the supporting base 728 lies at a predetermined position of the exposure portion 400, the overlay sheet 708 and the platen 302 remain slightly separated.

Next, in step 1010 of the main routine, a control over the exposure stand-by (see FIG. 38) is conducted.

First, in step 1500, the motor 782 mounted to the supporting base 728 is driven to drive the chain 784. As a result, the overlay sheet 708 is moved with the chain 784 and is inverted by the gear 780A at the innermost side of the apparatus to be moved upwardly of the gear 780A. By this operation, the original 16 placed on the overlay sheet 708 is placed onto the photosensitive material 14.

When the overlay sheet 708 is disposed upwardly of the gear 780A and the original 16 is placed onto the photosensitive material 14, the procedure is shifted to step 1502, here the motor 348 is driven over again and the platen 302 is further elevated. If the screen plate 356 is detected by the photoelectric sensor 354A (step 1504), then driving of the motor 348 is stopped (step 1506) and elevation of the platen 302 is stopped. In this state, the platen 302 and the positioning plate 786 are positioned and the photosensitive material 14, original 16 and the overlay sheet 708 are in a layered position.

At this time, when the solenoid valve 336 which communicates with the suction unit 18 is open, a sucking action is caused on a groove 328 formed on the platen body 306 to such the peripheral edge of the overlay sheet 708 placed on this groove 328 (step 1508). As a result, the photosensitive material 14 and the original 16 can be retained pinched by the platen 302 and the overlay sheet 708.

When suction of the overlay sheet 78 by the groove 328 has continued over a predetermined period of time (step 1510), in step 1512, the motor 436 at the exposure portion 400 starts to be driven. This driving force of the motor 436 is transmitted to the shaft 430 via the wheel 432 to rotate the sprocket 424. As a result, the chain 426 wound about the sprocket 424 is driven so that the supporting plate 406 is moved from this side toward the innermost side of the apparatus along the rail 404.

At that time, the squeeze roller 438, which had climbed up on the high level portion 444A of the cam bracket 444, is placed onto the platen 302 via the overlay sheet 708 transferring through the slanted surface portion 444B. As the supporting plate 406 moves along the rail 404, the squeeze roller 438 is rolled on the overlay sheet 708. In addition, the photosensitive material 14, original 16 and the overlay sheet 708 are sucked and adhered onto the platen 302. As a result, any air which exists between the overlay sheet 708 and the platen 302 is forced out so that the photosensitive material 14 and the original 16 may be completely adhered on the platen 302.

When the supporting plate 406 reaches the innermost end of the apparatus, the squeeze roller 438 is gradually separated from the overlay sheet 708 by the cam bracket 444. When the supporting plate 406 is stopped, in step 1514, the solenoid 442 is energized to withdraw the actuator 442A. As a result, the squeeze roller 438 is lifted up via the suspension bracket 440 for retention. In this case, since the squeeze roller 438 has climbed up on the cam bracket 444, in the lifting stroke, a distance over which the load of the squeeze roller is applied is short, which allows a small-size solenoid 442 with a small energized force can be applied.

Next, in step 1600, a filter (one of B, G, R, BK) corresponding to the kind of the original 16 and the photosensitive material 14 is disposed onto the slit hole 476A by driving the motor 468.

In addition, in step 1602, when the supporting plate is returned from the innermost side of the apparatus to the original position, the solenoid 456 is driven and the shutter 452 is open so that the slit hole 446A is open. Accordingly, beams light beams from the fluorescent lamp 448 is illuminated from the slit hole 406 through a lens (for example, SELFOC lens).

The image of the original 16 is printed onto the photosensitive material 14 by moving the supporting plate 406 to the original position in this condition (step 1604).

Next, in step 1014 of the main routine, a control over the exchange of the original (see FIG. 40) is conducted.

When the supporting plate 406 is returned to the original position, the platen 302 is lowered (step 1702, 1704) to a position where the screen plate 356 is detected by the photoelectric sensor 354B, by driving of the motor 348 (step 1700). Next, in step 1706, the motor 782 mounted to the supporting base 728 of the film charging portion 700 is rotated in the same direction as one described above, and the overlay sheet 708 is rotated by a half rotation as the chain 784 is driven. Thus the original can be placed again onto the overlay sheet 708. Incidentally, when this overlay sheet 708 moves, the solenoid valve 336 is closed and suction of the overlay sheet 708 onto the platen 302 is stopped. When the original 16 has been placed onto the overlay sheet 708, the procedure is shifted to step 1708, where the supporting base 728 is moved toward the film charging portion 700 by driving of the motor 776 to be supported against the guide shaft 718. At this time, since locking of the small cover 704 is released, the small cover 704 is open by grasping the handle 706 and the original 16 is exchanged with the next to repeat the above-described exposure control procedure a predetermined number of times (step 1016 of the main routine). Incidentally, since the exchange of the original 16 can be also readily conducted as in charging the same, working efficiency is be improved.

When the exposure operation is completed, the supporting base 728 is moved toward the film charging portion 700 to stand by supported against the guide shaft 718, and the procedure is shifted from step 1016 to step 1018 of the main routine, where a control over feeding of the exposed photosensitive material is conducted (see FIG. 1).

First, in step 1800, by driving the motor 348, the platen 302 is lowered down to the lowermost position, where the screen plate 356 is detected by the photoelectric sensor 354C (steps 1802, 1804).

Next, the motor 218 of the photosensitive material feeding portion 200 is driven (step 1806) and the transfer member 202 is moved along the rail 210. When the sucker 264 is moved in a predetermined amount up to the tip end portion of the photosensitive material 14 (step 1808), movement of the transfer member 202 is stopped (step 1810). The program is shifted to step 1812 to drive the motor 224. As a result, the supporting plate 232 is lowered and the photosensitive material 14 is pinched by the sucker 264 and the platen 302. At this time, the solenoid valve 268 which communicates with the suction unit 18 is open to suck the photosensitive material 14 by the sucker 264 while releasing suction of the photosensitive material 14 by the platen 302 (step 1816) to elevate the supporting plate 232 again to retain the photosensitive material 14, which is in the sucked condition (step 1816). Incidentally, at this time, the solenoid valve 326 is closed and suction of the photosensitive material 14 onto the platen 302 is stopped.

In the next step 1818, the transfer member 202 is further moved in the same direction to move the sucker 254 onto the guide 502, and the procedure is shifted to step 1820 to start rotation of the driving roller 504A. At this time, the solenoid 512 has been actuated to move the driven roller 504B in the direction away from the driving roller 504A. As a result, even if the tip end of the photosensitive material 14 sucked to the sucker 264 is somewhat curled, it can be readily guided between the driving roller 504A and the driven roller 504B so that it may be reliably inserted between the rollers.

When the sucker 264 reaches the extreme tip end to be stopped (step 1822), rotation of the driving roller 504A is stopped once (step 1824) to stop operation of the solenoid 512 (step 1824). As a result, the driven roller 504B is moved in the direction towards the driving roller 504A and the photosensitive material 14 is pinched. Next, in step 1828, suction of the photosensitive material 14 by the sucker 264 is released and the transfer member 202 is retracted along the rail 210 to return to its original position.

In the next step 1830, rotation of the driving roller 504A is resumed at a speed of V to feed the photosensitive material 14 in the direction of the processor 600.

Next, in step 1020 of the main routine, a control over the photosensitive material transferring (see FIG. 42) is conducted.

First, in step 1900, the pair of rollers 514 is rotated at a speed equal to that of the above-described pair of rollers 504. As a result, the photosensitive material 14 is conveyed pinched by the pair of rollers 504 to be guided and fed into the gap between the upper and lower guide plates 516 and 518. The photosensitive material is also pinched by the pair of rollers 514.

In this case, when, in step 1902, the tip end portion of the photosensitive material 14 reaches the upper portion of the photoelectric sensor 544, it is detected by the sensor 544 to drive the motor 530 (step 1904).

By this driving of the motor 530, the bevel gear 528 is rotated via the worm gear 534 and the rotating shaft 526 is rotated in the clockwise direction of FIG. 24. As a result, along with the swing base 524, the lower guide plate 518 is rotatingly moved from the position of solid line of FIG. 24 to the position of the imaginary line away from the lower surface of the photosensitive material 14.

Next, in step 1906, the feeding speed of the pair of rollers 514 is slowed down to the same speed as that of the processor portion 600 (Vfilm, Vpaper), which is slower than the above-described speed V. As result, slack results to the photosensitive material 14 lying between the pair of rollers 504 and the pair of rollers 514, the slack being formed in a substantially U-form loop. When the rear end of the photosensitive material 14 passes through the pair of rollers 504, the photosensitive material 14 is stored in the tray 546 retained by the pair of rollers 514.

The photosensitive material 14 is pinched by the pair of rollers 604 of the processor portion 600. The feeding speed of this pair of rollers 604 is slightly faster than that of the above-described pair of rollers 514. Therefore, the photosensitive material 14 is conveyed under tension between the pair of rollers 514 and the pair of rollers 604. In this case, since a one-way clutch 606 is mounted to the pair of rollers 514, a predetermined tension can be held for the photosensitive material 14.

The photosensitive material 14 is gradually conveyed to the processor portion 600 and when its rear end portion passes through the pair of rollers 514 and then the photoelectric sensor 554 (step 1908), the motor 530 is rotated in the opposite direction in accordance with the signal from the photosensitive material 544 (step 1910) to rotatingly move the lower guide plate 518 from the position of the imaginary line to the position of the solid line of FIG. 24 via the swing base 524. As a result, feeding of the next photosensitive material 14 can be reliably guided.

Next, in step 1022 of the main routine, the developing operation is conducted. At the processor portion 600 the photosensitive material 14 is immersed into the developing tanks 612, 614 and, guided by the pair of rollers 624 and guide plate 626 of the treating rack 622, and is sequentially conveyed in a substantially U-form into the bleaching/fixing tank 616, and then rinsing tanks 618 and 620 for treating. The treated photosensitive material 14 is guided to the drying portion 640 by means of the pair of rollers 642, from which it is conveyed while being pinched by the pair of rollers 643. During this feeding, hot air created by the fan 648 and the heater 650 is delivered out of the port portion 646 of the duct 644 to be blown against the photosensitive material 14 for drying. The photosensitive material 14, which has been dried, is taken out from the outlet 22 formed at the casing 12.

Next, a modification of the above-described embodiment is described. According to this modification, a method of controlling transfer of the photosensitive material at the photosensitive material transfer portion differs from that of the first embodiment, and this point is hereinafter described in greater detail.

In this modification, the pair of rollers 514 is comprised of a driving roller 514 and a driven roller 514B, as in the first embodiment (see FIG. 26).

Incidentally, in this modification, the driving roller 514A and driven roller 514B are each made of a lightweight stock such as synthetic resin or the like, and are lightweight as compared with rollers made of rubber. In addition, a one way clutch 606 is interposed between the rotating shaft of the driving roller 514A of the downstream pair of rollers 514 and the rotating shaft 515 of the motor. The one-way clutch 606 is hereinafter described in detail.

Figure 43:
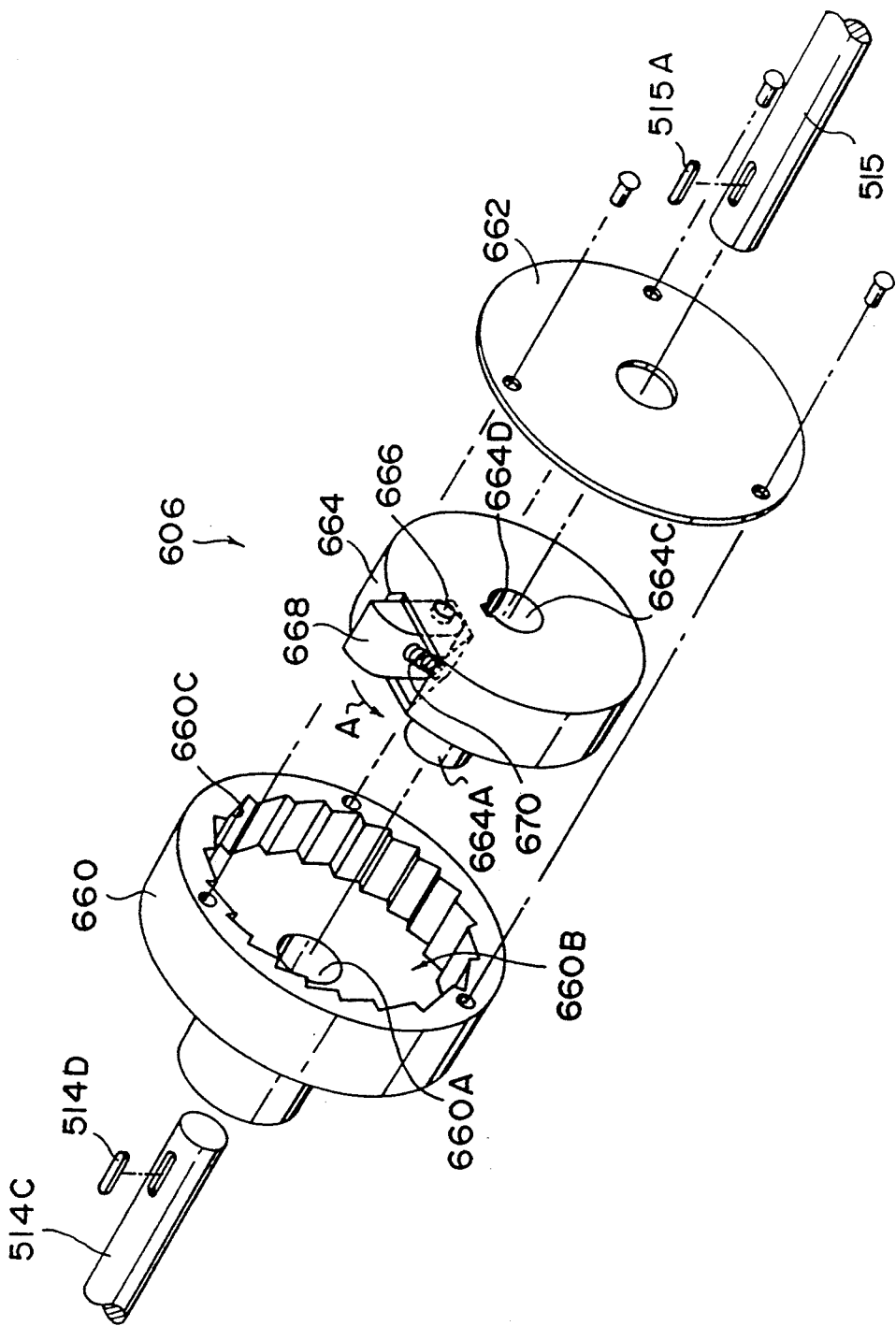
FIG. 43 is an exploded perspective view of a one-way clutch used in a modified embodiment.

As shown in FIG. 43, it is provided with a wheel 660. A circular hole 660A is provided so as to pass through the center of the wheel 660. A key 514D is attached as a detent at the rotating shaft 514C of the driving roller 514A, and a key groove (not shown) is formed at the circular hole 660A corresponding to this key 515A. The rotating shaft 515 is inserted into the circular hole 660A so as to correspond to the key 515A and the key groove with the result that a relative rotation between the rotating shaft 515 and the wheel 660 is blocked.

A circular groove 660B is formed at the opposite side of the wheel 660, which is at the side of the driving roller 514A, and a ratchet wheel 660C is formed on the inner circumference of the circular groove 660B. An aperture portion is closed at the circular groove 660B by a cover 662. In addition, a rotating member 664 is stored within the circular groove 660B. The rotating member 664 has a protruding portion 664A to be inserted into the circular hole 660A so that it may be rotatably supported against the wheel 660.

A trapezoidal groove 664B is provided on the outer circumference of the rotating member 664. A nail portion 668 supported against the rotating member 664 is stored within the groove 664B via a pin 666. As shown in FIG. 43, the nail portion 668 engages the above-described ratchet wheel 660C, and when rotated in the direction of A, as viewed in FIG. 43, it is disengaged from the ratchet wheel 660C. In addition, a compression coil spring 670 is interposed between the nail portion 668 and the rotating member 664 and retains the nail portion 668 at a position shown in FIG. 43.

A circular groove 664C and a key groove 664D are formed on the rotating member 664. A key 515A is provided on the rotating shaft 515 of the motor transferring through the circular hole 664C provided on the cover 662, and is inserted into the circular hole 664C so that the key 515A corresponds to the key groove 664D with the result that a relative rotation is blocked between the rotating shaft 515 and the rotating member 664.

In this case, when a driving force of the rotating shaft 515 is transmitted to the rotating member 664, engagement of the nail portion 668 and the ratchet wheel 660C causes the rotating member 664 and the wheel 660 to be rotated together with the result that the driving roller 514A is rotated via the rotating shaft 514C. In addition, when the outer circumference of the driving roller 514A is rotated at a speed faster than that of the motor, the ratchet wheel 660C presses the nail portion 668 to rotate the nail portion against a force of the compression coil spring 670. As a result, the ratchet wheel 660C and the nail portion 668 are disengaged and the rotating shaft 515 and the driving roller 514A are relatively rotated.

Incidentally, in this modification, the rotating speed at which the driving roller 514A is rotated via the rotating shaft 515 can be changed in two stages (Vfilm, Vpaper). In this case, Vfilm is set to correspond to the feeding speed at the processor portion 600 when the photosensitive material 14 is a film while Vpaper is set to correspond to the feeding speed at the processor portion 600 when the photosensitive material is paper.

The other portions of this embodiment are omitted because they are identical to those of the first embodiment.

Figure 44:
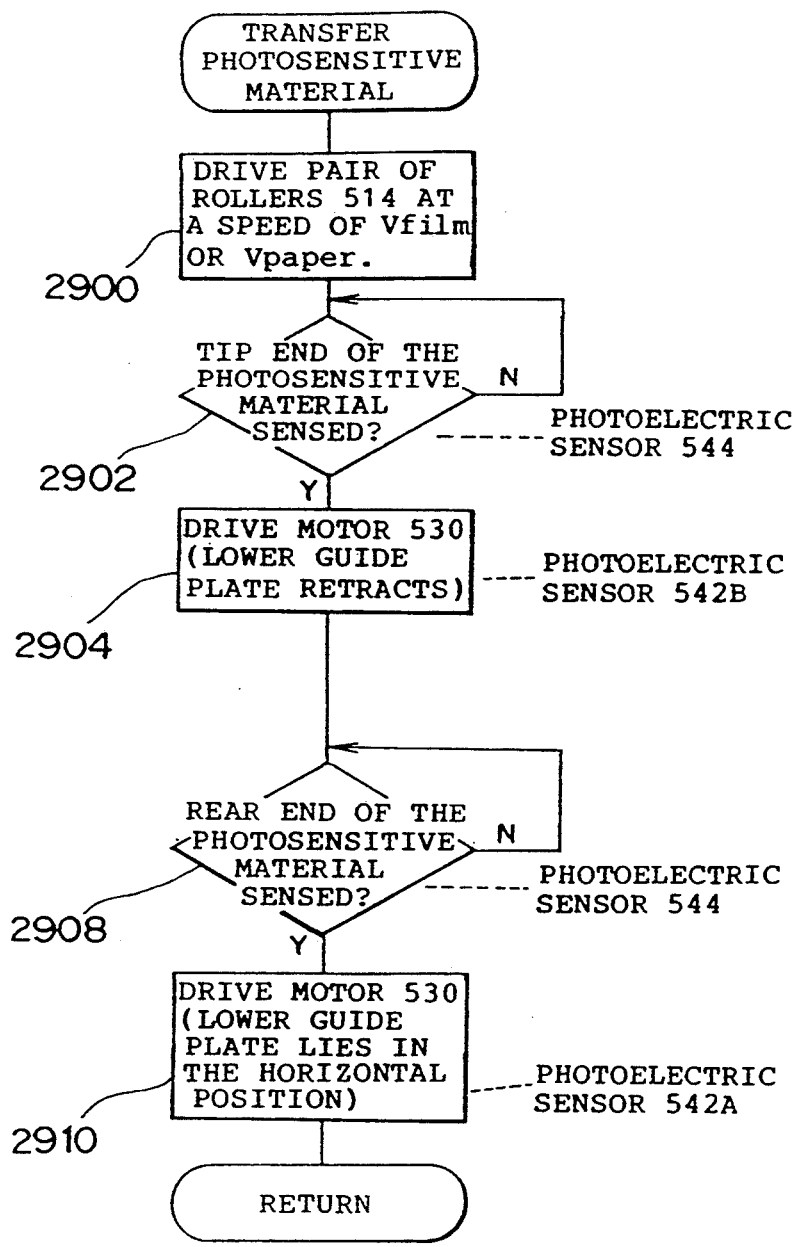
FIG. 44 is a flowchart illustrating how transferring of the photosensitive material is controlled in the modified embodiment.

Next, a method of controlling transferring of the photosensitive material, which is carried out in the main routine 1020, is described with specific reference to FIG. 44.

First, in step 2900, the pair of rollers 514 is rotated at a speed corresponding to the feeding speed (Vfilm or Vpaper) of the processor portion 600, which is slower than the rotating speed of the pair of rollers 504. As a result, pinched by the pair of rollers 504, the photosensitive material 14 is fed at a speed corresponding to the rotating speed of the pair of rollers 504 and its tip end portion is pinched by the pair 514, guided by a gap between the upper and lower guide plates 516 and 516.

At this time, the rotating speed of the outer circumference of the pair of rollers 514 is rotating at a speed slower than the feeding speed of the photosensitive material 14, but since the feeding force of the pair 504 is transmitted thereto via the photosensitive material, it may be rotated at a speed equal to that of the pair 504, that is, a speed faster than the rotating speed of the motor. As a result, one way clutch 606 is actuated to relatively rotate the rotating shaft 514C of the driving roller 514A and the rotating shaft 515 of the motor. Since the pair of rollers 514 is lightweight made of synthetic resin or the like, no jamming cannot take place.

In this case, when, in step 2902, the tip end portion of the photosensitive material 14 reaches the upper portion of the photoelectric sensor 544, it is sensed by the photoelectric sensor 544 to drive the motor 530 (step 2904).

Driving of this motor 530 causes the bevel gear 528 to rotate via the worm gear 534 to rotate the rotating shaft 526 in the clockwise direction of FIG. 24. As a result, along with the swing base 524, the lower guide plate 518 is rotatingly moved from the position indicated by solid line to the position indicated by imaginary line of FIG. 24 with the result that the lower surface of the photosensitive material 14 is open. As a result, a slackening takes place to the photosensitive material between the pair of rollers 504 and the pair of rollers 514, the slack being formed in a U-shaped loop. In addition, because of this slacking, the feeding force of the pair of rollers 504 is not transmitted to the pair of rollers 514 while the driving force of the motor is transmitted to the pair of rollers 514 so that the pair of rollers 514 is rotated at a speed (Vfilm or Vpaper) corresponding to the feeding speed of the processor portion 600. When the rear end of the photosensitive material 14 passes through the pair of rollers 504, the photosensitive material 14, retained by the pair of rollers 514, is stored into the tray 546.

Incidentally, in this embodiment, although the driving roller 514A is driven in advance before the photoelectric sensor 544 senses the tip end portion of the photosensitive material 14, the driving roller 514A may be started to drive after it senses the tip end portion of the photosensitive material, or the driving roller 514A may be started to drive after the lower guide plate 518 starts to move.

The photosensitive material 14 is pinched by the pair of rollers 604 of the processor portion 600. The feeding speed of this pair of rollers 604 is set slightly slower than that of the pair of rollers 514. Therefore, the photosensitive material 14 is conveyed under tension between the pairs of rollers 514 and 604. In this case, since the one-way clutch 606 is attached to the pair of rollers 514, a predetermined tension can be held therebetween.

When the photosensitive material 14 is gradually fed to the processor portion 600 and its tip end passes through the pair of rollers 514 and then the photoelectric sensor 554 (step 2908), the motor 530 is rotated in the opposite direction in accordance with the signal from this sensor 544 (step 2910) to rotatingly move the lower guide plate 518 from the position indicated by solid line toward the position indicated by imaginary line of FIG. 24 via the swing base 524. As a result, feeding of the next photosensitive material 14 can be reliably guided. Thereafter, in step 1022 of the main routine, the developing operation is carried out.

What is claimed is:

1. Apparatus for making a color proof comprising:

a platen portion to which a photosensitive material and an original are each fed for being positioned thereon;

an exposure portion disposed in opposition to said platen portion for exposing an image of said original onto said photosensitive material;

a processor portion for processing the exposed photosensitive material;

a transfer portion for transferring said photosensitive material from said platen portion to said processor portion, said transfer portion comprising a first pair of rollers disposed adjacent to a photosensitive material delivery side of said platen portion for feeding the photosensitive material from said platen portion, a second pair of rollers disposed adjacent to a photosensitive material inlet side of the processor portion and a guide member for guiding the photosensitive material from said first pair of rollers to said second pair of rollers;

sensor means disposed downstream in the feeding direction of said second pair of rollers for sensing whether the photosensitive material is present at a first position; and control means for controlling driving of said first and second pairs of rollers so as to rotate them at equal speeds in a first mode and for controlling driving of said second pair of rollers so as to reduce the rotating speed of said second pair of rollers, in a second mode, when the photosensitive material is sensed by said sensor means.

2. Apparatus as set forth in claim 1 wherein said control means controls driving of said second pair of rollers so as to reduce the rotating speed of said second pair of rollers corresponding to the processing speed of said processor portion, which depends on the type of the photosensitive material.

3. Apparatus a set forth in claim 2 wherein said guide member comprises a guide plate swingable between a first position, where the lower surface of said photosensitive material is supported by the guide plate, and a second position, where a space is formed at the lower surface side of said photosensitive material.

4. Apparatus as set forth in claim 3 wherein said first pair of rollers comprises one driving roller and one driven roller rotated by said driving roller.

5. Apparatus as set forth in claim 4 wherein said driven roller is movable toward and away from said driving roller.

6. Apparatus as set forth in claim 5 wherein said control means controls said driven roller and said driving roller so as to separate said driven roller from said driving roller and rotates said driving roller before said photosensitive material is inserted between said driving roller and said driven roller.

7. Apparatus as set forth in claim 6 wherein said control means controls said driven roller and said driving roller so as to bring said driven roller into contact with said driving roller said control means also stops the rotation of said driving roller for a period of time and, thereafter, rotates said driving roller after said photosensitive material has been inserted between said driving roller and said driven roller.

8. Apparatus as set forth in claim 7 wherein said control means controls said guide plate so that said guide plate swings from said first position to said second position as the presence of the photosensitive material is sensed by said sensor means.

9. Apparatus for making a color proof comprising:

a platen portion to which a photosensitive material and an original are each fed for being positioned thereon;

an exposure portion disposed in opposition to said platen portion for exposing an image of said original onto said photosensitive material; p1 a processor portion for processing the exposed photosensitive material;

a transfer portion for transferring said photosensitive material from said platen portion to said processor portion, said transfer portion comprising a first pair of rollers disposed adjacent to a photosensitive material delivery side of said platen portion for feeding a photosensitive material from said platen portion, a second pair of rollers disposed adjacent to the photosensitive material inlet side of said processor portion at the transfer portion for feeding the photosensitive material and a guide member for guiding the photosensitive material to said second pair of rollers;

control means for controlling said first and second pairs of rollers so as to rotate said first pair of rollers at a predetermined rotating speed in a first mode and rotate said second pair of rollers at a rotating speed slower than said predetermined rotating speed of said first pair of rollers; and a one-way clutch for allowing said second pair of rollers to be rotated at a rotating speed faster than said slower rotating speed.

10. Apparatus as set forth in claim 9 wherein said control means controls the rotation of said second pair of rollers at two different rotating speeds, which depend on the processing speed of said processor portion, which depends on the type of the photosensitive material.

11. Apparatus as set forth in claim 10 further comprising: sensor means disposed downstream in the feeding direction of said second pair of rollers for sensing whether the photosensitive material is present or not.

12. Apparatus as set forth in claim 11 wherein said guide member comprises a guide plate swingable between a first position, where the lower surface of said photosensitive material is supported by the guide plate, and a second position, wherein a space is formed at the lower surface side of said photosensitive material.

13. Apparatus as set forth in claim 12 wherein said first pair of rollers comprises one driving roller one other driven roller rotated by said driving roller.

14. Apparatus as set forth in claim 13 wherein said driven roller is movable toward and away from said driving roller.

15. Apparatus as set forth in claim 14 wherein said control means controls said driven and driving rollers so as to separate said driven roller from said driving roller and rotate said driving roller before said photosensitive material is inserted between said driving roller and said driven roller.

16. Apparatus as set forth in claim 15 wherein said control means controls said driven and driving rollers so as to bring said driven roller into contact with said driving roller and stop of the rotation of said driving roller for a period of time and thereafter rotate said driving roller after said photosensitive material has been inserted between said driving roller and said driven roller.

17. Apparatus as set forth in claim 16 wherein said control means controls said guide plate so that said guide plate swings from said first position to said second position when the presence of said photosensitive material is sensed by said sensor means.

18. Method of transferring an exposed photosensitive material from an exposure portion to a processor portion used in an apparatus comprising an exposure portion for exposing a photosensitive material, a processor portion for processing the exposed photosensitive material, a transfer portion disposed between said exposure portion and said processor portion and comprising a first pair of rollers for receiving the exposed photosensitive material from said exposure portion to pinch and feed the exposed photosensitive material, a second pair of rollers for pinching and feeding the exposed photosensitive material to said processor portion and a guide member provided between said first pair of rollers and said second pair of rollers for guiding the exposed photosensitive material from said first pair of rollers to said second pair of rollers comprising:

a first step of positioning said guide member to a first position where the lower surface of the exposed photosensitive material is supported by the guide plate;

a second step of rotating said first and second pairs of rollers at equal speeds; and a third step of retracting said guide member from said first position to said second position so that a space is formed at the lower surface side of said exposed photosensitive material between said first and second pairs of rollers and reducing the rotating speed of said second pair of rollers after the photosensitive material has been pinched by said second pair of rollers and the tip end of the photosensitive material is sensed at a predetermined downstream position in the feeding direction of the second pair of rollers.

19. Method as set forth in claim 18 wherein, in said third step, the rotating speed of said second pair of rollers can be changed depending on the processing speed of the processor portion, which depends on the type of the photosensitive material.

* * * * *